United States Patent
Kataoka et al.

(10) Patent No.: US 11,562,886 B2
(45) Date of Patent: Jan. 24, 2023

(54) ION MILLING APPARATUS AND SAMPLE HOLDER

(71) Applicant: JEOL Ltd., Tokyo (JP)

(72) Inventors: Shogo Kataoka, Tokyo (JP); Tatsuro Mino, Tokyo (JP); Koji Todoroki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/400,550

(22) Filed: Aug. 12, 2021

(65) Prior Publication Data

US 2022/0051870 A1 Feb. 17, 2022

(30) Foreign Application Priority Data

Aug. 14, 2020 (JP) .............................. JP2020-136922

(51) Int. Cl.
*H01J 37/305* (2006.01)
*G01N 1/32* (2006.01)

(52) U.S. Cl.
CPC ............ *H01J 37/3053* (2013.01); *G01N 1/32* (2013.01); *H01J 2237/31745* (2013.01)

(58) Field of Classification Search
CPC ......... H01J 37/3053; H01J 2237/31745; H01J 2237/2007; H01J 37/20; H01J 2237/026; H01J 2237/3151; H01J 37/3056; G01N 1/32
See application file for complete search history.

(56) References Cited

U.S. PATENT DOCUMENTS

| 10,930,467 B2* | 2/2021 | Negishi | H01J 37/3005 |
| 11,226,273 B2* | 1/2022 | Kamino | H01J 37/3053 |
| 2002/0166976 A1* | 11/2002 | Sugaya | H01J 37/20 250/440.11 |
| 2002/0194938 A1* | 12/2002 | Koo | H01J 37/20 73/864.91 |

(Continued)

FOREIGN PATENT DOCUMENTS

| DE | 112014002250 T5 | 2/2016 |
| JP | 2007248368 A | 9/2007 |

(Continued)

OTHER PUBLICATIONS

Extended European Search Report issued in EP21189481.1 dated Jan. 28, 2022.
Office Action issued in JP2020136922 dated Oct. 4, 2022.

*Primary Examiner* — David A Vanore
(74) *Attorney, Agent, or Firm* — The Webb Law Firm

(57) ABSTRACT

An ion milling apparatus has: a sample holder including a shield member for shielding the sample except for a portion to be milled; and a sample locking member cooperating with the shield member such that the sample is sandwiched and held therebetween. The shield member has an edge portion that determines a milling position on or in the sample. The sample locking member is disposed downstream of the edge portion in the direction of irradiation by the ion beam and has a support portion cooperating with the edge portion to support the milled portion therebetween. The support portion has a first surface making contact with the sample and a second surface making a given angle to the first surface. The given angle is equal to or less than 90°.

8 Claims, 32 Drawing Sheets

(56) References Cited

U.S. PATENT DOCUMENTS

| | | | | |
|---|---|---|---|---|
| 2013/0220806 A1* | 8/2013 | Iwaya | ................. | H01J 37/20 |
| | | | | 204/298.36 |
| 2013/0240353 A1* | 9/2013 | Watanabe | ............. | H01J 37/20 |
| | | | | 204/298.36 |
| 2016/0126057 A1* | 5/2016 | Kaneko | ............. | H01J 37/3023 |
| | | | | 250/453.11 |
| 2018/0342369 A1* | 11/2018 | Kataoka | ............ | C23C 14/5833 |
| 2018/0358201 A1* | 12/2018 | Negishi | ................ | H01J 37/20 |
| 2019/0033182 A1* | 1/2019 | Kamino | ............... | G01N 1/32 |
| 2019/0272973 A1 | 9/2019 | Kaneko et al. | | |
| 2019/0287755 A1* | 9/2019 | Kataoka | ................ | H01J 37/28 |
| 2021/0193430 A1 | 6/2021 | Iwaya et al. | | |
| 2021/0265130 A1* | 8/2021 | Kaneko | ............. | H01J 37/3053 |
| 2022/0051870 A1* | 2/2022 | Kataoka | ............. | H01J 37/3056 |

FOREIGN PATENT DOCUMENTS

| | | |
|---|---|---|
| JP | 2019003732 A | 1/2019 |
| KR | 101522875 B1 | 5/2015 |
| WO | 2015122713 A1 | 8/2015 |
| WO | 2017145371 A1 | 8/2017 |

* cited by examiner

PRIOR ART

ION MILLING APPARATUS AND SAMPLE HOLDER

CROSS-REFERENCE TO RELATED APPLICATION

This application claims priority to Japanese Patent Application No. 2020-136922 filed Aug. 13, 2020, the disclosure of which is hereby incorporated by reference in its entirety.

BACKGROUND OF THE INVENTION

1. Field of the Invention

The present invention relates to an ion milling apparatus and sample holder.

2. Description of the Related Art

An ion milling apparatus is a machine for milling a sample by means of an ion beam. Ion milling apparatus are used to produce either samples observed with an electron microscope (such as a scanning electron microscope or a transmission electron microscope) or samples analyzed by an analytical instrument (such as an electron probe microanalyzer or an Auger microscope). Where a sample is milled by an ion milling apparatus, a shield member is used to shield the portion of a sample that is not to be milled, and an ion beam is directed at the sample via the shielding member (see, for example, JP-A-2007-248368).

The prior art ion milling apparatus is equipped with a configuration, for example, as shown in FIG. 54, to enable a sample to be set on the shielding member. In FIG. 54, the sample, 200, is bonded and secured to a sample support stage 210. The shielding member, 220, in the form of a flat plate is placed above the support stage 210. The sample 200 is sandwiched and held between the sample support stage 210 and the shielding member 220. The sample 200 held in this way is irradiated with an ion beam 230 via the shielding member 220, the beam being emitted from an ion source (not shown). As a result, a front end portion 200a (hereinafter may be referred to as the milled portion) of the sample 200 which protrudes from an edge portion 220a of the shielding member 220 is etched away. This produces a cross section of the sample 200 immediately under the edge portion 220a of the shielding member 220. By forming a cross section in this way, there is obtained a sample adapted for observation with an electron microscope or analysis by an analytical instrument.

In the prior art ion milling apparatus, the front end portion of the shielding member 220 is located close to the front end portion 200a of the sample 200 but the front end portion of the sample support stage 210 is positioned remotely from the front end portion 200a of the sample 200. Therefore, as shown in FIG. 55, if the handled sample 200 is in thin film form, the sample 200 cannot retain its own shape and so the front end side of the sample 200 undergoes flexure.

Accordingly, JP-A-2007-248368 sets forth a technique for bonding the sample 200 to a baseplate 240 with adhesive and then squeezing the sample 200 and the baseplate 240 between the sample support stage 210 and the shield member 220 as shown in FIG. 56. If the sample 200 is in thin film form, this technique assures that the milled portion 200a of the sample 200 can be supported.

In the prior art ion milling apparatus set forth in JP-A-2007-248368, the ion beam 230 emitted from the ion source is made to impinge on the sample 200 via both the shielding member 220 and the baseplate 240. Therefore, as shown in FIG. 57, if the front end portion of the sample 200 is located retracted from the front end portion of the baseplate 240, the milled portion 200a of the sample 200 is shielded by the shielding portion 220 and the baseplate 240 as viewed from the upstream side relative to the direction of the ion beam 230. As a result, the ion beam 230 cannot impinge on the sample 200 and thus the sample 200 cannot be milled.

Furthermore, with the prior art ion milling apparatus shown in the above-cited FIG. 54, if the sample 200 is in block form or resilient, and if it is sandwiched in between the shielding member 220 and the sample support stage 210, the front end of the sample 200 and its vicinities may tilt relative to the center axis of the ion beam 230 as shown in FIG. 58, producing a gap 250 between the sample 200 and the shielding member 220. If so, material 260 sputtered off by the illumination by the ion beam 230 moves through the gap 250 and adheres to the sample 200. This phenomenon is referred to as redeposition. The redeposited material 260 is not removed by the irradiation by the ion beam 230 but rather remains on the sample 200 after the milling. Furthermore, if the sample 200 tilts relative to the center axis of the ion beam 230, and if the milled portion or target of milling 270 (such as a through hole) exists down into a deep position within the sample 200 as shown in FIG. 59, then a line 280 milled by the irradiation with the ion beam 230 deviates from the milled portion 270. This problem also occurs where a portion to be milled is present only at a deep position within the sample 200.

SUMMARY OF THE INVENTION

It is an object of the present invention to provide an ion milling apparatus and sample holder capable of reliably supporting a portion of a sample to be milled and of suppressing material sputtered off by ion beam irradiation from remaining on the sample.

The present invention provides an ion milling apparatus which mills a sample by ion beam irradiation and which is equipped with a sample holder for supporting the sample. The sample holder has both a shield member for shielding the sample except for a portion to be milled and a sample locking member cooperating with the shield member such that the sample is sandwiched and held therebetween. The shield member has an edge portion that determines a milling position on or in the sample. The sample locking member is disposed downstream of the edge portion in the direction of the ion beam irradiation and has at least one support portion cooperating with the edge portion to support the milled portion therebetween. The support portion has a first surface making contact with the sample and a second surface making a given angle to the first surface. The given angle is equal to or less than 90°.

The present invention provides a sample holder for use in an ion milling apparatus for milling a sample by ion beam irradiation. The sample holder has both a shield member for shielding the sample except for a portion to be milled and a sample locking member cooperating with the shield member such that the sample is sandwiched and held therebetween. The shield member has an edge portion for determining a milling position on or in the sample. The sample locking member has a support portion which is disposed downstream of the edge portion in the direction of the ion beam irradiation and which cooperates with the edge portion to support the milled portion therebetween. The support portion has a first surface making contact with the sample and a second surface making a given angle to the first surface. The given angle is equal to or less than 90°.

According to the present invention, the portion of the sample to be milled can be supported reliably. Also, material sputtered off by ion beam irradiation can be suppressed from remaining on the sample.

DETAILED DESCRIPTION OF THE INVENTION

Figure 1:
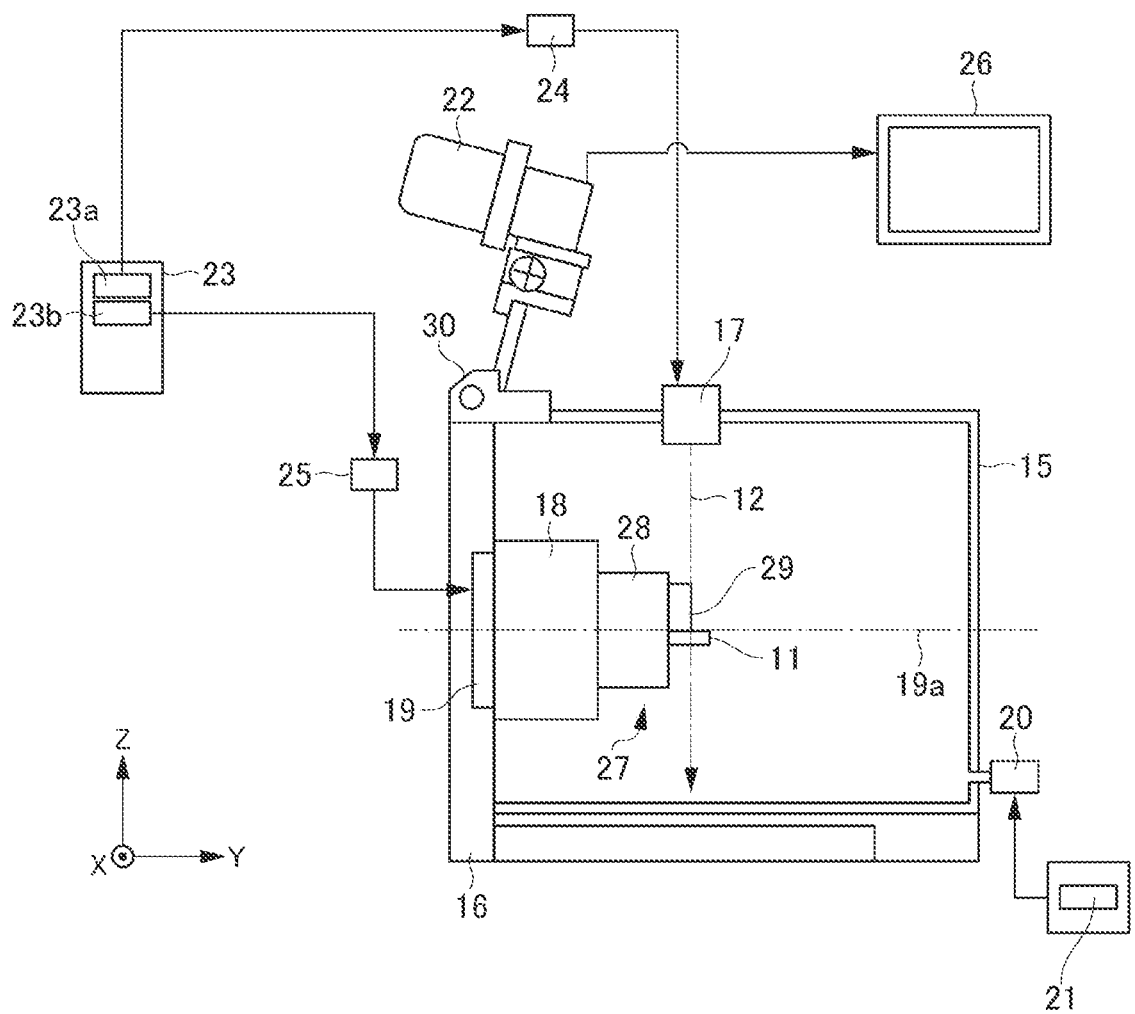
FIG. 1 is a schematic representation showing one example of the configuration of an ion milling apparatus associated with a first embodiment of the present invention.

The preferred embodiments of the present invention are hereinafter described in detail with reference to the drawings. In the present specification and drawings, elements having substantially identical function or configuration are indicated by identical reference numerals and a repetition of the description thereof is omitted.

First Embodiment

FIG. 1 is a schematic view of an ion milling apparatus associated with a first embodiment of the present invention, illustrating one example of the configuration of the ion milling apparatus. This ion milling apparatus, indicated by reference numeral 10, is used to produce a sample which is either observed, for example, with a scanning electron microscope or a transmission electron microscope or analyzed by an analytical instrument such as an electron probe microanalyzer or an Auger microscope. The ion milling apparatus 10 mills a sample 11 into a shape adapted for observation with a scanning electron microscope or a transmission electron microscope by directing an ion beam 12 at the sample 11 that is to be milled.

As shown in FIG. 1, the ion milling apparatus 10 has a vacuum chamber 15, a sample stage pull-out mechanism 16, an ion source 17, a sample stage 18, a rotational mechanism 19, an exhaust portion 20, an exhaust control portion 21, a camera 22, a controller 23, a voltage power supply 24, a rotational drive mechanism 25, and a display portion 26. The controller 23 is equipped with an ion source controller section 23a and a rotation control section 23b.

The vacuum chamber 15 is a hollow container. The exhaust portion 20 is coupled to the vacuum chamber 15. Operation of the exhaust portion 20 is controlled by the exhaust control portion 21. The exhaust portion 20 exhausts air inside the vacuum chamber 15 by operating under the control of the exhaust control portion 21.

The sample stage pull-out mechanism 16 is used to pull the sample stage 18 out of the vacuum chamber 15. The pull-out mechanism 16 is mounted to the vacuum chamber 15 so as to be able to open and close it, the pull-out mechanism 16 plugging the opening of the vacuum chamber 15. The sample stage 18 and the rotational mechanism 19 are mounted to the sample stage pull-out mechanism 16.

When the sample stage pull-out mechanism 16 is closed, the sample stage 18 is received inside the vacuum chamber 15. When the pull-out mechanism 16 is opened, the sample stage 18 is pulled out of the vacuum chamber 15. The pull-out mechanism 16 can be switched between its open and closed states by moving the pull-out mechanism 16 relative to the vacuum chamber 15 in the left/right direction in FIG. 1. The sample stage 18 supports the sample 11 via a sample holder 27. The sample holder 27 that supports the sample 11 has a holder body 28 forming a base and a shield member 29. The shield member 29 will be described in detail below. The sample holder 27 can be mounted to and detached from the sample stage 18. The sample 11 is shaped in the form of a flat plate.

The rotational mechanism 19 rotates the sample holder 27 via the sample stage 18. The rotational mechanism 19 has an axis of rotation 19a which is perpendicular to the center axis of the ion beam 12 and which is parallel to a direction (Y direction in the figure) in which the sample 11 protrudes from the shield member 29. The rotational mechanism 19 rotates the sample holder 27 according to the operation of the rotational drive mechanism 25. At this time, the sample holder 27 rotates about the axis of rotation 19a of the rotational mechanism 19. The rotation control section 23b controls the rotation of the sample holder 27 via the rotational drive mechanism 25. The rotational mechanism 19 may rotate the sample holder 27 integrally with or independent of the sample stage 18.

The ion source 17 is disposed at the top of the vacuum chamber 15 and emits the ion beam 12. The ion source 17 is made of a gas ion gun, for example. The gas ion gun ionizes argon gas by electric discharge and emits an ion beam. The ion source 17 emits the ion beam 12 vertically downward into the inner space of the vacuum chamber 15.

In the description provided so far, it is assumed that one of two directions perpendicular to the center axis of the ion beam 12 is an X direction and that the other is a Y direction. It is also assumed that a direction running parallel to the center axis of the ion beam 12 and perpendicular to the X and Y directions is a Z direction. In the preferred embodiments of the present invention, the X and Y directions are two horizontal directions. The Z direction is the vertical direction, or up/down direction. The center axis 12a (see FIG. 2) of the ion beam 12 is parallel to the vertical direction.

The voltage power supply 24 is electrically connected to the ion source 17 and operates to apply a voltage to the ion source 17. The power supply 24 causes the ion source 17 to emit the ion beam 12 by applying the voltage to the ion source 17 under control of the ion source controller section 23a which controls the ion source 17 via the voltage power supply 24.

The camera 22 is mounted so as to be capable of being rotated by a camera rotating mechanism 30 that is mounted at the top of the sample stage pull-out mechanism 16 and moves with this pull-out mechanism 16. The camera 22 can be placed either into a first position or into a second position by rotation of the camera rotating mechanism 30. In the first position, the optical axis of the camera 22 is parallel to the Z direction. When the camera 22 is placed in the first position, the optical axis of the camera 22 passes through a milling position on or in the sample 11. In the second position, the camera 22 is tilted through a great angle relative to the Z direction, as shown in FIG. 1.

The camera 22 captures images of the sample 11 supported to the sample holder 27 and of the shield member 29. For this purpose, an optical microscope may be used instead of the camera 22. The display portion 26 displays the images captured by the camera 22. The display portion 26 is made of a monitor or a touch panel display.

Figure 2:
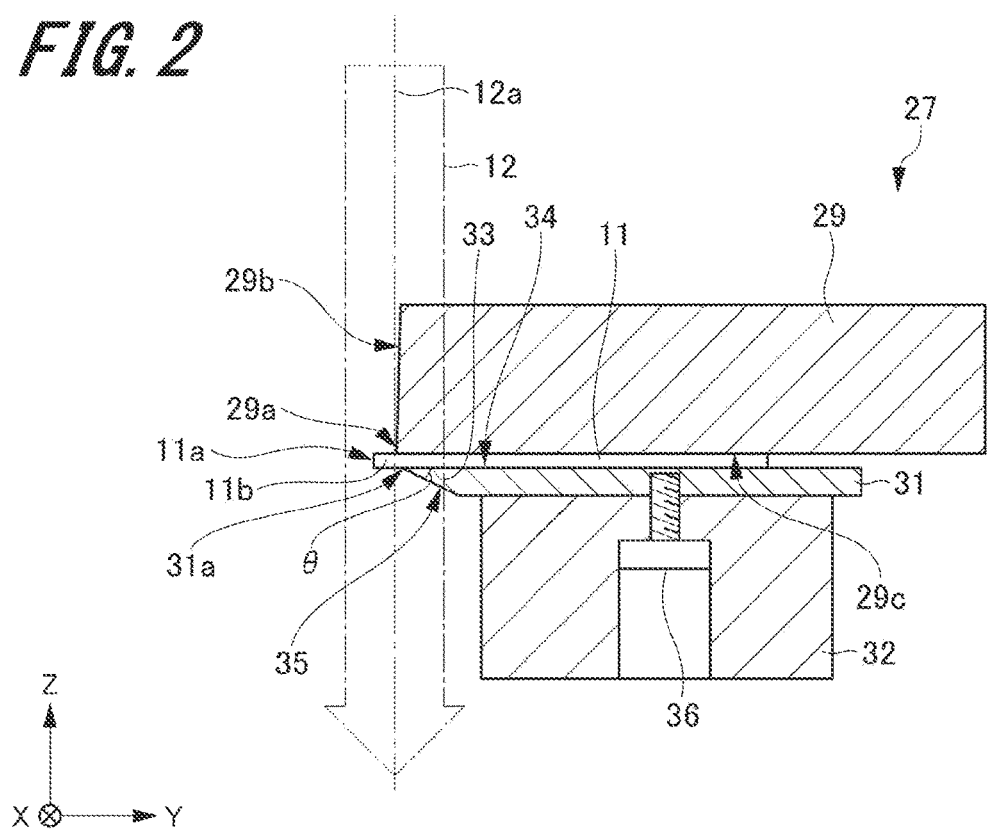
FIG. 2 is a schematic side elevation in cross section showing main portions of the ion milling apparatus of FIG. 1.

FIG. 2 is a schematic side elevation showing main portions of the ion milling apparatus associated with the first embodiment of the present invention. As shown in FIG. 2, the sample holder 27 has a sample locking member 31 and a sample support stage 32 as well as the aforementioned holder body 28 and shield member 29. The shield member 29 is shaped in the form of a flat plate and has an edge portion 29a at its front end. The shield member 29 has a front end surface 29b that is slightly tilted relative to the center axis 12a of the ion beam 12.

The edge portion 29a of the shield member 29 determines the milling position on or in the sample 11. That is, the sample 11 is milled based on the edge portion 29a of the shield member 29. Therefore, the portion of the sample 11 to be milled is placed in alignment with the position of the edge portion 29a of the shield member 29. When the sample 11 is observed with a scanning electron microscope or a transmission electron microscope, the milled portion is the subject of observation. When the sample 11 is analyzed with an electron probe microanalyzer, an Auger microscope, or the like, the milled portion is the subject of analysis. The edge portion 29a of the shield member 29 is formed at the angled corner at the intersection between the front end surface 29b of the shield member 29 and a shield surface 29c of the shield member 29, the shield surface 29c making contact with the sample 11. The shield surface 29c shields the sample 11 except for the milled portion 11b. That is, the shield member 29 shields the sample 11 except for the milled portion 11b, i.e., shields the non-milled portion.

The shield surface 29c of the shield member 29 is placed in contact with the top surface of the sample 11. A part of the sample 11, including the front end surface 11a of the sample 11, is placed so as to protrude from the edge portion 29a of the shield member 29. The protruding portion is the milled portion 11b which is removed by irradiation by the ion beam 12.

The sample locking member 31 cooperates with the shield member 29 such that the sample 11 is sandwiched and held therebetween. The sample locking member 31 is shaped like a flat plate. The sample locking member 31 has a support portion 33 formed by both a first surface 34 and a second surface 35. The first surface 34 is equivalent to the top surface of the sample locking member 31. The first surface 34 touches the sample 11 on the opposite of the shield surface 29c of the shield member 29. That is, the first surface 34 is placed in contact with the bottom surface of the sample 11. The second surface 35 makes a given angle θ to the first surface 34.

The support portion 33 is disposed downwardly of the edge portion 29a of the shield member 29 in the direction of irradiation by the ion beam 12. The milled portion 11b of the sample 11 is supported between the support portion 33 and the edge portion 29a. The given angle θ between the first surface 34 and the second surface 35 forming the support portion 33 is less than 90° and greater than 0°. Preferably, the given angle θ is an acute angle, preferably less than 60°, more preferably less than 55°, still more preferably less than 45°. Where the given angle θ is set to a small value in this way, the support portion 33 is shaped like a wedge.

The sample 11 is placed over the sample support stage 32 via the sample locking member 31. The sample locking member 31 is secured to the sample support stage 32 with a screw 36. The sample support stage 32 is located on the opposite side of the sample locking member 31 from the shielding member 29 in the Z direction.

Then, a procedure for milling a sample using the ion milling apparatus associated with the first embodiment of the present invention is described. This procedure includes a method of preparing the sample.

Figure 3:
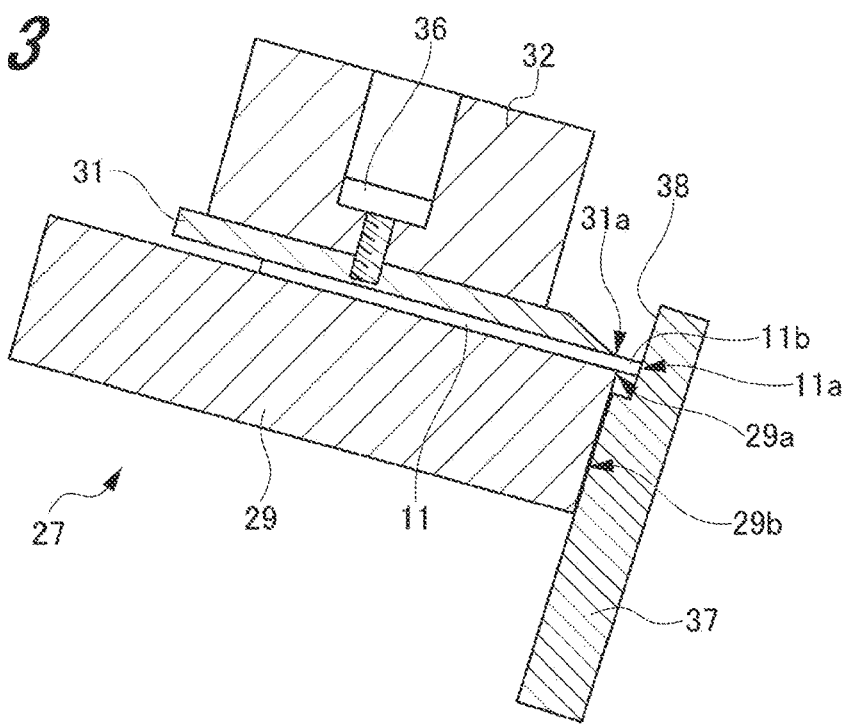
FIG. 3 is a cross-sectional view illustrating a procedure taken when a sample is milled using the ion milling apparatus of FIGS. 1 and 2.

First, as shown in FIG. 3, the sample 11 is set on the sample holder 27 in the following procedure. The operator of the ion milling apparatus 10 first brings the edge portion 29a of the shield member 29 and the front end 31a of the sample locking member 31 into contact with a reference plane (not shown) to thereby adjust the edge portion 29a and the front end 31a in position, that is, they assume the same position in the Y direction as shown in FIG. 2, i.e., they are flush with each other. The front end 31a of the sample locking member 31 is the end of the target illuminated with the ion beam 12 in the Y direction. Then, the operator inserts the sample 11 between the shield member 29 and the sample locking member 31 which have been already adjusted in position. At this stage, a gap greater than the thicknesswise dimension of the sample 11 is secured between the shield member 29 and the sample locking member 31. That is, the position of the sample 11 is not fixed but rather rendered freely movable. Then, as shown in FIG. 3, the operator mounts the protrusion amount setting member 37 on the sample holder 27, and the amount of protrusion of the sample 11 is set using the setting member 37. In particular, the protrusion amount setting member 37 is brought into contact with the front end surface 29b of the shield member 29. Also, the front end surface 11a of the sample 11 is brought into contact with a recessed portion 38 of the protrusion amount setting member 37. Consequently, the milled portion (target of milling) 11b of the sample 11 is made to protrude a given amount from the edge portion 29a of the shield member 29. This amount of protrusion of the milled portion 11b is defined based on the edge portion 29a of the shield member 29. The amount of protrusion of the milled portion 11b varies depending on the position of the milled portion. In many cases, the amount of protrusion is set between 50 and 100 μm, inclusively.

Then, the operator squeezes the sample 11 in between the shield member 29 and the sample locking member 31 while maintaining the front end surface 11a of the sample 11 in contact with the recessed portion 38 in the protrusion amount setting member 37, thus securing the sample 11. At this time, the front end of the sample 11 is supported from above and below by the shield member 29 and the sample locking member 31. The milling position on or in the sample 11 is located sandwiched between the edge portion 29a of the shield member 29 and the front end 31a of the sample locking member 31. Therefore, if the sample 11 is thin and filmy, the milled portion 11b of the sample 11 can be supported reliably without the front end side of the sample 11 being flexed. Furthermore, the front end of the sample 11 and its vicinities are pressed against the shield member 29 by the support portion 33 of the sample locking member 31. Therefore, if a sample in the form of a block or a resilient sample is handled, the sample 11 can be supported without tilting the front end of the sample 11 and its vicinities relative to the center axis 12a of the ion beam 12. Consequently, the shield member 29 and the sample 11 can be held together while in intimate contact with each other.

After the sample 11 is set as described above, the operator takes the protrusion amount setting member 37 out of the sample holder 27 and then mounts the sample holder 27 on the sample stage 18 while the sample stage 18 is pulled out from the vacuum chamber 15 by the sample stage pull-out mechanism 16. At this time, the sample holder 27 is mounted on the sample stage 18 while placing the shield member 29 on the upper side and the sample locking member 31 on the lower side. The amount of protrusion of the sample 11 is confirmed by making use of the image captured by the camera 22. Where the amount of protrusion of the sample 11 is checked, the camera 22 is brought into the first position by rotation of the camera rotating mechanism 30. Under this condition, the image captured by the camera 22 is displayed on the display portion 26. Consequently, the operator can check the amount of protrusion of the sample 11 while utilizing the image which is captured by the camera 22 and displayed on the display portion 26.

Then, the operator places the camera 22 into the second position by rotation of the camera rotating mechanism 30. Then, the sample stage 18 is pushed in and received in the vacuum chamber 15 by the sample stage pull-out mechanism 16. At this time, the sample holder 27 and the sample 11 are received in the vacuum chamber 15 together with the sample stage 18.

Then, the operator performs a manipulation to emit the ion beam 12 from the ion source 17 under the state shown in the above-referenced FIG. 2. Consequently, the ion beam 12 is directed at the sample 11 via the shield member 29. At this time, the voltage power supply 24 applies a voltage to the ion source 17 in response to control commands from the ion source controller section 23*a*, thus causing the ion source 17 to emit the ion beam 12. In consequence, the sample 11 is etched. If the front end 31*a* of the sample locking member 31 is acute angled, e.g., if the front end 31*a* of the sample locking member 31 protrudes from the front end surface 11*a* of the sample 11 as shown in FIG. 4, material sputtered off by the irradiation by the ion beam 12 stays less on the sample 11 for the following reason.

Figure 4:
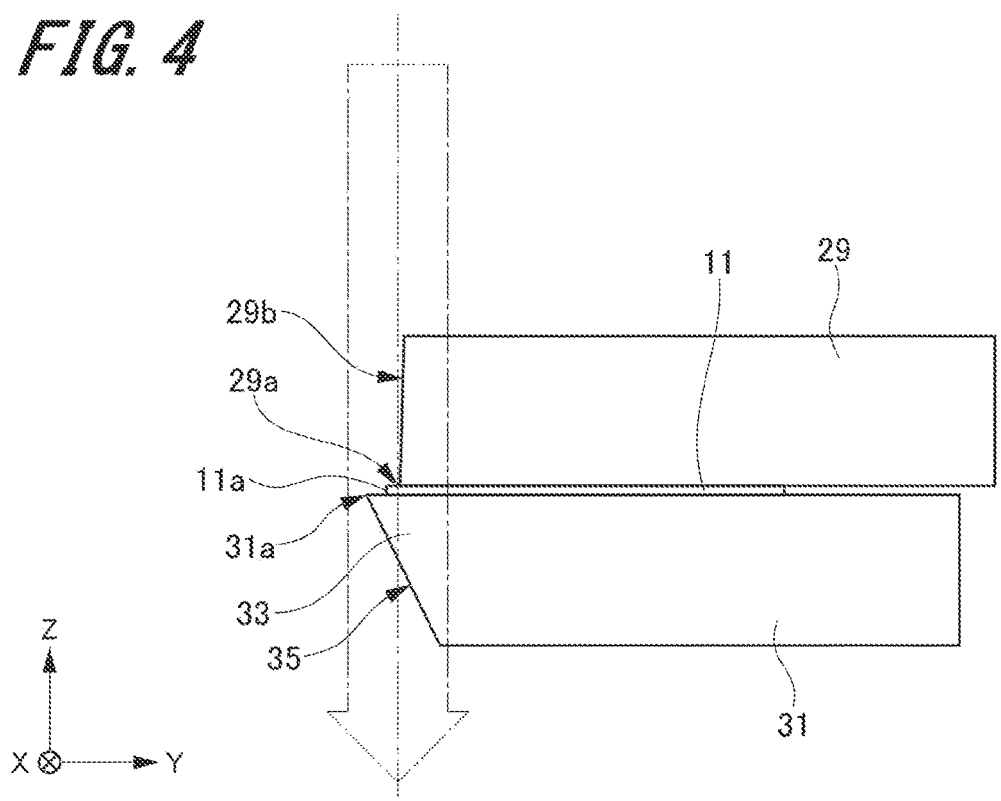
FIG. 4 is a schematic side elevation showing an example of arrangement of the sample and a sample locking member.
Figure 5:
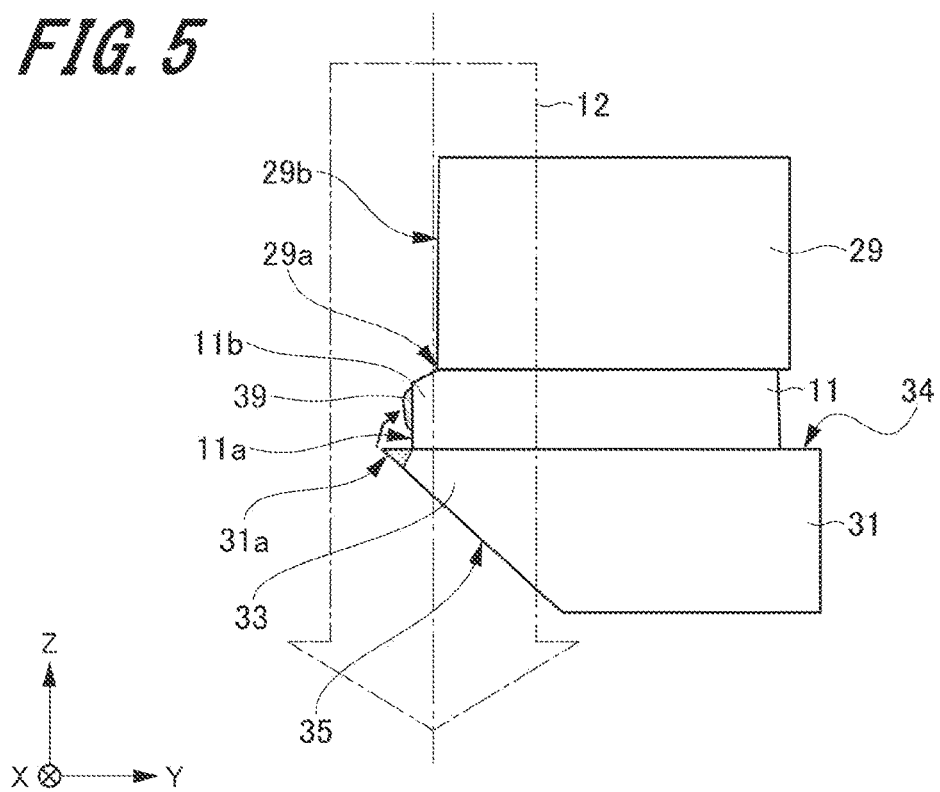
FIG. 5 illustrates a first step of a process of milling a sample by ion beam irradiation.
Figure 6:
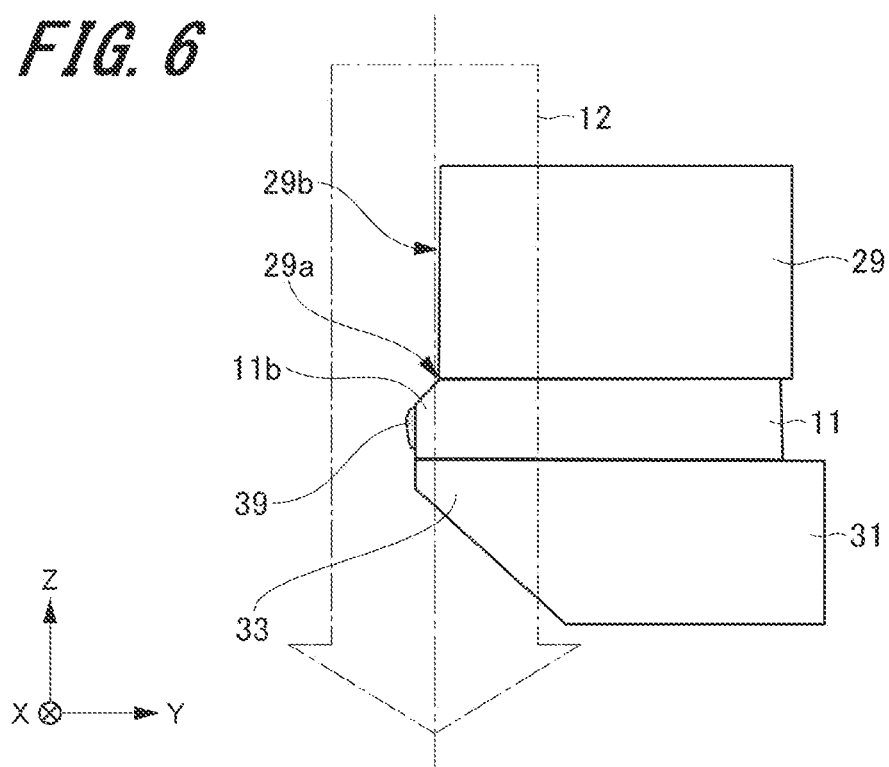
FIG. 6 illustrates a second step of the process of milling the sample by ion beam irradiation.

First, if the sample 11 is irradiated with the ion beam 12 via the shield member 29 as shown in FIG. 4, the ion beam 12 also hits the front end of the sample locking member 31 and so the front end 31*a* of the sample locking member 31 is etched or sputtered as shown in FIG. 5. Material 39 sputtered off adheres to the front end surface 11*a* of the sample 11. If the front end 31*a* of the sample locking member 31 is formed into a right angle, then the amount of the sputtered material 39 adhering to the front end surface 11*a* of the sample 11 can be reduced as compared with the case where the front end 31*a* is formed into an obtuse angle. If the front end 31*a* of the sample locking member 31 is formed into an acute angle, a part of the sample locking member 31 protruding from the front end surface 11*a* of the sample 11 is etched off earlier than the milled portion 11*b* of the sample 11 as shown in FIG. 6. If the front end 31*a* of the sample locking member 31 is acute-angled, generation of the sputtered material 39 is suppressed to a low level. Consequently, the amount of the sputtered material 39 adhering to the front end surface 11*a* of the sample 11 can be suppressed further.

Figure 7:
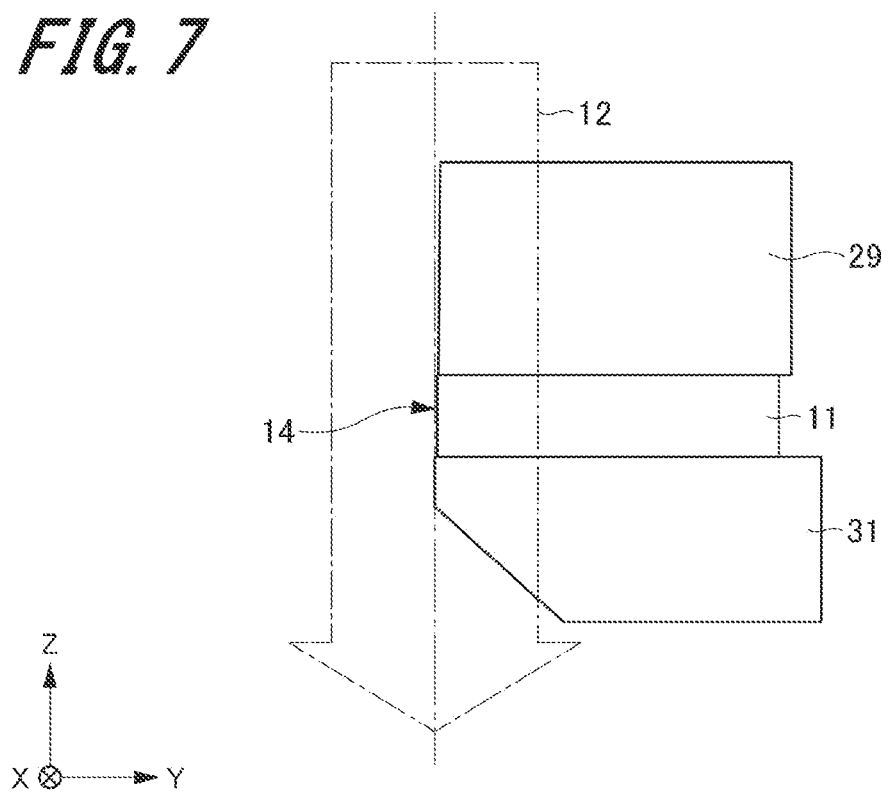
FIG. 7 illustrates a third step of the process of milling the sample by ion beam irradiation.

After partial disappearance of the sample locking member 31 protruding from the front end surface 11*a* of the sample 11, etching of the sample 11 and etching of the sample locking member 31 will progress at the same time. In other words, the ion milling apparatus mills the sample 11 and the sample locking member 31 simultaneously by irradiation by the ion beam 12. Therefore, if the sputtered material 39 produced by etching of the sample locking member 31 adheres to the front end surface 11*a* of the sample 11, the adhering material 39 is quickly etched away by etching of the sample 11. At the stage where the target of milling 11*b* of the sample 11 has been etched away, the sputtered material 39 hardly remains on the cross section 14 of the sample 11 as shown in FIG. 7. Thus, if the front end 31*a* of the sample locking member 31 is formed into an acute angle, the sputtered material 39 is less likely to remain on the sample 11.

In this way, the ion milling apparatus 10 associated with the first embodiment of the present invention is equipped with the sample locking member 31 which cooperates with the shield member 29 to sandwich and hold the sample 11 therebetween. The sample locking member 31 has the support portion 33 cooperating with the edge portion 29*a* of the shield member 29 to support the milled portion 11*b* therebetween. Therefore, the milled portion 11*b* of the sample 11 can be supported reliably. The support portion 33 of the sample locking member 31 has the first surface 34 and the second surface 35 which together form the right-angled or acute-angled front end 31*a* of the sample locking member 31. Hence, the material sputtered off by the irradiation by the ion beam 12 can be suppressed from remaining on the sample 11.

The top and bottom surfaces of the sample 11 almost totally make intimate contact with the shield member 29 and the sample locking member 31. Therefore, when the sample 11 generates heat in response to the irradiation by the ion beam 12, the heat can be dissipated to the shield member 29 and sample locking member 31 from both top and bottom surfaces of the sample 11. Consequently, when the sample 11 is milled, the heat dissipation and cooling effects can be enhanced.

Figure 8:
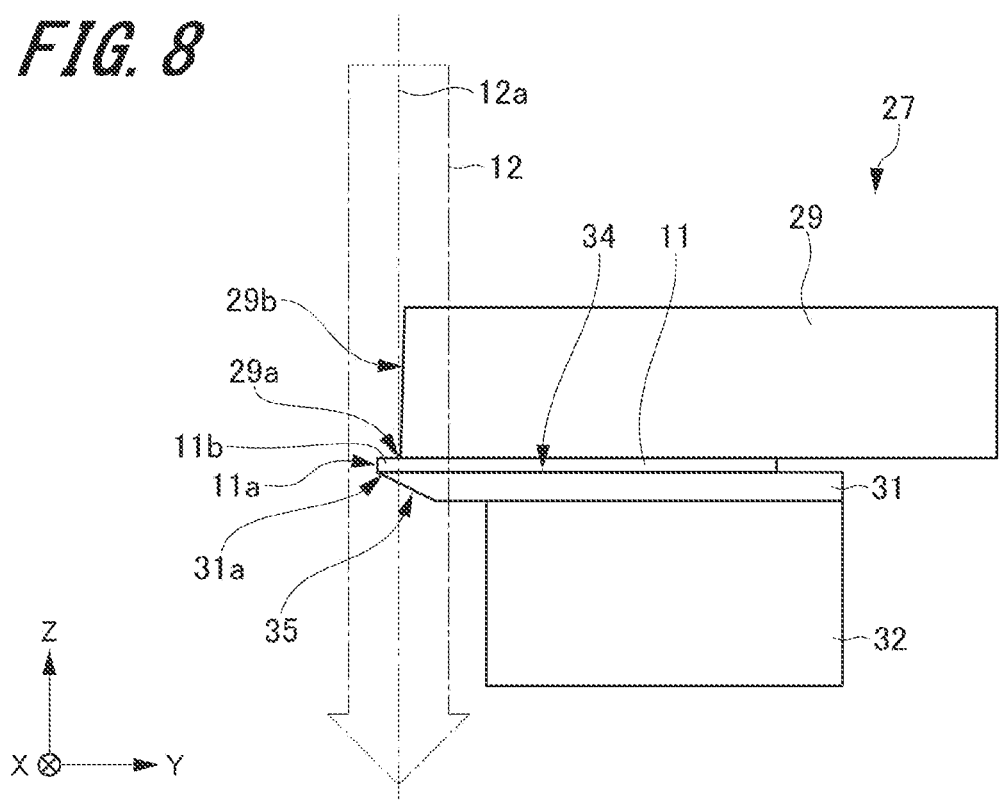
FIG. 8 is a schematic side elevation of a modification of the ion milling apparatus associated with the first embodiment of the present invention.

In the above-described first embodiment, there is adopted the structure for holding the sample locking member 31 to the sample support stage 32 with the screw 36. The present invention is not restricted to this example. For example, a structure as shown in FIG. 8 may also be adopted. In FIG. 8, the sample 11 is bonded to the sample locking member 31 with adhesive or the like. Under this bonded state, the sample 11 and the sample locking member 31 are adjusted in position such that the front end surface 11*a* and the front end 31*a* assume the same position in the Y direction. The sample locking member 31 having the sample 11 bonded thereto is attached to the sample support stage 32 with wax, adhesive, or the like. On the other hand, the shield member 29 is placed in position such that its edge portion 29*a* is placed at the milling position on or in the sample 11. This structure also yields advantageous effects similar to those provided by the first embodiment.

Furthermore, in the first embodiment above, the sample locking member 31 is shaped differently from the shield member 29. The present invention is not restricted to this example. The sample locking member 31 may be shaped identically to the shield member 29. In this case, the sample locking member 31 and the shield member 29 are arranged symmetrically up and down about the sample 11.

In addition, in the above first embodiment, the sample support stage 32 and the sample locking member 31 are secured together with the screw 36 (see FIG. 2). The present invention is not restricted to this structure. For example, the sample locking member 31 may be pushed up toward the shield member 29 with a screw or screws (not shown).

Further, in the above first embodiment, the sample locking member 31 is mounted independent of the sample support stage 32. The present invention is not restricted to this structure. The sample locking member 31 and the sample support stage 32 may be formed integrally.

Second Embodiment

Figure 9:
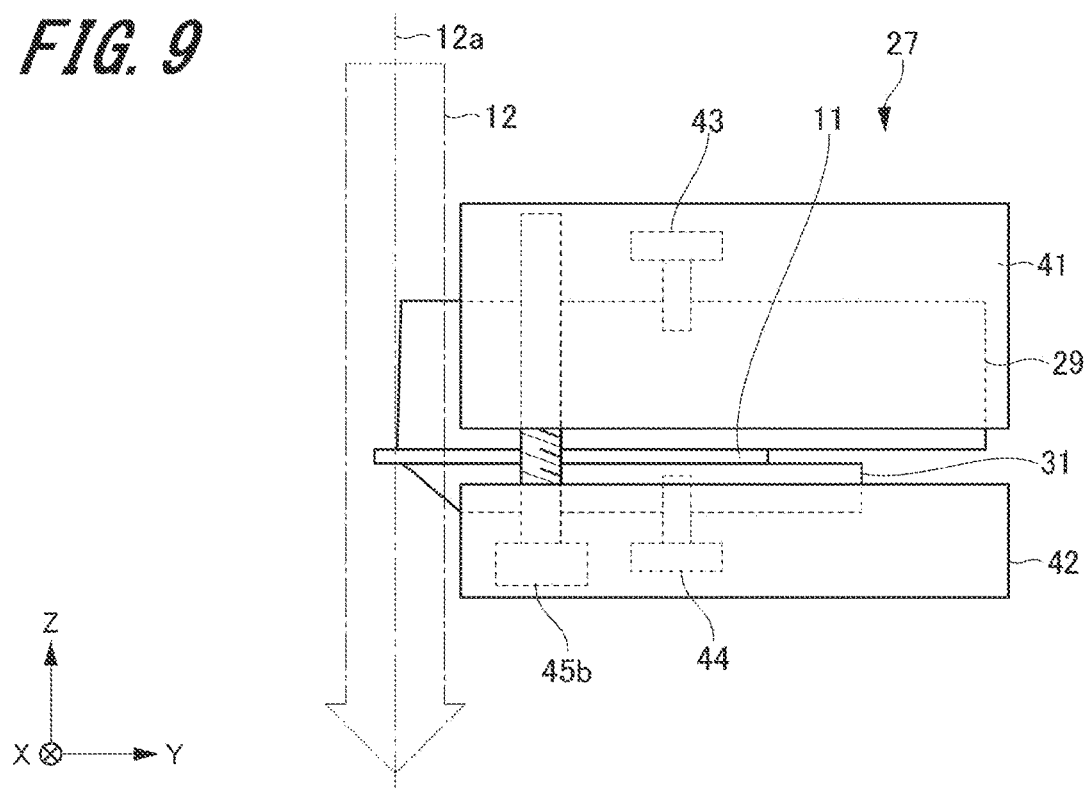
FIG. 9 is a schematic side elevation showing main portions of an ion milling apparatus associated with a second embodiment of the present invention.
Figure 10:
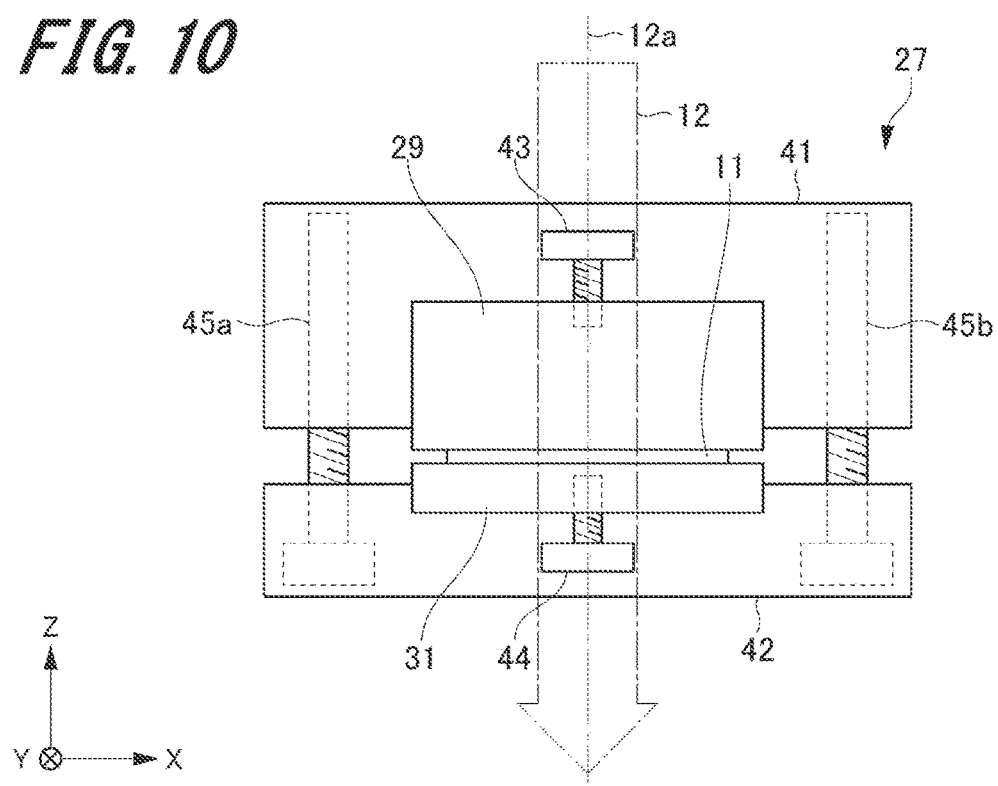
FIG. 10 is a schematic front elevation of the main portions of the ion milling apparatus shown in FIG. 9.

FIG. 9 is a schematic side elevation showing main portions of an ion milling apparatus associated with a second embodiment of the present invention. FIG. 10 is a schematic front elevation showing main portions of the ion milling apparatus of FIG. 9.

As shown in FIGS. 9 and 10, the sample holder 27 has a pair of clamp members 41, 42 in addition to the aforementioned shield member 29 and sample locking member 31. The clamp members 41 and 42 are equivalent to first and second clamp members, respectively. The shield member 29 is secured to the clamp member 41 with a screw 43. The sample locking member 31 is secured to the clamp member 42 with a screw 44. The shield member 29 has an internally threaded portion (not shown) with which an externally threaded portion of the screw 43 threadedly engages. The clamp member 41 has a stepped hole (not shown) in which the head and shank of the screw 43 can be inserted. Similarly, the sample locking member 31 has an internally threaded portion with which an externally threaded portion of the screw 44 threadedly engages. The clamp portion 42 has a stepped portion (not shown) in which the head and shank of the screw 44 can be inserted.

The clamp members 41 and 42 of one pair are secured by a pair of screws 45a, 45b. The screws 45a and 45b of one pair are equivalent to tightening members for tightening the shield member 29 and the sample locking member 31 via the clamp members 41 and 42. The clamp member 41 has an internally threaded portion (not shown) with which an externally threaded portion of the screw 45a threadedly engages. The clamp member 42 is provided with a stepped hole (not shown) in which the head and shank of the screw 45a can be inserted. Similarly, the clamp member 41 is provided with an internally threaded portion (not shown) with which an externally threaded portion of the screw 45b threadedly engages. The clamp member 42 is provided with a stepped hole (not shown) in which the head and shank of the screw 45b can be inserted.

Figure 11:
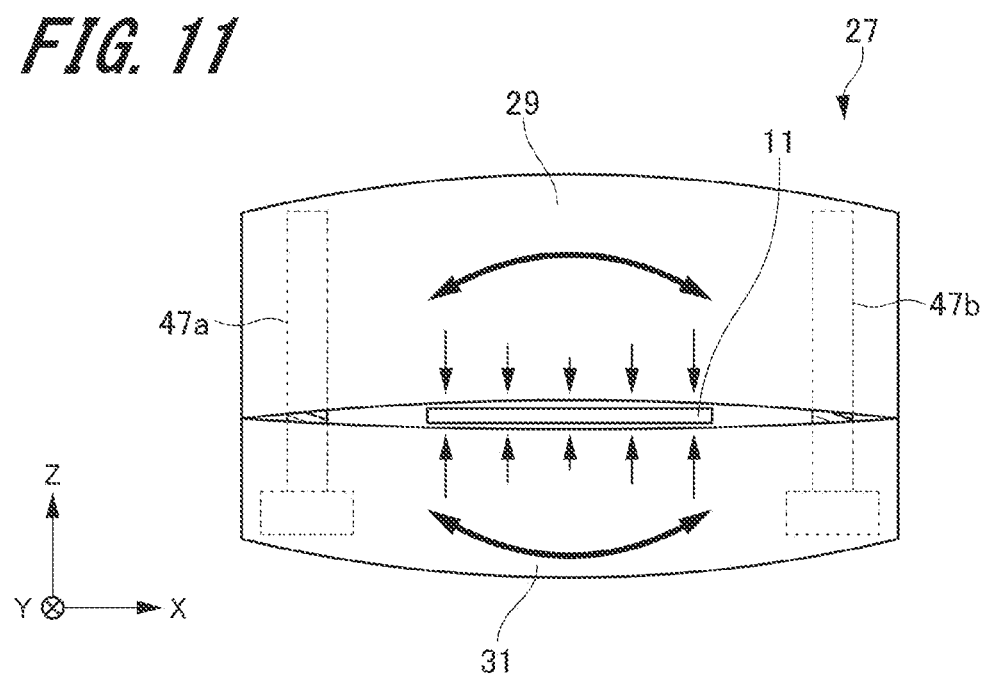
FIG. 11 is a front elevation showing main portions of an ion milling apparatus compared with the ion milling apparatus associated with the second embodiment of the present invention.
Figure 12:
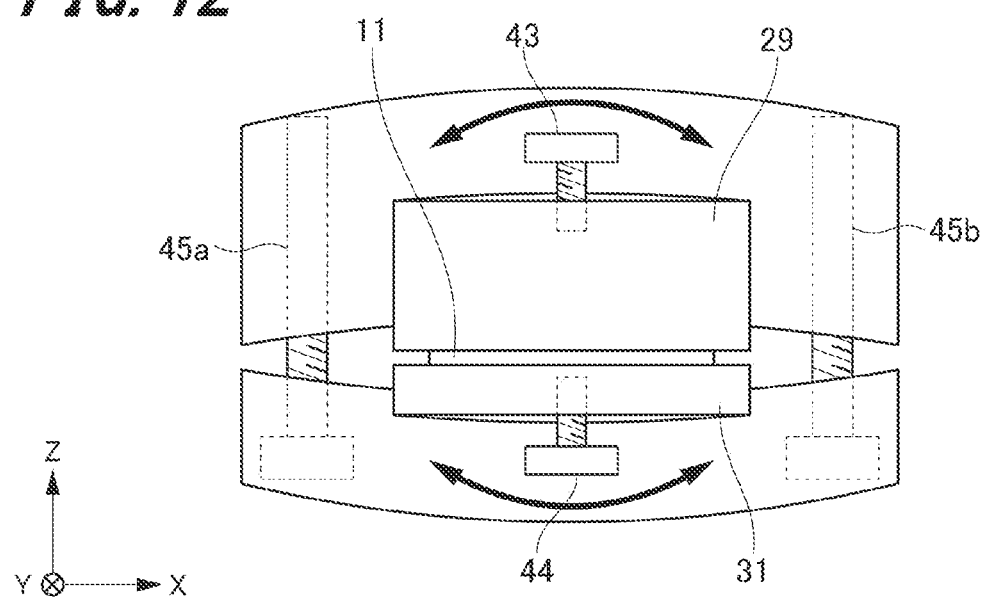
FIG. 12 is a schematic front elevation of the ion milling apparatus of FIG. 9, illustrating its advantageous effects.

FIG. 11 is a front elevation showing main portions of an ion milling apparatus to be compared with the second embodiment of the present invention. In the comparative example shown in FIG. 11, a shield member 29 and a sample locking member 31 are tightened together with a pair of screws 47a, 47b. A sample 11 is disposed between the shield member 29 and the sample locking member 31. The sample 11 is secured by tightening forces of the pair of screws 47a, 47b.

In this way, if the shield member 29 and the sample locking member 31 are directly tightened by the pair of screws 47a, 47b, the shield member 29 and the sample locking member 31 are distorted by the tightening forces. Therefore, when the sample holder 27 is viewed from the front, the tightening forces applied to the opposite ends of the sample 11 increase but the tightening forces applied to a central portion of the sample 11 decrease. That is, the tightening forces impressed on the sample 11 become more nonuniform. This impairs the intimateness of contact between the sample 11 and the shield member 29 and between the sample 11 and the sample locking member 31.

On the other hand, when the shield member 29 and the sample locking member 31 are tightened via the pair of clamp members 41 and 42, if the clamp members 41 and 42 undergo tightening forces from the screws 45a and 45b and are curved, the shield member 29 and the sample locking member 31 are hardly curved for the following reason. Although the shield member 29 and the clamp member 41 are secured with the screw 43, these members 29 and 41 are structurally separate members. If the clamp member 41 is curved, the original shape of the shield member 29 is retained. Similarly, the sample locking member 31 and the clamp member 42 are secured with the screw 44 but these members 31 and 42 are structurally separate members. If the clamp member 42 is curved, the original shape of the sample locking member 31 is maintained. Therefore, if the sample holder 27 is viewed from the front, the tightening forces arising from the pair of screws 45a and 45b are uniformly applied to the whole sample 11. Consequently, the intimateness of contact between the sample 11 and the shield member 29 and between the sample 11 and the sample locking member 31 is improved. Furthermore, if one or both of the shield member 29 and the sample locking member 31 are worn away, it is easy to replace the shield member 29 and the sample locking members 31 which are consumables.

Third Embodiment

Figure 13:
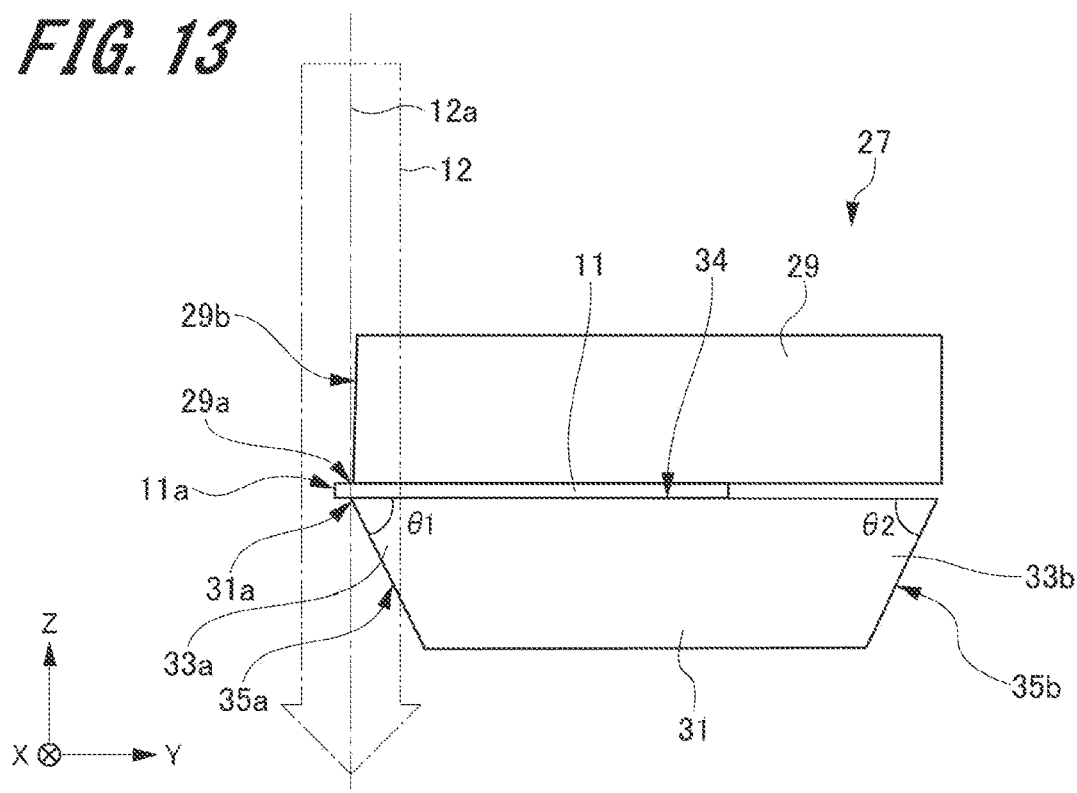
FIG. 13 is a schematic side elevation showing main portions of an ion milling apparatus associated with a third embodiment of the present invention.

FIG. 13 is a schematic side elevation showing main portions of an ion milling apparatus associated with a third embodiment of the present invention. As shown in FIG. 13, the sample locking member 31 has support portions 33a, 33b on its opposite ends in the Y direction. The support portion 33a lies at the front end of the sample locking member 31 and is formed by the first surface 34 and a second surface 35a. The support portion 33b lies at the rear end of the sample locking member 31 and is formed by the first surface 34 and a second surface 35b. The second surface 35a tilts at a given angle $\theta 1$ relative to the first surface 34. The second surface 35b makes a second given angle of $\theta 2$ to the first surface 34. The given angle $\theta 1$ is less than 90° and greater than 0°. Preferably, the given angle $\theta 1$ is an acute angle, more preferably less than 60°, still more preferably less than 55°, yet more preferably less than 45°. These principles also apply to the second given angle $\theta 2$. In the present embodiment, an equality, $\theta 1 = \theta 2$, is established. Alternatively, an inequality, $\theta 1 \neq \theta 2$, may be established.

By forming the support portion 33a at the front end of the sample locking member 31 and the support portion 33b at the rear end in this way, the following effects arise. When the ion beam 12 is directed at the sample 11 as shown in FIG. 13, the ion beam 12 also hits the front end portion of the sample locking member 31. Therefore, the sample locking member 31 is gradually abraded from its front end 31a and worn off. As the sample locking member 31 is worn off more, sharpening of the support portion 33 results in less effects. Accordingly, when the amount of abrasion of the sample locking member 31 reaches a given amount, the front end and rear end of the sample locking member 31 are exchanged in position. Consequently, the sample locking member 31 can be used a greater number of times while maintaining the effect of the acute angle of the support portion 33 than where the support portion 33 is formed on only the front end of the sample locking member 31 as shown in FIG. 2.

In the above third embodiment, the support portions 33a and 33b are formed at two locations, i.e., front and rear ends, of the sample locking member 31. The present invention is not limited to this example. For example, if the sample locking member 31 is in the form of a flat plate that is square within a plane, the support portion 33 may be formed on three or all of the four sides. This principle also applies to the case where the sample locking member 31 is a polygon having five or more sides within a plane.

Fourth Embodiment

Figure 14:
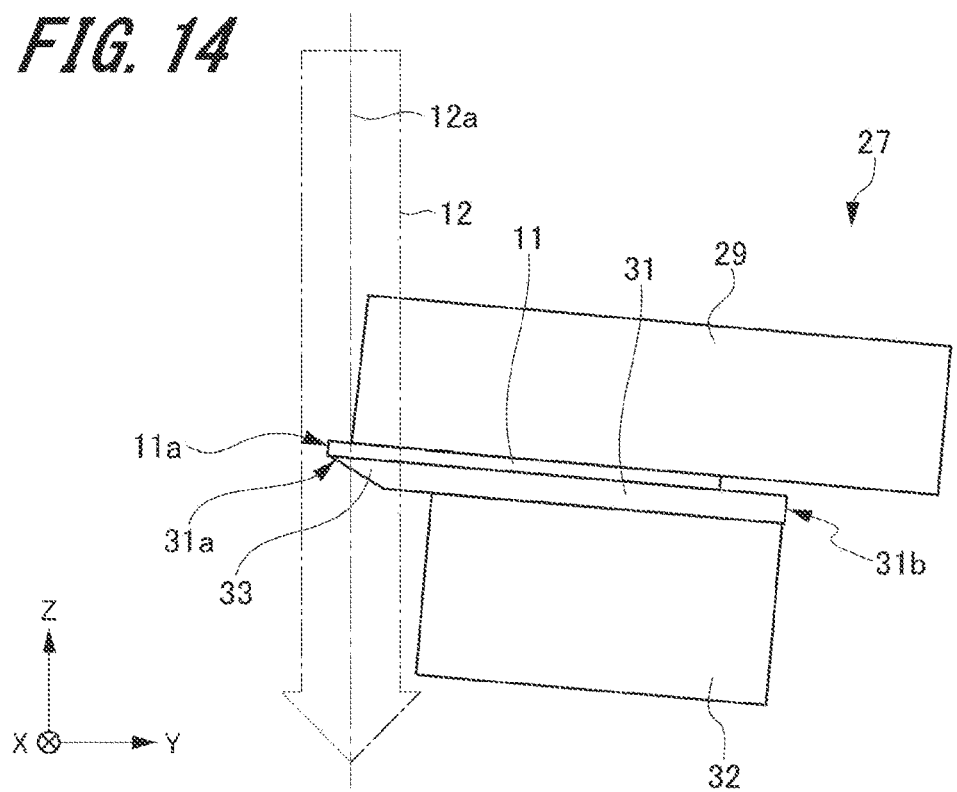
FIG. 14 is a schematic side elevation showing main portions of an ion milling apparatus associated with a fourth embodiment of the present invention.

FIG. 14 is a schematic side elevation showing main portions of an ion milling apparatus associated with a fourth embodiment of the present invention. As shown in FIG. 14, the sample holder 27 is mounted to be tiltable in the Z direction (up/down direction) relative to the X-Y plane parallel to a horizontal plane. On the other hand, the center axis 12a of the ion beam 12 is vertical to the X-Y plane, i.e., parallel to the Z direction. As one configuration of the ion milling apparatus, the tilt angle of the sample holder 27 may be constant or variable. A rotational mechanism set forth, for example, in Japanese Patent Application No. 2018-190628, can be used to tilt the sample holder 27 through an adjustable angle.

If the sample holder 27 is tilted as described above, the shield member 29, sample locking member 31, and sample support stage 32 tilt together with the sample 11. At this time, the front end 31a of the sample locking member 31 is placed higher than its rear end 31b because of the tilt of the sample holder 27. Similarly, the front end surface 11a of the sample 11 is placed higher than the rear end surface. That is, the sample holder 27 is mounted so as to be tiltable such that the front end 31a of the sample locking member 31 is placed higher than the rear end 31b by the rotational mechanism.

Under this arrangement, if the sample 11 is irradiated with the ion beam 12, a cross section through the sample 11 is formed. This cross section is more closely vertical to the top surface of the sample 11 for the following reason.

Figure 15:
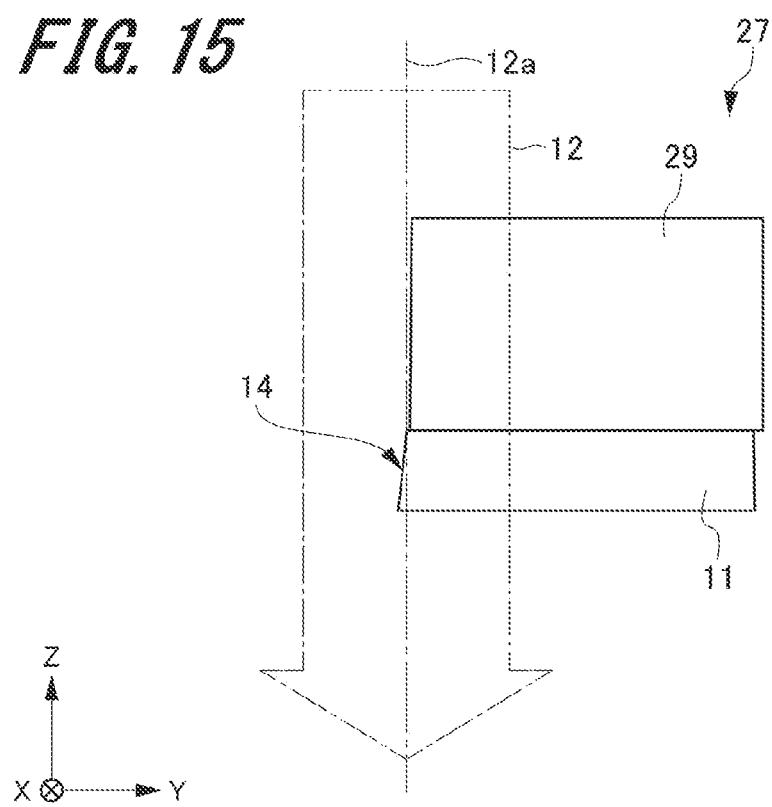
FIG. 15 is a schematic side elevation illustrating the manner in which a cross section of a sample tilts in response to ion beam irradiation.

First, where the sample 11 is irradiated with the ion beam 12, the current density of the ion beam 12 determining the milling rate decreases with the distance from the ion source. That is, as the distance from the ion source increases, the milling rate drops. The distance from the ion source increases in going away from the shield member 29 in the thicknesswise direction of the sample 11, i.e., in going downward. Therefore, in comparing the milling rate for the upper surface of the sample 11 closer to the shield member 29 with the milling rate for the lower surface of the sample 11 remoter from the shield member 29, the milling rate for the lower surface of the sample 11 is lower than that for the upper surface. Accordingly, if the sample 11 is irradiated with the ion beam 12 without tilting the sample holder 27, the cross section 14 through the sample 11 is mildly tilted (protruded) from the top surface of the sample 11 toward the bottom surface as shown in FIG. 15.

On the other hand, if the sample 11 is irradiated with the ion beam 12 while tilting the sample holder 27 as described above, the cross section through the sample 11 tilts relative to the central axis 12a of the ion beam 12 in the same manner as in the foregoing, but the sample 11 being milled tilts in such a direction as to cancel out the tilt of the cross section. As a result, the cross section through the sample 11 is more closely vertical to the top surface of the sample 11. Consequently, if the sample holder 27 is tilted, a cross section adapted for observation or analysis of the sample 11 is obtained.

Figure 16:
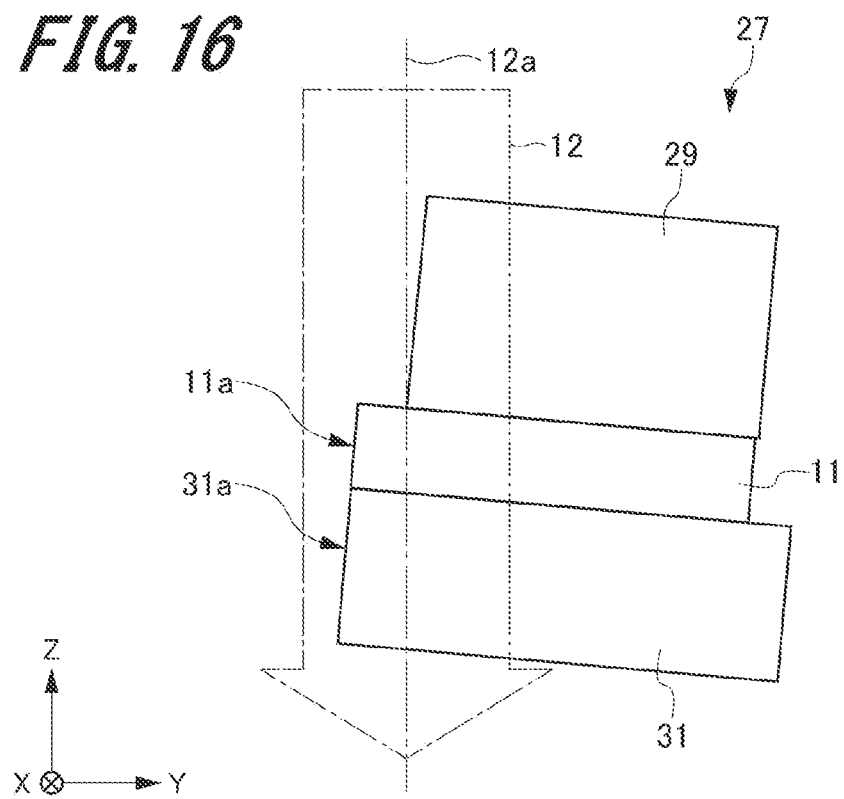
FIG. 16 is a schematic side elevation showing one example of the arrangement of a sample locking member and a sample in a case where the sample locking member has a right-angled front end portion.
Figure 17:
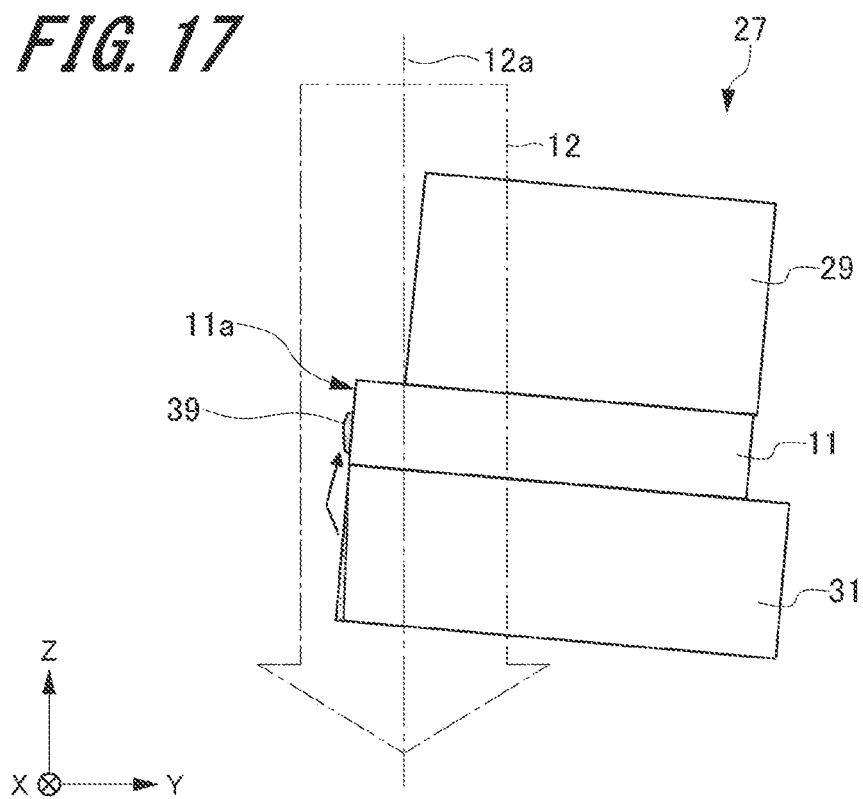
FIGS. 17 and 18 illustrate different manners in which a sample is milled by ion beam irradiation under the arrangement of FIG. 16.
Figure 18:
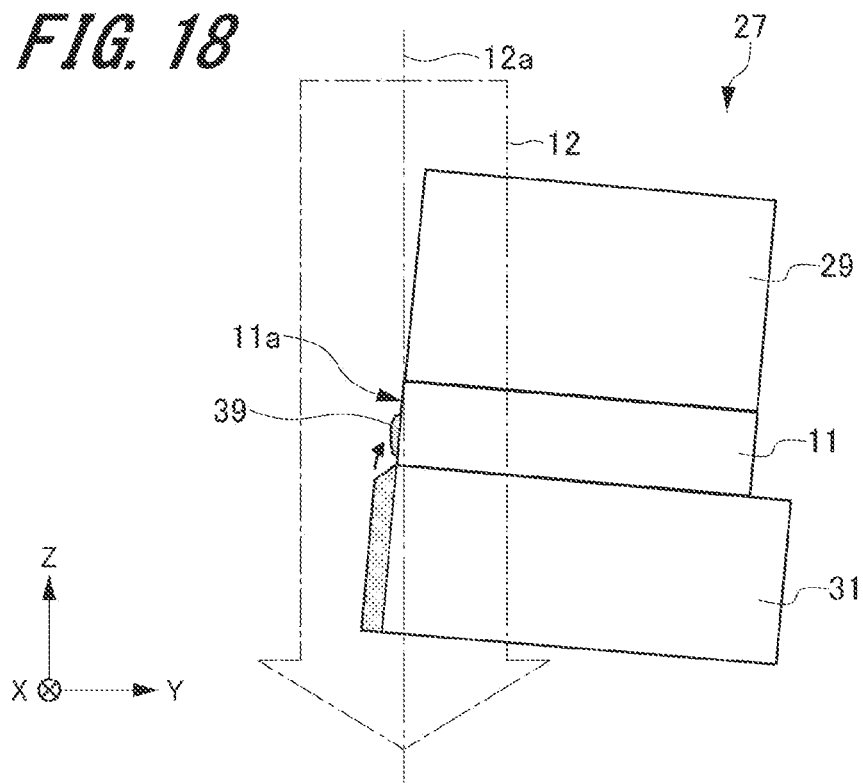

On the other hand, where the front end of the sample locking member 31 is formed into a right angle rather than an acute angle, for example, as shown in FIG. 16, when the sample holder 27 is tilted while positionally aligning the front end 31a of the sample locking member 31 and the front end surface 11a of the sample 11, the front end 31a of the sample locking member 31 protrudes from the front end surface 11a of the sample 11. Therefore, when the sample 11 is irradiated with the ion beam 12 as shown in FIG. 17, the ion beam 12 tends to easily hit the sample locking member 31. As a result, the irradiation by the ion beam 12 sputters off the material 39 from the sample locking member 31, and the sputtered material 39 adheres to the front end surface 11a of the sample 11. The material 39 adhering to the front end surface 11a of the sample 11 is removed to some extent by the irradiation of the sample 11 with the ion beam 12. However, the milling of the sample 11 using the irradiation by the ion beam 12 is carried out while the front end 31a of the sample locking member 31 protrudes from the front end surface 11a of the sample 11. Therefore, the front end 31a of the sample locking member 31 continues to be etched by the irradiation with the ion beam 12 until the sample 11 is milled down to just under the edge portion 29a of the shield member 29, i.e., until the milling of the sample 11 is completed. Consequently, if the milling of the sample 11 is completed, the sputtered material 39 remains adhering to the front end surface 11a of the sample 11 as shown in FIG. 18.

Figure 19:
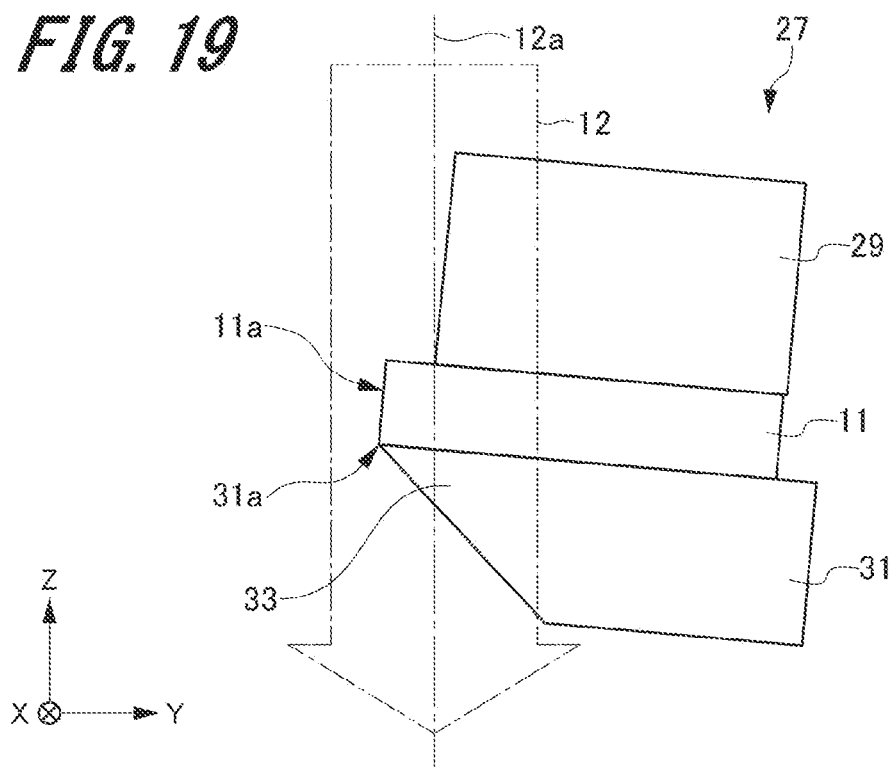
FIG. 19 is a schematic side elevation showing one example of the arrangement of the sample locking member and the sample in a case where the sample locking member has an acute-angled front end portion.
Figure 20:
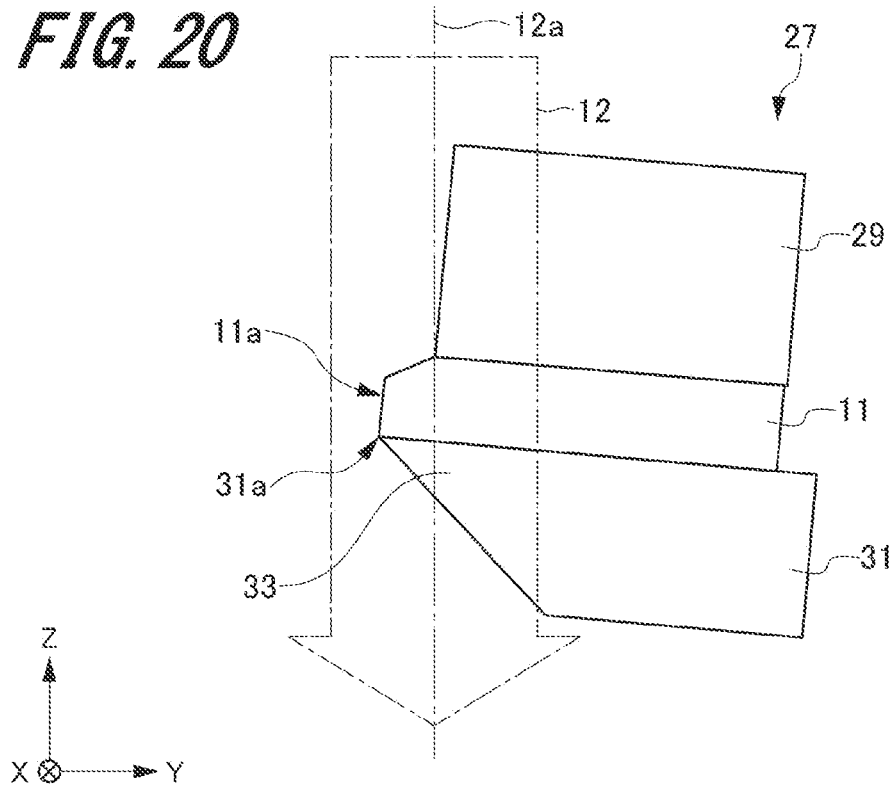
FIGS. 20-23 illustrate different manners in which a sample is milled by ion beam irradiation under the arrangement shown in FIG. 19.
Figure 21:
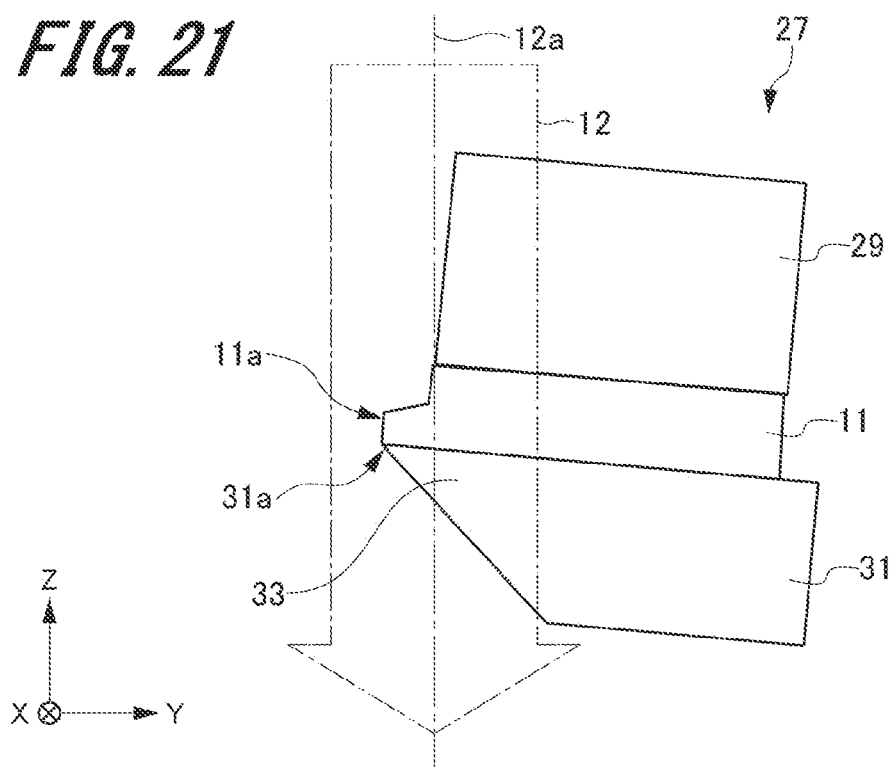
Figure 22:
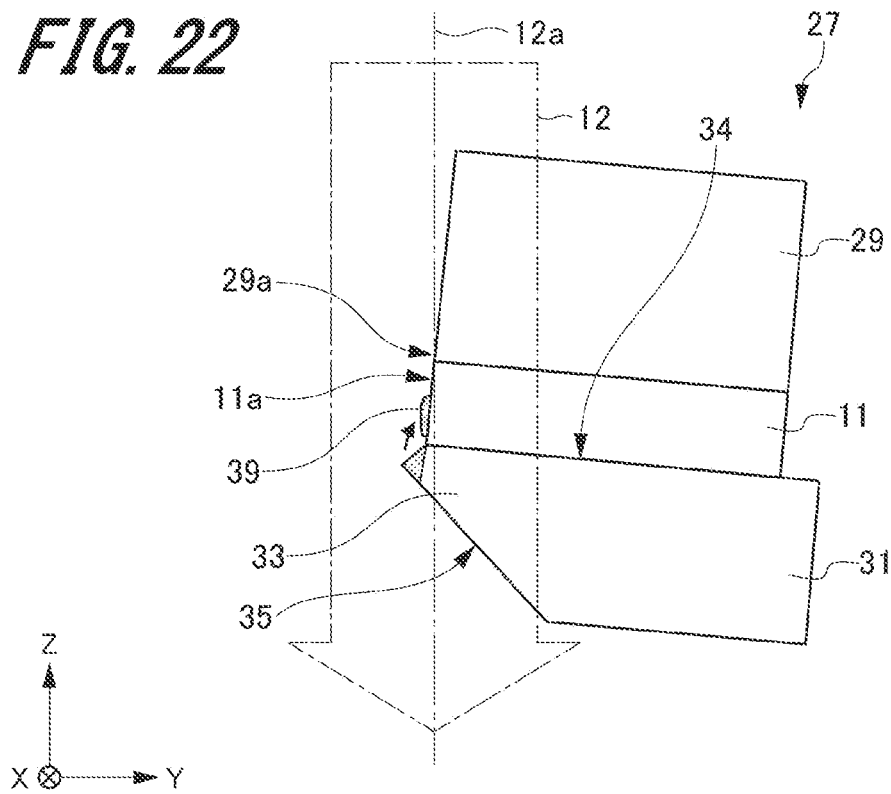
Figure 23:
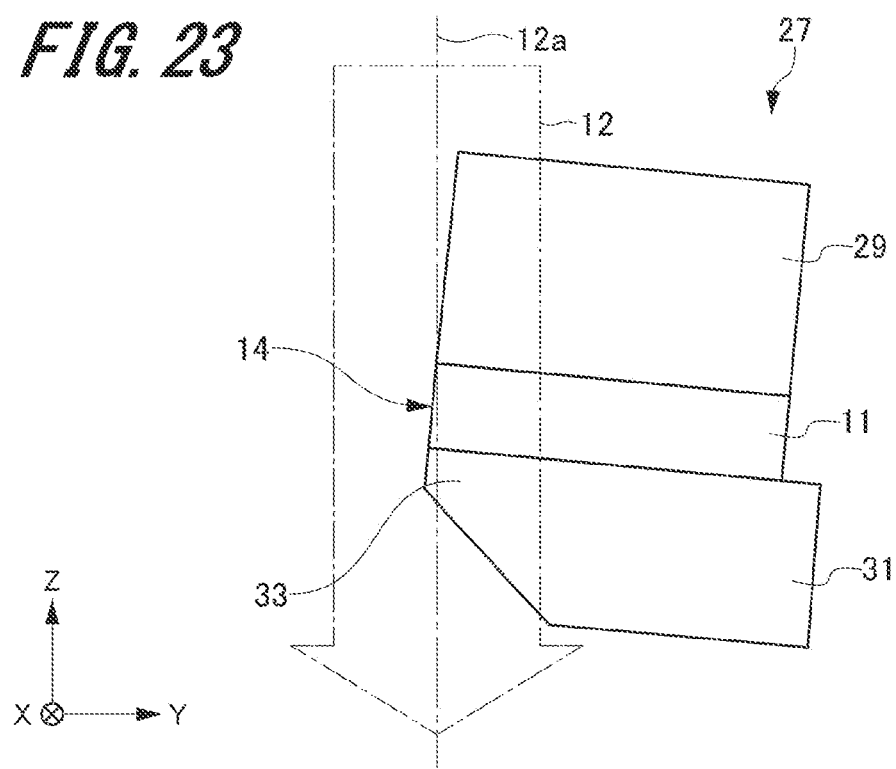

On the other hand, where the front end (support portion 33) of the sample locking member 31 is shaped into an acute angle as shown in FIG. 19, the front end 31a of the sample locking member 31 does not protrude from the front end surface 11a of the sample 11 when the sample holder 27 is tilted while positionally aligning the front end 31a of the sample locking member 31 and the front end surface 11a of the sample 11. Therefore, as shown in FIGS. 20 and 21, if the milling of the sample 11 progresses, the front end 31a of the sample locking member 31 is hardly etched. However, as shown in FIG. 22, when the sample 11 is milled down to almost just under the edge portion 29a of the shield member 29, the front end 31a of the sample locking member 31 is etched by the ion beam 12. Thus, the material 39 sputtered off from the front end 31a of the sample locking member 31 by the etching adheres to the front end surface 11a of the sample 11. At this time, if the angle between the first surface 34 and the second surface 35 forms an acute angle, the front end 31a of the sample locking member 31 immediately disappears because of the etching. Also, the material 39 sputtered off from the front end 31a of the sample locking member 31 and adhering to the front end surface 11a of the sample 11 is immediately etched away. Consequently, as shown in FIG. 23, on the cross section 14 through the sample 11 obtained by the milling, only a quite small amount of the material 39 remains. Furthermore, this cross section is morely closely vertical to the top surface of the sample 11. In this way, the cross section adapted for observation or analysis of the sample 11 can be obtained.

Fifth Embodiment

Figure 24:
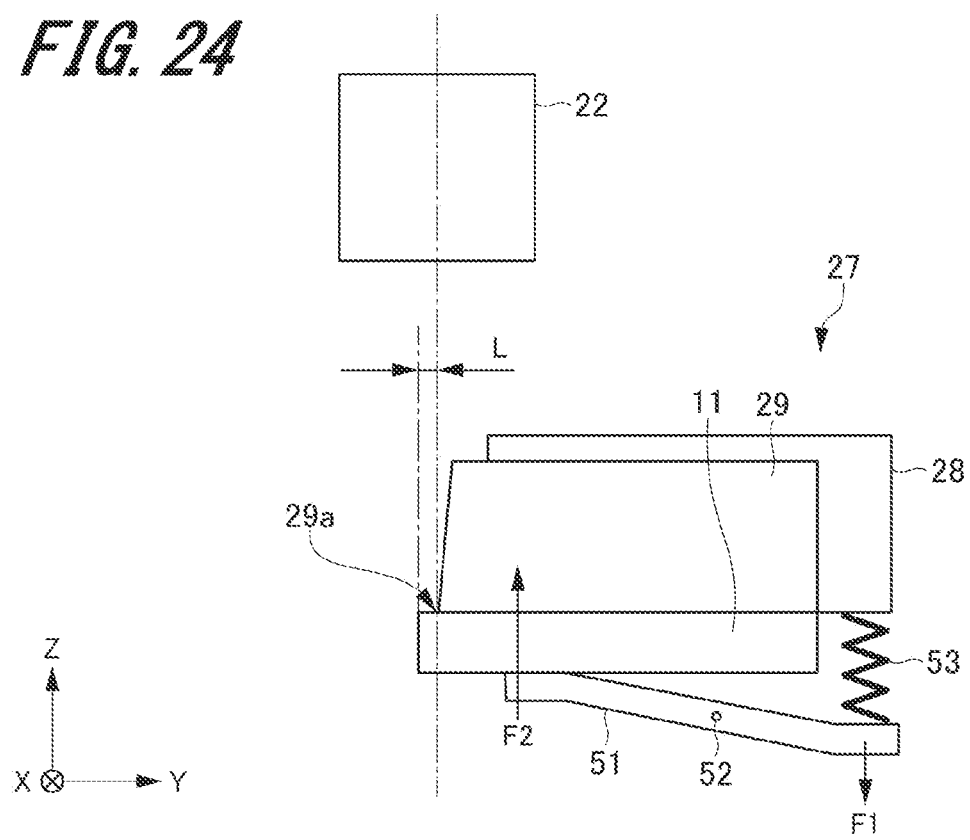
FIG. 24 is a schematic side elevation of an example in which the amount of protrusion of a sample is set using a camera.

Generally, when the sample 11 is set on the sample holder 27, the operator of the ion milling apparatus places the camera 22 above the shield member 29 as shown in FIG. 24 and captures images of both sample 11 and shield member 29 with the camera 22. Furthermore, the operator sets the amount of protrusion L of the sample 11 from the edge portion 29a to a desired dimension by fine adjusting the position of the sample 11 in the Y direction while watching the image displayed on the display portion 26, the image being captured by the camera 22.

In FIG. 24, the sample 11 is secured using a clip 51 which is supported so as to be swingable about a pivot 52. The clip 51 is biased in one direction by a force F1 of a spring 53. One end of the spring 53 is connected to the clip 51, while the other end of the spring 53 is connected to the holder body 28. The holder body 28 supports and maintains the shield member 29 in locked state. The clip 51 applies a pushing force F2 to the sample 11 such that the sample 11 is secured to the shield member 29. The pushing force F2 is produced by biasing the clip 51 in one direction by the force F1 of the spring 53.

As described previously, the operator of the ion milling apparatus needs to set the amount of protrusion L of the sample 11 by fine adjusting the position of the sample 11 while checking the image captured by the camera 22. This setting operation requires complex manipulations. Where the sample 11 is set within a globe box shielded from the atmosphere to avoid chemical reactions of the sample 11 in air, it is very difficult to perform the work itself for setting the amount of protrusion. Accordingly, a main object of a fifth and subsequent embodiments of the present invention is to enable the amount of protrusion of the sample to be set with simple manipulations.

Figure 25:
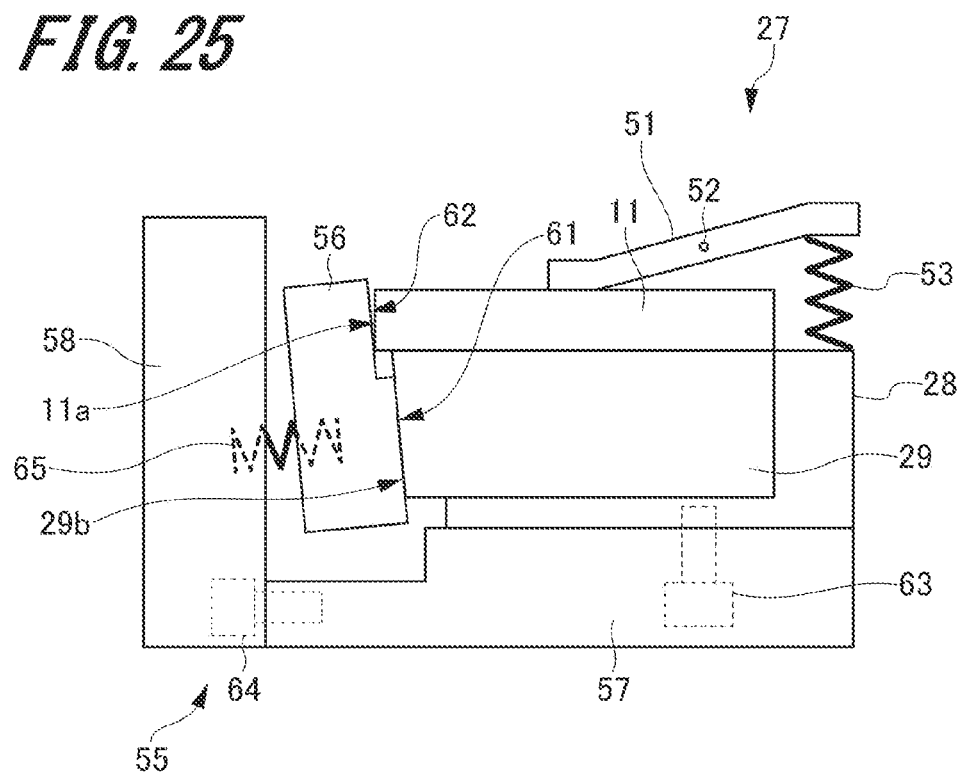
FIG. 25 is a schematic side elevation of a sample positioning jig associated with a fifth embodiment of the invention, illustrating the configuration of the jig.

FIG. 25 is a schematic side elevation showing the configuration of a sample positioning jig associated with the fifth embodiment of the present invention. The sample positioning jig is used to place the sample 11 in position, the sample 11 being an object to be milled by the ion milling apparatus 10. More specifically, the sample positioning jig is adapted for use when the sample 11 is set on the sample holder 27.

Figure 26:
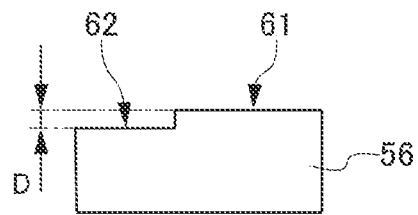
FIG. 26 is a schematic side elevation of a protrusion amount setting member equipped in the sample positioning jig of FIG. 25, illustrating the configuration of the setting member.

As shown in FIG. 25, the sample positioning jig, 55, has a protrusion amount setting member 56, a first tool 57, and a second tool 58. The protrusion amount setting member 56 is in square, block form. The shape of the protrusion amount setting member 56 can be varied according to the need. The setting member 56 is made of a metal material, for example. As shown in FIG. 26, the setting member 56 has a first contact portion 61 and a second contact portion 62. When the amount of protrusion of the sample 11 is set using the protrusion amount setting member 56, the first contact portion 61 makes contact with the front end surface 29b of the shield member 29. The second contact portion 62 makes contact with the front end surface 11a of the sample 11. The second contact portion 62 is recessed relative to the first contact portion 61. In other words, a step D (see FIG. 26) is created between the first contact portion 61 and the second contact portion 62 and has a convex portion and a recessed portion which are formed by the first contact portion 61 and the second contact portion 62, respectively.

Figure 27:
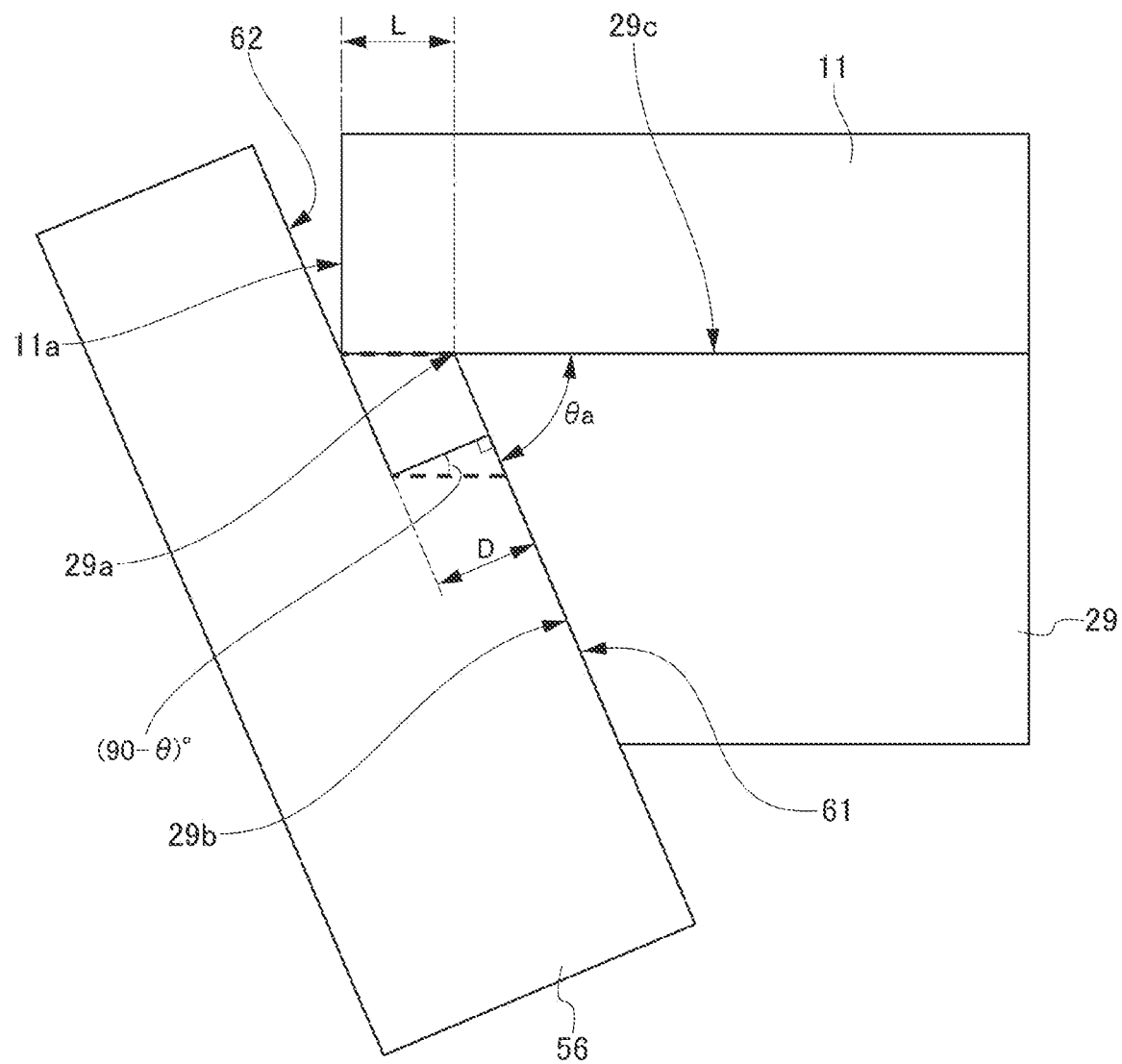
FIG. 27 illustrates an example in which a step between a first contact portion and a second contact portion is set.

The step D is set according to the amount of protrusion of the sample 11 desired by the operator. FIG. 27 shows an example of setting the step D between the first contact portion 61 and the second contact portion 62. The step D (in μm) between the first contact portion 61 and the second contact portion 62 is set according to the following Eq. (1) using the amount of protrusion L (in μm) of the sample 11.

$$D = L \times \cos(90 - \theta a)° \quad (1)$$

where θa is the tilt angle of the front end surface 29b of the shield member 29 and made between the front end surface 29b and the shield surface 29c. As an example, it is assumed that θa=85°. In this case, if the desired amount of protrusion L of the sample 11 is 100 μm, then Eq. (1) results in D≅99.6 μm.

Accordingly, where it is desired to set the amount of protrusion L of the sample 11 to 100 μm, the step D between the first contact portion 61 and the second contact portion 62 is set to 99.6 μm. The protrusion amount setting member 56 may be fabricated according to this setting.

Referring back to FIG. 25, the holder body 28 is secured to the first tool 57 with a screw 63. The second tool 58 is secured to the first tool 57 with a screw 64. The first tool 57 and the holder body 28 can be mounted to and detached from each other by attaching and detaching the screw 63. The first tool 57 and the second tool 58 are mounted to and detached from each other by attaching and detaching the screw 64.

The protrusion amount setting member 56 is mounted to the second tool 58. A spring 65 is interposed between the protrusion amount setting member 56 and the second tool 58. The spring 65 is a biasing member for biasing the protrusion amount setting member 56 in such a way that the first contact portion 61 is pressed against the front end surface 29b of the shield member 29. The spring 65 is made of a coil spring, for example. However, no restriction is imposed on the type of the spring. Instead of the spring 65, the biasing member may be made of a rubber-like resilient body (not shown).

Figure 28:
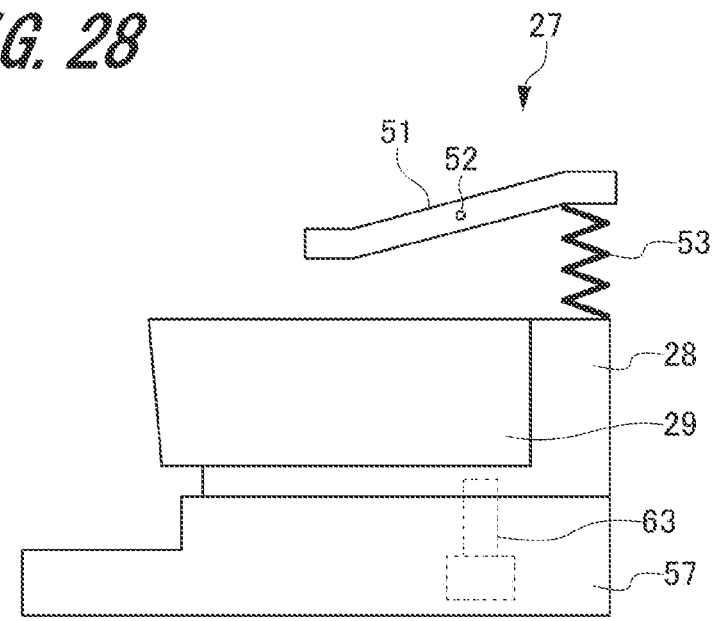
FIGS. 28 and 29 illustrate a procedure taken where a sample is set on a sample holder using the sample positioning jig of FIG. 25.

A procedure for setting the sample 11 on the sample holder 27 using the sample positioning jig 55 of the above-described configuration is next described. First, as shown in FIG. 28, the operator holds together the first tool 57 and the holder body 28 supporting the shield member 29 with the screw 63. Consequently, the first tool 57 is held to the holder body 28.

Figure 29:
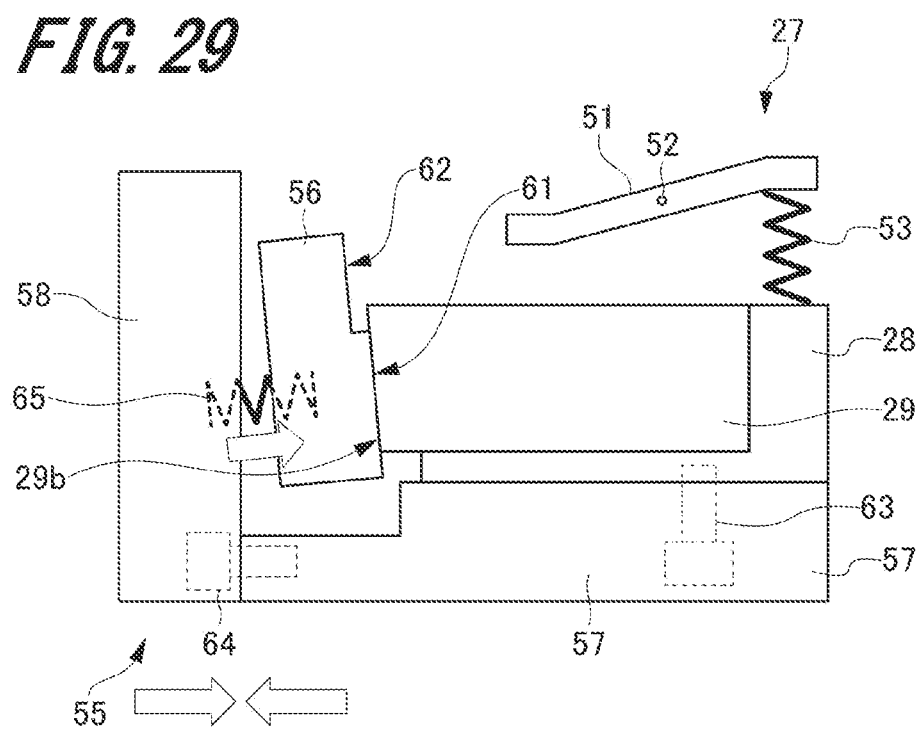

Then, the operator holds together the first tool 57 and the second tool 58 with the screw 64 as shown in FIG. 29. Consequently, the second tool 58 is mounted to the first tool 57. The protrusion amount setting member 56 has been already mounted to the second tool 58. Where the second tool 58 is mounted to the first tool 57, the first contact portion 61 of the protrusion amount setting member 56 is brought into contact with the front end surface 29b of the shield member 29. At this time, the first contact portion 61 is pressed against the front end surface 29b of the shield member 29 by the biasing force of the spring 65.

Then, as shown in FIG. 25, the operator places the sample 11 on the shield member 29 and pushes the front end surface 11a of the sample 11 against the second contact portion 62 of the protrusion amount setting member 56. As given in (a)-(d) below, various methods are conceivable as the method of pressing the front end surface 11a of the sample 11 against the second contact portion 62.

(a) The rear end of the sample 11 is pushed with a tool or the like.

(b) The rear end of the sample 11 is pushed utilizing a spring force.

(c) The rear end of the sample 11 is pushed in with a screw.

(d) The whole sample positioning jig 55 is tilted and the sample 11 is slid down by gravity.

Whatever method is adopted, the spring 65 should have a large spring constant to prevent the position of the protrusion amount setting member 56 from moving if pushed by the sample 11. Consequently, as shown in the above-referenced FIG. 27, the amount of protrusion L of the sample 11 is set to a desired dimension according to the step D between the first contact portion 61 and the second contact portion 62. Also, the amount of protrusion L of the sample 11 is set based on the edge portion 29a of the shield member 29.

Then, the operator secures the sample 11 to the shield member 29 with the clip 51. The operator then takes out the second tool 58 from the first tool 57 and removes the first tool 57 from the holder body 28. Consequently, the operation for setting the sample 11 on the sample holder 27 is completed. The operator then mounts the sample holder 27 to the sample stage 18. Subsequently, the sample 11 is milled by the same procedure as in the first embodiment.

Where the sample 11 set on the sample holder 27 is an electrically charged battery material, when the front end surface 11a of the sample 11 is brought into contact with the second contact portion 62 of the protrusion amount setting member 56, there is a danger that electrical short circuiting will occur. Therefore, where the sample 11 is made of a battery material and treated, it is desired that the protrusion amount setting member 56 be made of an insulating material to prevent electrical short circuiting. For this purpose, it is not always necessary that the whole of the protrusion amount setting member 56 be made of an insulating material. For example, only the second contact portion 62 may be made of an insulating material. Alternatively, the surface of the second contact portion 62 with which the front end surface 11a of the sample 11 makes contact may be coated with an insulating film. The configuration for electrical insulation between the sample 11 and the protrusion amount setting member 56 can also be applied to embodiments other than the fifth embodiment. In addition, the method of placing the sample in position using the protrusion amount setting member can also be applied to the foregoing first embodiment (see FIG. 3) to fourth embodiment.

Specific examples of the sample positioning jig associated with the fifth embodiment of the present invention are described below. The effects of the sample positioning jig associated with the fifth embodiment of the present invention will be described after the description of the specific examples.

First Specific Example

Figure 30:
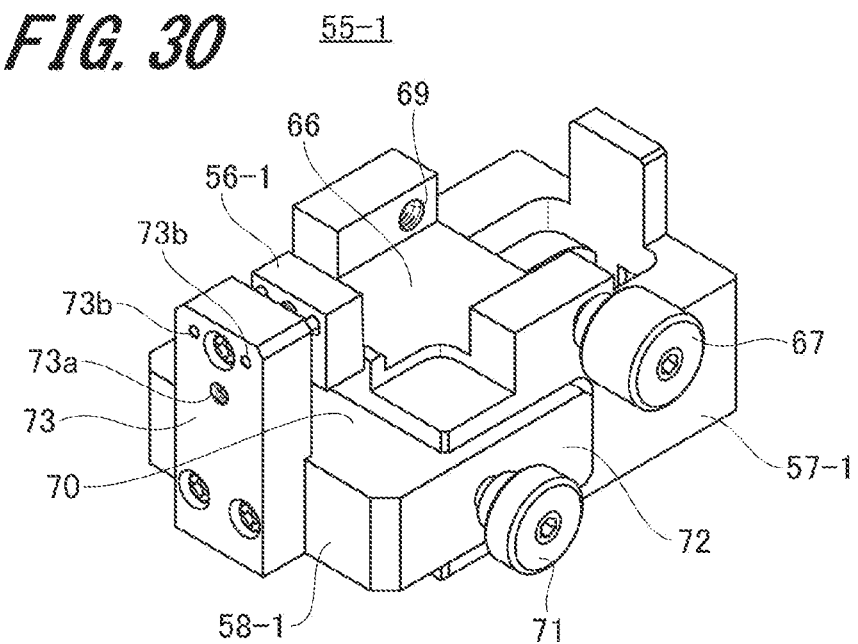
FIG. 30 is a perspective view of a first specific example of the sample positioning jig of FIG. 25.

FIG. 30 is a perspective view showing a first specific example of the sample positioning jig associated with the fifth embodiment of the present invention. As shown in FIG. 30, the sample positioning jig, 55-1, has a protrusion amount setting member 56-1, a first tool 57-1, and a second tool 58-1.

Figure 31:
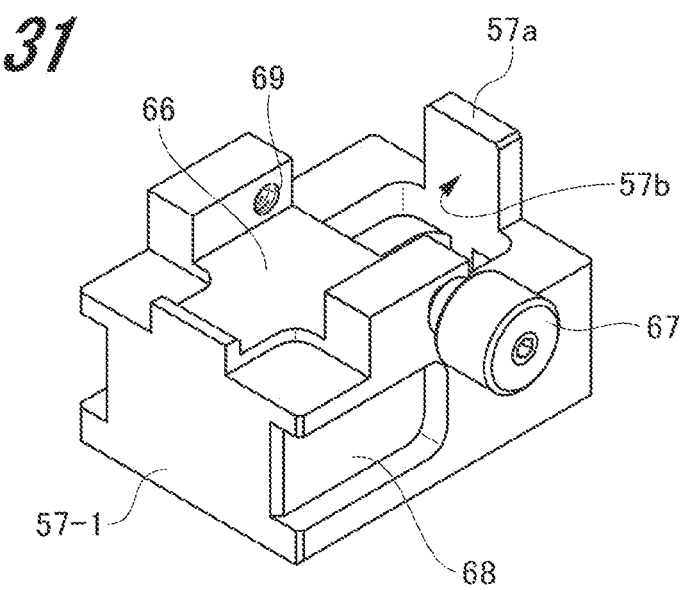
FIG. 31 is a perspective view of a first tool equipped in the sample positioning jig of FIG. 30, illustrating the configuration of the tool.
Figure 32:
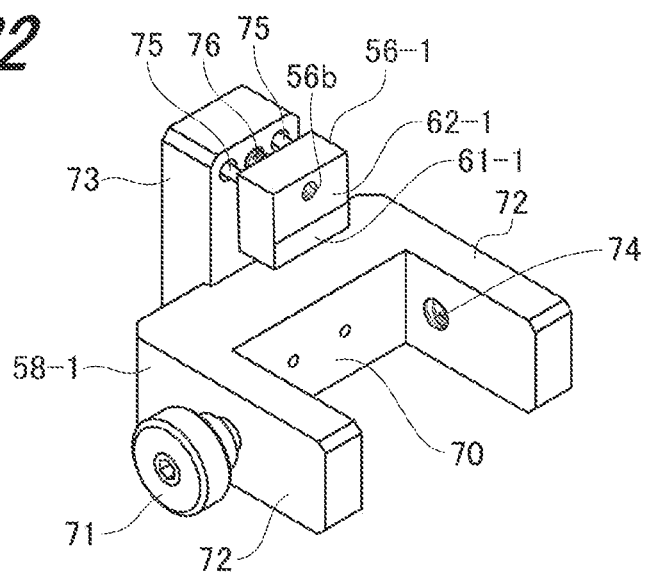
FIG. 32 is a perspective view of the protrusion amount setting member and a second tool equipped in the sample positioning jig of FIG. 30, illustrating the configurations of the setting member and second tool.

FIG. 31 is a perspective view showing the configuration of the first tool 57-1 of the sample positioning jig 55-1 shown in FIG. 30. FIG. 32 is a perspective view showing the configurations of the protrusion amount setting member 56-1 and the second tool 58-1 equipped in the sample positioning jig 55-1 shown in FIG. 30.

As shown in FIG. 31, the first tool 57-1 has a holder receiving portion 66, a holding knob 67, and a pair of guide grooves 68. When the sample holder (not shown) is placed on the first tool 57-1, the holder receiving portion 66 receives the sample holder.

The holding knob 67 is used to hold the sample holder placed on the holder receiving portion 66. The holding knob 67 has a pair of externally threaded portions (not shown). A pair of internally threaded portions 69 matching the externally threaded portions is formed in the first tool 57-1. The internally threaded portions 69 of one pair are formed to the left and right of the front of the first tool 57-1. The externally threaded portion of the holding knob 67 engages one of the internally threaded portions (not shown). Where the internally threaded portions 69 are formed on both sides, the holding knob 67 can be mounted to the side allowing for easy manipulation and the sample positioning jig 55-1 can be used, irrespective of whether the operator is right-handed or left-handed.

When the second tool 58-1 is mounted to the first tool 57-1, the guide grooves 68 guide the first tool 57-1 to its mounting position. The guide grooves 68 of one pair are formed to the left and right of the front of the first tool 57-1.

As shown in FIG. 32, the second tool 58-1 has an abutting portion 70, a holding knob 71, a pair of arm portions 72, and a mounting block 73. When the second tool 58-1 is mounted to the first tool 57-1, the abutting portion 70 is brought into abutting engagement with the first tool 57-1. The holding knob 71 is used to hold the second tool 58-1 to the first tool 57-1. The holding knob 71 has a pair of externally threaded portions (not shown). A pair of internally threaded portions 74 matching the externally threaded portions is formed in the second tool 58-1. The internally threaded portions 74 are formed to the left and right of the front of the second tool 58-1. The externally threaded portion of the holding knob 71 engages one (not shown) of the internally threaded portions 74. Where the internally threaded portions 74 are formed on both sides, the holding knob 71 can be mounted to the side allowing for easy manipulation and the sample positioning jig 55-1 can be used, irrespective of whether the operator is right-handed or left-handed.

When the second tool 58-1 is mounted to the first tool 57-1, the arm portions 72 are inserted into the guide grooves 68 of the first tool 57-1. The arm portions 72 are formed to the left and right of the front of the second tool 58-1. The mounting block 73 is used to mount the protrusion amount setting member 56-1, and is screwed to the abutting portion 70.

In the first specific example, the abutting portion 70 and the arm portions 72 are formed integrally, and the mounting block 73 is screwed to the abutting portion 70. The present invention is not restricted to the use of this structure. For example, the abutting portion 70, arm portions 72, and mounting block 73 may be formed integrally.

Figure 33:
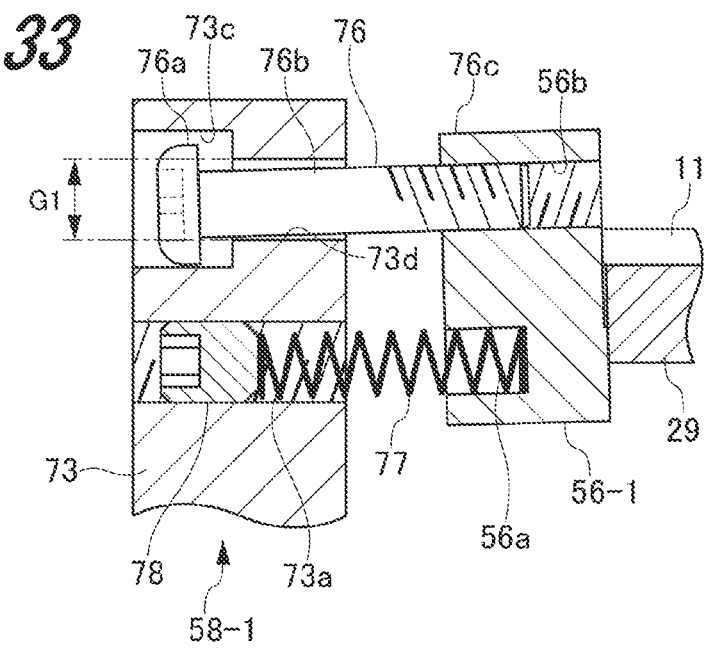
FIG. 33 is a cross-sectional view of a mounting structure for mounting the protrusion amount setting member to the second tool in the first specific example.
Figure 34:
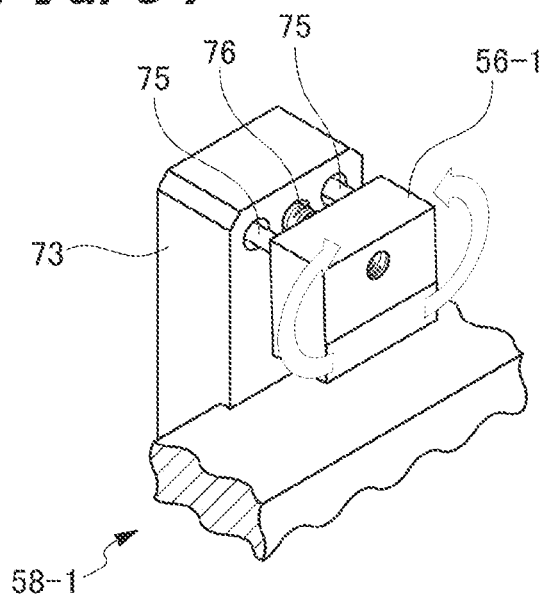
FIG. 34 is a perspective view of the mounting structure of FIG. 33.

FIG. 33 is a cross-sectional view showing a structure for mounting the protrusion amount setting member 56-1 to the second tool 58-1. FIG. 34 is a perspective view of this mounting structure. As shown in FIGS. 33 and 34, the protrusion amount setting member 56-1 is mounted to the mounting block 73 of the second tool 58-1 using a pair of guide pins 75, a retaining screw 76, and a spring 77. The spring 77 is equivalent to a biasing member in the same manner as the aforementioned spring 65 (see FIG. 25). One end of the spring 77 is inserted in a pocket portion 56a formed in the protrusion amount setting member 56-1, whereas the other end of the spring 77 is inserted in a threaded hole 73a formed in the mounting block 73. A set screw 78 having a hexagonal hole is inserted in the threaded hole 73a and movable in the direction of the center axis of the threaded hole 73a. The set screw 78 can adjust the biasing force of the protrusion amount setting member 56-1 using the spring 77 by varying the end position of the spring 77 in the direction of the center axis of the threaded hole 73a.

The pair of guide pins 75 suppresses positional deviation of the protrusion amount setting member 56-1 in the direction of rotation indicated by the arrows in FIG. 34. The guide pins 75 are disposed parallel to each other. The guide pins 75 guide the protrusion amount setting member 56-1 such that it can move toward and away from the mounting block 73. One end of each guide pin 75 is inserted in a respective one of first pin insertion holes (not shown) formed in the protrusion amount setting member 56-1. The other end of each guide pin 75 is inserted in a respective one of second pin insertion holes 73b (see FIG. 30) formed in the mounting block 73.

The retaining screw 76 defines a maximum allowable distance of the protrusion amount setting member 56-1 from the mounting block 73 to prevent one end of the spring 77 from coming out of its respective pocket portion 56a and prevent one end of each guide pin 75 from coming out of its respective first pin insertion hole. The retaining screw 76 has a head 76a, a shank 76b, and an externally threaded portion 76c which are formed internally. The mounting block 73 has a stepped hole consisting of a larger hole 73c and a smaller hole 73d. The head 76a of the retaining screw 76 is received in the larger hole 73c. The shank 76b of the retaining screw 76 is inserted in the smaller hole 73d. The larger hole 73c has a diameter set greater than that of the head 76a. The smaller hole 73d has a diameter set greater than that of the shank 76b. A clearance G1 corresponding to the dimensional difference between the smaller hole 73d and the shank 76b is present between the smaller hole 73d and the shank 76b. Because of the presence of the clearance G1, the mounting block 73 can appropriately absorb wobbling motion of the retaining screw 76. On the other hand, the protrusion amount setting member 56-1 is provided with an internally threaded portion 56b. The externally threaded portion 76c of the retaining screw 76 engages the internally threaded portion 56b. With respect to the structure of the retaining screw 76, the externally threaded portion 76c may be formed almost over the whole length of the shank 76b.

In the sample positioning jig 55-1 of the configuration described above, the protrusion amount setting member 56-1 is biased away from the mounting block 73 while guided by the pair of guide pins 75 by the biasing force of the spring 77. The head 76a of the retaining screw 76 is urged to bear against the steps of the stepped holes having the larger hole 73c and the smaller hole 73d by the biasing force of the spring 77 and so the protrusion amount setting member 56-1 is kept spaced a given distance from the mounting block 73. Under this condition, if the protrusion amount setting member 56-1 is pushed in toward the mounting block 73 against the biasing force of the spring 77, the head 76a of the retaining screw 76 separates from the steps of the stepped holes (larger hole 73c and smaller hole 73d) as shown in FIG. 33.

A procedure for placing the sample 11 in position using the sample positioning jig 55-1 is next described. First, the operator places the sample holder including the shield member 29 on the holder receiving portion 66 of the first tool 57-1. Then, the operator rotationally manipulates the holding knob 67, thus holding the sample holder to the first tool 57-1. At this time, the shield member 29 and the sample holder are held together by the holding knob 67.

Then, the operator mounts the second tool 58-1 to the first tool 57-1. During this operation, the operator inserts the arm portions 72 of the second tool 58-1 into the guide grooves 68 of the first tool 57-1, and the abutting portion 70 of the second tool 58-1 is made to bear against the first tool 57-1. Consequently, the first contact portion 61-1 of the protrusion amount setting member 56-1 makes contact with the front end surface 29b of the shield member 29. The spring 77 biases the protrusion amount setting member 56-1 in such a way as to push the first contact portion 61-1 against the front end surface 29b of the shield member 29. The protrusion amount setting member 56-1 is pushed in towards the mounting block 73 against the biasing force of the spring 77.

At this time, as shown in FIG. 33, if the clearance G1 is present between the smaller hole 73d and the shank 76b, the clearance G1 permits the retaining screw 76 to sway. The swaying motion of the retaining screw 76 is caused by tilt of the protrusion amount setting member 56-1 according to the tilt angle θa (see FIG. 27) of the front end surface 29b of the shield member 29. Consequently, the first contact portion 61-1 of the protrusion amount setting member 56-1 can be brought into intimate contact with the front end surface 29b of the shield member 29.

Then, the operator holds the second tool 58-1 to the first tool 57-1 by rotationally manipulating the holding knob 71. Then, the operator places the sample 11 on the shield member 29. Then, the front end surface 11a of the sample 11 is pushed against the second contact portion 62-1 of the protrusion amount setting member 56-1 by the aforementioned method. Then, the operator holds the sample 11 to the shield member 29 with the clip 51. The following procedure is the same as already described in the fifth embodiment and so a description thereof is omitted.

Second Specific Example

Figure 35:
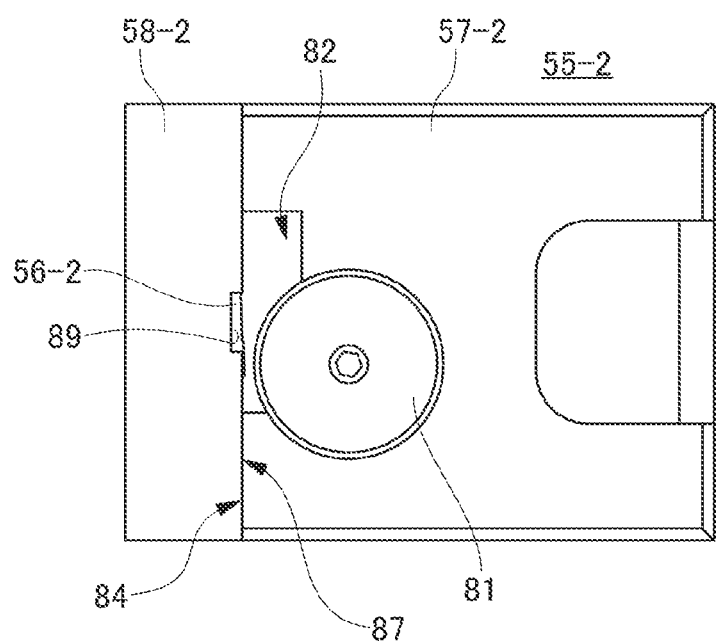
FIG. 35 is a side elevation illustrating a second specific example of the sample positioning jig associated with the fifth embodiment of the invention.
Figure 36:
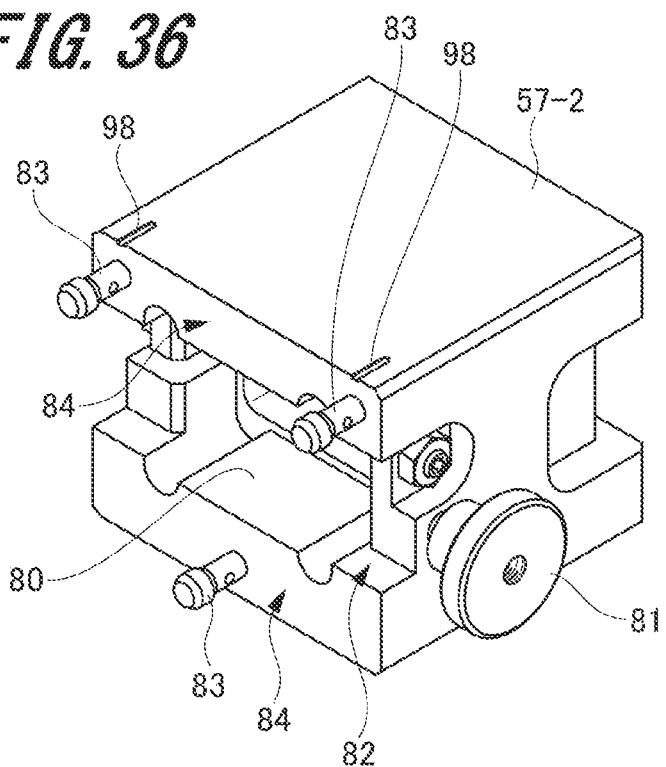
FIG. 36 is a perspective view of a first tool equipped in the sample positioning jig shown in FIG. 35, illustrating the configuration of the first tool.
Figure 37:
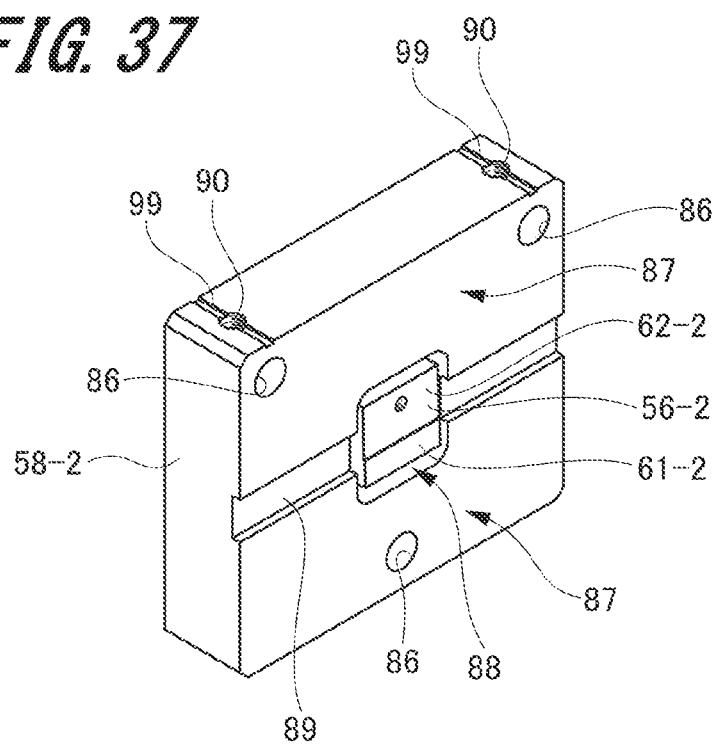
FIG. 37 is a perspective view of a second tool and a protrusion amount setting member equipped in the sample positioning jig of FIG. 35, illustrating the configurations of the second tool and protrusion amount setting member.

FIG. 35 is a side elevation showing a second specific example of the sample positioning jig associated with the fifth embodiment of the present invention. FIG. 36 is a perspective view showing the configuration of a first tool 57-2 equipped in a sample positioning jig 55-2 shown in FIG. 35. FIG. 37 is a perspective view showing the configurations of a second tool 58-2 and a protrusion amount setting member 56-2 equipped in the sample positioning jig 55-2 shown in FIG. 35.

As shown in FIGS. 35-37, the sample positioning jig 55-2 has the protrusion amount setting member 56-2, the first tool 57-2, and the second tool 58-2. As shown in FIG. 36, the first tool 57-2 has a holder receiving portion 80, a holding knob 81, a recessed portion 82, three mounting pins 83, and a pair of upper and lower abutting surfaces 84. When a sample holder (not shown) is placed on the first tool 57-2, the holder receiving portion 80 receives the sample holder.

The holding knob 81 is used to hold the sample holder placed on the holder receiving portion 80. The holding knob 81 has an externally threaded portion (not shown) which engages an internally threaded portion (not shown) formed in the first tool 57-2. The recessed portion 82 is recessed more deeply than the abutting surfaces 84. The recessed portion 82 of the first tool 57-2 has a hollow space extending therethrough. The abutting surfaces 84 of one pair are formed to be in flush with each other.

Figure 38:
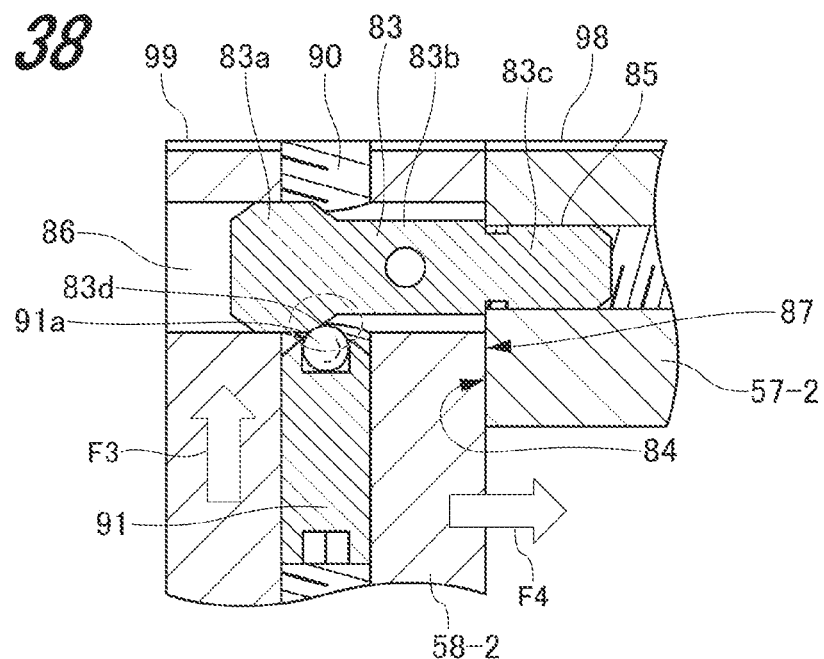
FIG. 38 shows a structure for mounting the second tool to the first tool in the second specific example.

The mounting pins 83 are used to mount the second tool 58-2 to the first tool 57-2. The three mounting pins 83 are arranged at the vertices of a triangle as the first tool 57-2 is viewed from the front. Two of the three mounting pins 83 are arranged on the upper abutting surface 84, while the remaining one pin 83 is disposed on the lower abutting surface 84. As shown in FIG. 38, each of the mounting pins 83 has a head 83a, a shank 83b, and an externally threaded portion 83c which are integral with each other. On the other hand, an internally threaded portion 85 is formed in the abutting surface 84 of the first tool 57-2. The mounting pins 83 are secured to the first tool 57-2 by bringing the externally threaded portion 83c into engagement with the internally threaded portion 85.

As shown in FIG. 37, the second tool 58-2 has three mounting holes 86, a pair of upper and lower abutting surfaces 87, a receiving portion 88, and a recessed groove 89. The three mounting holes 86 are formed in the second tool 58-2 in a corresponding manner to the aforementioned three mounting pins 83. Each mounting hole 86 has an inside diameter set slightly greater than the outside diameter of the head 83a of each mounting pin 83.

As shown in FIG. 38, the second tool 58-2 is provided with threaded holes 90 perpendicular to the mounting holes 86. A ball plunger 91 is inserted in each threaded hole 90 and has a spring (not shown) and a ball 91a biased by the spring. The ball 91a protrudes radially inwardly of the respective mounting hole 86 from its inner surface.

A pair of abutting surfaces 87 is formed on the second tool 58-2 in a corresponding manner to the pair of abutting surfaces 84. The abutting surfaces 87 are formed flush with each other. The receiving portion 88 receives the protrusion amount setting member 56-2 and is formed in the center of the second tool 58-2 as viewed from the front of the second tool 58-2. The recessed groove 89 is recessed more deeply than the abutting surfaces 87 to permit the operator to check the first contact portion 61-2 and the second contact portion 62-2 of the protrusion amount setting member 56-2 from a side of the sample positioning jig 55. The recessed groove 89 is formed horizontally from the left and right ends of the receiving portion 88 to the left and right ends of the second tool 58-2 as viewed from the front of the second tool 58-2.

Figure 39:
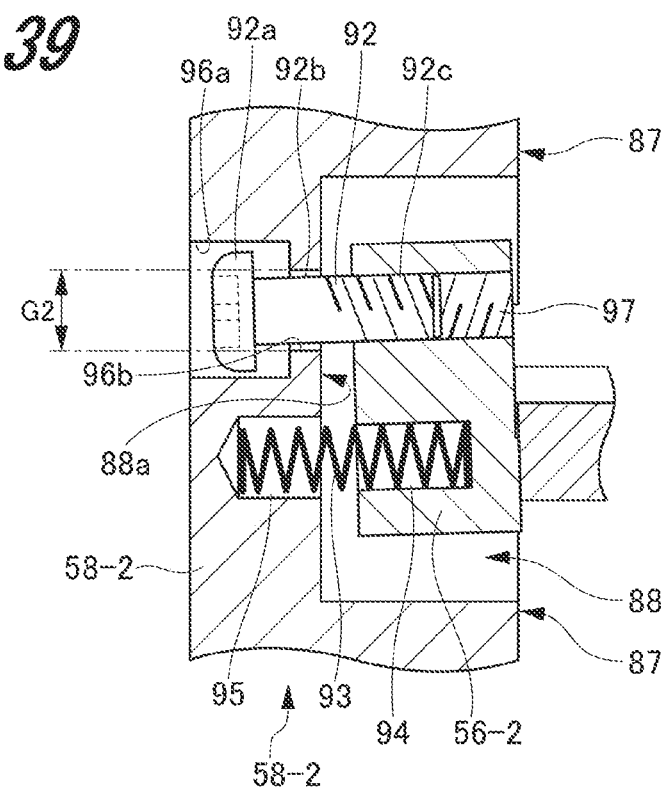
FIG. 39 is a cross-sectional view of a structure for mounting the protrusion amount setting member to the second tool in the second specific example.

FIG. 39 is a cross-sectional view showing a structure for mounting the protrusion amount setting member 56-2 to the second tool 58-2. As shown in this figure, the protrusion amount setting member 56-2 is mounted in the receiving portion 88 of the second tool 58-2 using a retaining screw 92 and a spring 93. The spring 93 acts as a biasing member in the same manner as the aforementioned spring 65 (see FIG. 25). One end of the spring 93 is inserted in a first pocket portion 94 formed in the protrusion amount setting member 56-2, the other end of the spring 93 being inserted in a second pocket portion 95 formed in the second tool 58-2.

The retaining screw 92 defines a maximum allowable distance of the protrusion amount setting member 56-2 from the rear end surface 88a of the receiving portion 88 to prevent one end of the spring 93 from coming out of the first pocket portion 94 and prevent the other end of the spring 93 from coming out of the second pocket portion 95. The retaining screw 92 has a head 92a, a shank 92b, and an externally formed portion 92c which are integral with each other. On the other hand, the second tool 58-2 is provided with a stepped hole consisting of a larger hole 96a and a smaller hole 96b. The head 92a of the retaining screw 92 is received in the larger hole 96a. The shank 92b of the retaining screw 92 is inserted in the smaller hole 96b. The larger hole 96a has a diameter set greater than that of the head 92a. The smaller hole 96b has a diameter set greater than that of the shank 92b. A clearance G2 corresponding to the dimensional difference between the smaller hole 96b and the shank 92b is present between the smaller hole 96b and the shank 92b. Because of the presence of the clearance G2, the second tool 58-2 can appropriately absorb swaying motion of the retaining screw 92. On the other hand, an internally threaded portion 97 is formed in the protrusion amount setting member 56-2. The externally threaded portion 92c of the retaining screw 92 engages the internally threaded portion 97.

As shown in FIGS. 36 and 37, a pair of left and right positioning grooves 98 is formed in the top surface of the first tool 57-2. A pair of left and right positioning grooves 99 is formed in the top surface of the second tool 58-2 in a corresponding manner to the positioning grooves 98 in the first tool.

Positional deviation of the protrusion amount setting member 56-2 in the direction of rotation is suppressed by a pair of guide pins in the same manner as in the first specific example. With respect to the retaining screw 92, the internally threaded portion 92c may be formed substantially over the whole length of the shank 92b.

In the sample positioning jig 55-2 of the above-described configuration, the protrusion amount setting member 56-2 is biased away from the rear end surface 88a of the receiving portion 88 by the biasing force of the spring 93. Because the head 92a of the retaining screw 92 is urged to bear against the steps of the stepped hole (96a, 96b) by the biasing force of the spring 93, the protrusion amount setting member 56-2 is kept spaced a given distance from the rear end surface 88a of the receiving portion 88. Under this condition, if the protrusion amount setting member 56-2 is pushed in toward the deepest part of the receiving portion 88 against the biasing force of the spring 93, the head 92a of the retaining screw 92 separates from the steps of the stepped hole (96a, 96b) as shown in FIG. 39.

A procedure for placing the sample 11 in position using the sample positioning jig 55-2 is next described. First, the operator places the sample holder including the shield member 29 on the holder receiving portion 80 of the first tool 57-2. Then, the operator holds the sample holder to the first tool 57-1 by rotationally manipulating the holding knob 81. At this time, the shield member 29 is held together with the sample holder by the holding knob 81.

Then, the operator mounts the second tool 58-2 to the first tool 57-2. During this operation, the operator aligns the first tool 57-2 and the second tool 58-2 in position while using the positioning grooves 98 and 99 for the first tool 57-2 and the second tool 58-2, respectively, as indicia. The operator brings the abutting surfaces 84 and 87 of the tools into abutting engagement with each other while inserting the pin 83 for mounting of the first tool 57-2 in the hole 86 for mounting of the second tool 58-2. Consequently, the first contact portion 61-2 of the protrusion amount setting member 56-2 makes contact with the front end surface 29b of the shield member 29. The spring 93 biases the protrusion amount setting member 56-2 in such a way as to push the first contact portion 61-2 against the front end surface 29b of the shield member 29. The protrusion amount setting member 56-2 is pushed in toward the deepest part of the receiving portion 88 against the biasing force of the spring 93.

At this time, if the clearance G2 is present between the smaller hole 96b and the shank 92b as shown in FIG. 39, the clearance G2 permits the retaining screw 92 to sway. Swaying motion of the retaining screw 92 is caused by tilt of the protrusion amount setting member 56-2 according to the tilt angle θa (see FIG. 27) of the front end surface 29b of the shield member 29. Consequently, the first contact portion 61-2 of the protrusion amount setting member 56-2 can be brought into intimate contact with the front end surface 29b of the shield member 29.

On the other hand, the ball 91a of the ball plunger 91 is once pushed in by the head 83a of the mounting pin 83 as shown in FIG. 38. Then, the ball 91a rises over the head 92a. The ball 91a comes into contact with an inclined surface 83d formed at the boundary between the head 83a and the shank 83b while the abutting surfaces 84 and 87 are made to abut each other. The ball 91a is pushed against the inclined surface 83d by a force F3 of a spring incorporated in the ball plunger 91. A pull-in force F4 is applied to the second tool 58-2 in a sense parallel to the direction of the center axis of the mounting pin 83. The second tool 58-2 is secured to the first tool 57-2 by the pull-in force F4.

Then, the operator places the sample 11 on the shield member 29 and then pushes the front end surface 11a of the sample 11 against the second contact portion 62-2 of the protrusion amount setting member 56-2 by the method described above. Then, the operator secures the sample 11 to the shield member 29 with the clip 51. The sequent procedure is the same as the procedure set forth in the fifth embodiment and so a repetition of the description thereof is omitted.

In the second specific example above, in order to mount the second tool 58-2 to the first tool 57-2 and to hold them together, the mounting pin 83, the mounting hole 86, the threaded hole 90, and the ball plunger 91 are used. The present invention is not restricted to this structure. For example, the tools may be held together magnetically as in a third specific example given below.

Third Specific Example

Figure 40:
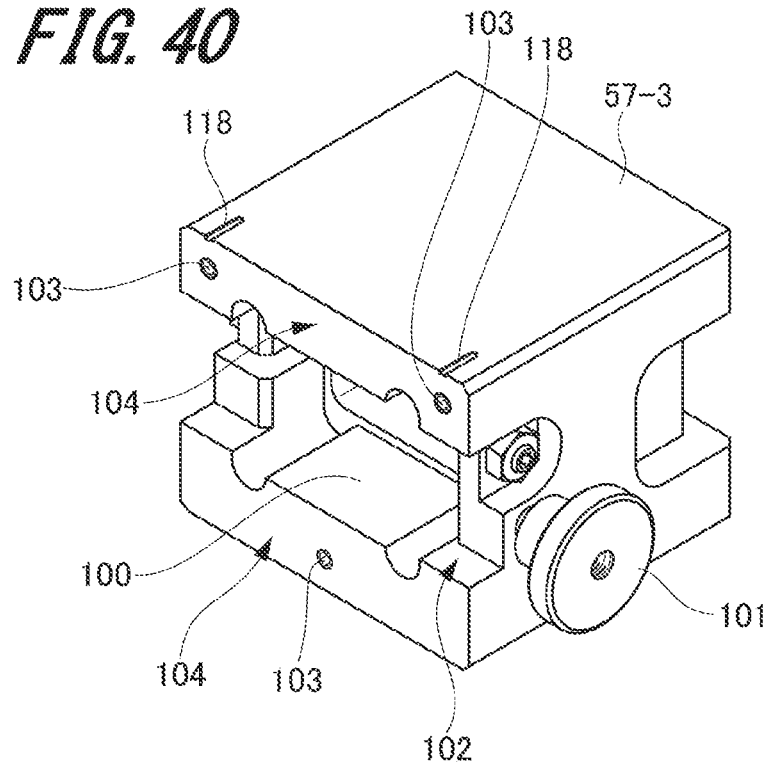
FIG. 40 is a perspective view of a first tool that is a third specific example of the sample positioning jig associated with the fifth embodiment of the present invention, illustrating the configuration of the first tool.
Figure 41:
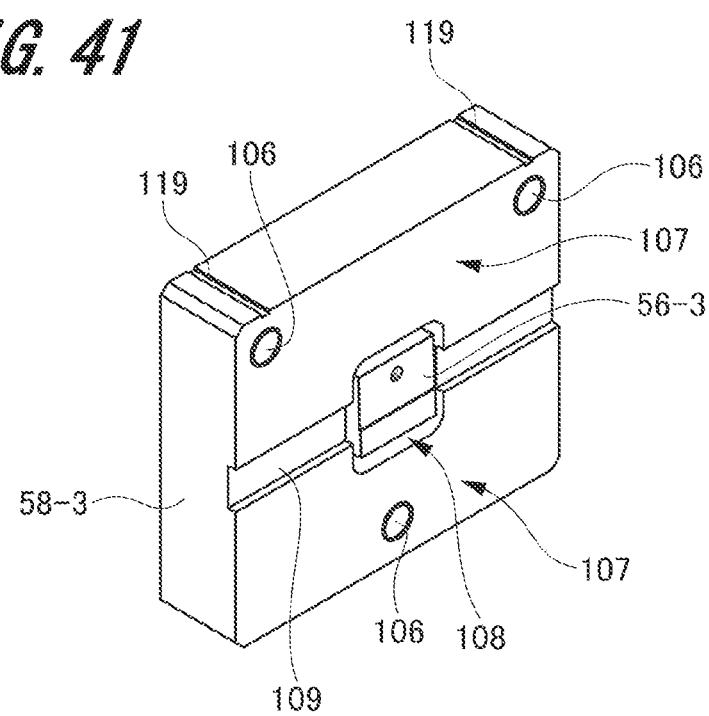
FIG. 41 is a perspective view of a second tool and the protrusion amount setting member which constitute the third specific example of the sample positioning jig associated with the fifth embodiment of the invention, illustrating the configurations of the second tool and protrusion amount setting member.

FIG. 40 is a perspective view showing the configuration of a first tool 57-3 as a third specific example of the sample positioning jig associated with the fifth embodiment of the present invention. FIG. 41 is a perspective view showing the configurations of a second tool 58-3 and a protrusion amount setting member 56-3. In this third specific example, only the differences with the configurations of the tools in the second specific example are described. A description of similarities is omitted.

As shown in FIG. 40, the first tool 57-3 has a holder receiving portion 100, a holding knob 101, a recessed portion 102, three set screws 103, and a pair of upper and lower abutting surfaces 104. The holder receiving portion 100, holding knob 101, recessed portion 102, and upper and lower abutting surfaces 104 of one pair are similar in configuration to their respective counterparts of the second specific example, i.e., holder receiving portion 80, holding knob 81, recessed portion 82, and upper and lower abutting surfaces 84 of one pair.

Figure 42:
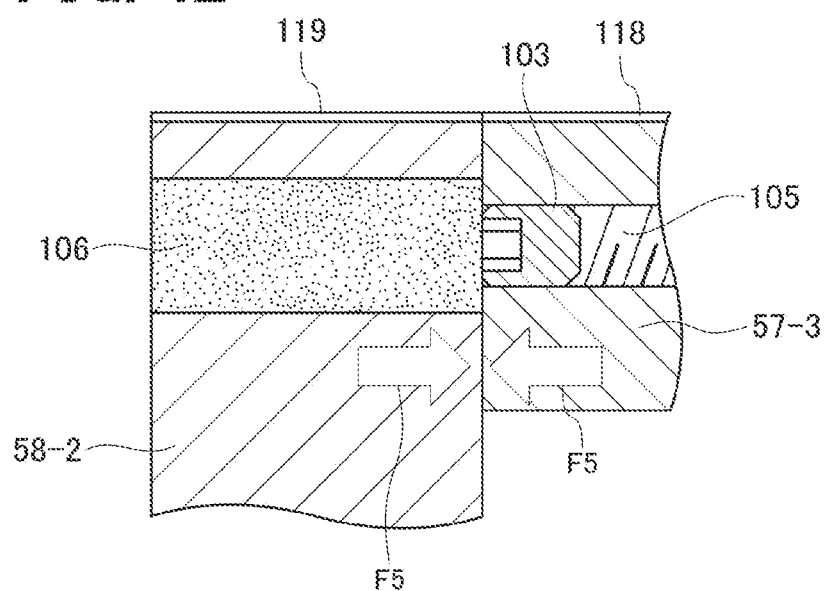
FIG. 42 shows a structure for mounting a second tool to a first tool in the third specific example.

The three set screws 103 are disposed at the positions of the vertices of a triangle as viewed from the front of the first tool 57-2. Two of the three set screws 103 are disposed on the upper abutting surface 104, the remaining one set screw 103 being disposed on the lower abutting surface 104. As shown in FIG. 42, each of the set screws 103 engages a respective one of threaded holes 105 formed in the first tool 57-3. Each set screw 103 is made of a magnetic material and has a hexagonal hole. One end of the set screw 103 is either flush with the abutting surface 104 at the exit of the corresponding threaded hole 105 that opens to the abutting surface 104 or slightly recessed rearwardly of the threaded hole 105 from the abutting surface 104.

As shown in FIG. 41, the second tool 58-3 has three magnets 106, a pair of upper and lower abutting surfaces 107, a receiving portion 108, and a recessed groove 109. The upper and lower abutting surfaces 107, receiving portion 108, and recessed groove 109 are similar in configuration to the pair of upper and lower abutting surfaces 87, receiving portion 88, and recessed groove 89, respectively, in the above-described second specific example. The protrusion amount setting member 56-3 is mounted to the second tool 58-3. A structure for mounting the protrusion amount setting member 56-3 to the second tool 58-3 is similar to the mounting structure of the second specific example. As shown in FIGS. 40 and 41, a pair of left and right positioning grooves 118 is formed in the top surface of the first tool 57-3, and a pair of left and right positioning grooves 119 is formed in the top surface of the second tool 58-3 in a corresponding manner to the positioning grooves 118 in the same manner as in the second specific example.

The three magnets 106 are buried in the second tool 58-3 in a corresponding manner to the three set screws 103 and secured in the second tool 58-3 by press fit, adhesive bonding, or other technique. One end surface of each magnet 106 is in flush with the abutting surface 107 or slightly recessed from it.

A procedure for placing the sample 11 in position using the sample positioning jig equipped with the first tool 57-3 and the second tool 58-3 of the above-described configurations is next described. First, the operator mounts the second tool 58-3 to the first tool 57-3. At this time, the operator aligns the first and second tools 57-3, 58-3 in position using the groove 118 for positioning of the first tool 57-3 and the groove 119 for positioning of the second tool 58-3 as indicia. Consequently, the three set screws 103 and the three magnets 106 are aligned in position. The operator brings the magnets 106 of the second tool 58-3 close to the set screw 103 of the first tool 57-3. As a result, as shown in FIG. 42, a magnetic attractive force F5 produced among the set screws 104 and the magnets 106 brings the abutting surfaces 104 and 107 of the tools into abutting engagement with each other. Hence, the second tool 58-3 can be mounted to the first tool 57-3 and both tools can be secured together.

With the sample positioning jig 55 associated with the fifth embodiment of the present invention including the above-described first, second, and third specific examples, the amount of protrusion L of the sample 11 is established by bringing the first contact portion 61 out of the first contact portion 61 and the second contact portion 62 of the protrusion amount setting member 56 into contact with the front end surface 29b of the shield member 29 and bringing the second contact portion 62 into contact with the front end surface 11a of the sample 11. Therefore, the sample positioning jig 55 associated with the fifth embodiment of the present invention makes it possible to set the amount of protrusion L of the sample 11 with simple manipulations. Furthermore, where the sample 11 is set within a glove box, a work for setting the amount of protrusion can be done easily. Where plural samples 11 having different desired amounts of protrusion are handled, plural protrusion amount setting members 56 which are different in the aforementioned depth D (see FIG. 27) are prepared, and one protrusion amount setting member 56 matching the desired amount of protrusion is selected from them and used. This leads to favorable results. Furthermore, as long as the first tool 57 capable of holding the shield member 29 is equipped, the amount of protrusion L of the sample 11 can be set irrespective of the material and shape of the shield member 29.

Sixth Embodiment

Figure 43:
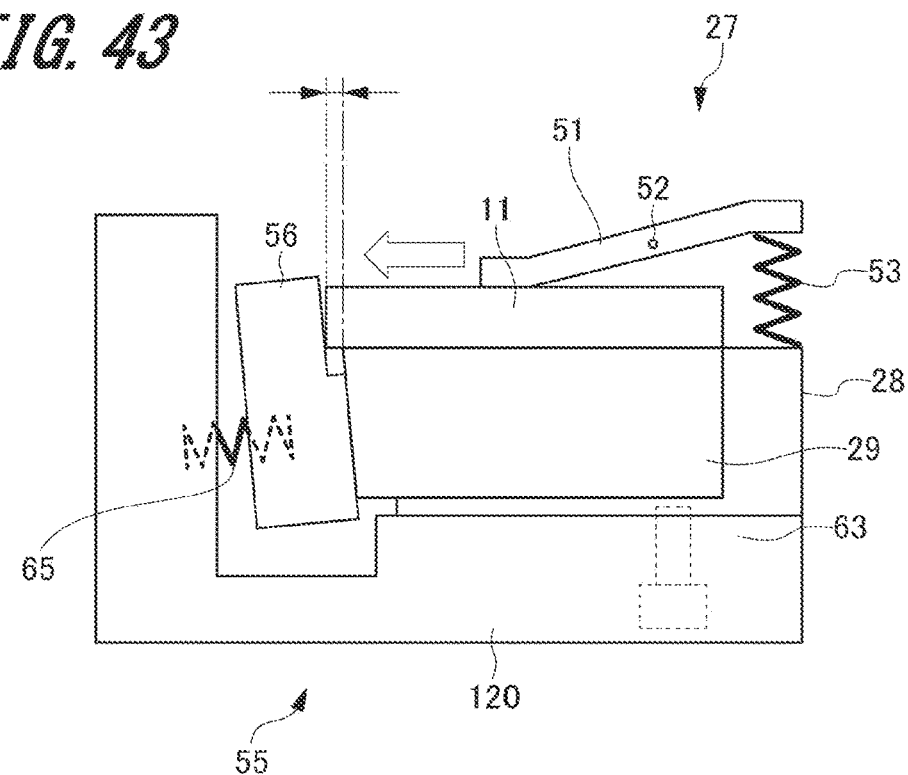
FIG. 43 is a schematic side elevation of a sample positioning jig associated with a sixth embodiment of the invention, illustrating the configuration of the jig.

FIG. 43 is a schematic side elevation showing the configuration of a sample positioning jig associated with a sixth embodiment of the present invention. This sample positioning jig is similar to the sample positioning jig (see FIG. 25) associated with the fifth embodiment except that the first tool 57 and the second tool 58 are combined in a unitary tool. Specifically, as shown in FIG. 43, the sample positioning jig, 55, has a tool 120 secured to a holder body 28 with a screw 63, the tool 120 being of a unitary construction.

In the sample positioning jig 55 associated with the sixth embodiment of the present invention, the tool 120 is of a unitary construction and so manipulations for mounting the second tool 58 to the first tool 57 and detaching the second tool 58 from the first tool 57 are dispensed with, unlike the sample positioning jig associated with the fifth embodiment. Therefore, the amount of protrusion L of the sample 11 can be set with simpler manipulations.

Seventh Embodiment

Figure 44:
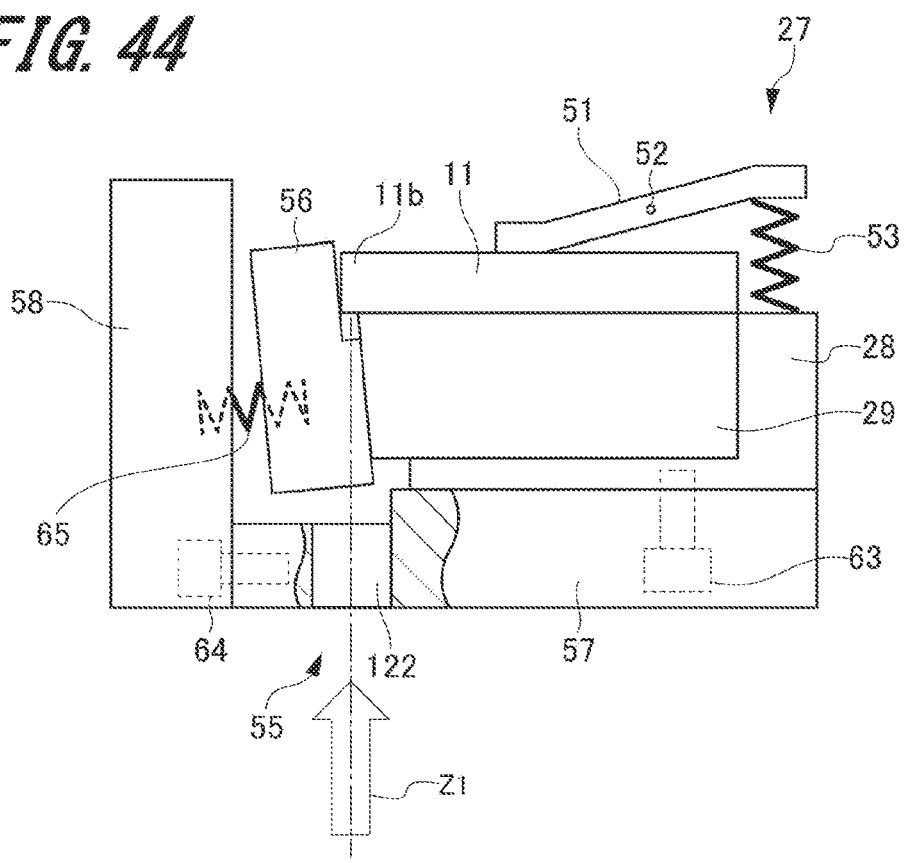
FIG. 44 is a schematic side elevation of a sample positioning jig associated with a seventh embodiment of the invention, illustrating the configuration of the jig.

FIG. 44 is a schematic side elevation showing the configuration of a sample positioning jig associated with a seventh embodiment of the present invention. This sample positioning jig is similar to the sample positioning jig (see FIG. 25) associated with the fifth embodiment except that the protrusion amount setting member 56 is made of a transparent material and that an observation window 122 is formed in the first tool 57. Examples of the transparent material of the setting member 56 include glass and resins.

The observation window 122 is formed at a position where the milled portion 11b of the sample 11 can be observed through the protrusion amount setting member 56. The observation window 122 is formed, for example, by forming a through hole in the first tool 57 and plugging the through hole with a transparent material such as glass or resin. Alternatively, the observation window 122 may be made only of a through hole formed in the first tool 57.

With the sample positioning jig 55 associated with the seventh embodiment of the present invention, after the amount of protrusion of the sample 11 is set using the protrusion amount setting member 56, the amount of protrusion of the sample 11 can be checked visually from Z1 direction shown in FIG. 44 with an optical microscope or a camera. Consequently, it is possible to check on the first tool 57 whether the amount of protrusion of the sample 11 is coincident with the desired amount of protrusion before the first tool 57 is taken out of the holder body 28.

In the sample positioning jig associated with the seventh embodiment of the present invention, the first tool 57 is provided with the observation window 122. The present invention is not limited to this structure. The observation window may be formed in the tool 57 of the sample positioning jig associated with the fifth embodiment or in the tool 120 of the sample positioning jig associated with the sixth embodiment.

Eighth Embodiment

Figure 45:
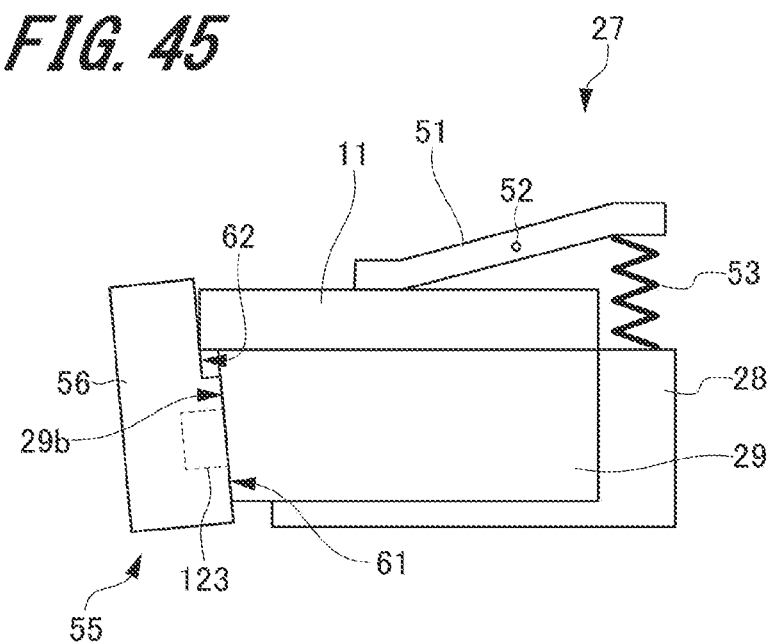
FIG. 45 is a schematic side elevation of a sample positioning jig associated with an eighth embodiment of the invention, illustrating the configuration of the jig.

FIG. 45 is a schematic side elevation showing the configuration of a sample positioning jig associated with an eighth embodiment of the present invention. As shown in FIG. 45, the sample positioning jig, 55, is made of a protrusion amount setting member 56. This setting member 56 has at least one magnet 123 in addition to the first contact portion 61 and the second contact portion 62. The magnet 123 is disposed on the surface of the first contact portion 61 and in opposition to the front end surface 29b of the shield member 29. The number of the magnets 123 of the protrusion amount setting member 56 may be singular or plural. The shield member 29 is made of a magnetic material such as a magnetic stainless steel.

Then, a procedure for placing the sample 11 in position using the sample positioning jig 55 of the above construction is described. First, the operator brings the front end surface 29b of the shield member 29 and the first contact portion 61 of the protrusion amount setting member 56 closer to each other. This produces a magnetic attracting force between the shield member 29 and the protrusion amount setting member 56, pushing the first contact portion 61 of the protrusion amount setting member 56 against the front end surface 29b of the shield member 29.

Then, the operator makes the front end surface 11a of the sample 11 strike against the second contact portion 62 of the protrusion amount setting member 56 while maintaining the first contact portion 61 of the protrusion amount setting member 56 in contact with the front end surface 29b of the shield member 29. The operator then holds the sample 11 to the shield member 29 with the clip 51. Then, the operator removes the protrusion amount setting member 56 from the shield member 29. Thus, the setting of the sample 11 is complete.

With the sample positioning jig associated with the eighth embodiment of the present invention, the amount of protrusion of the sample 11 can be set by the use of only the protrusion amount setting member 56 having the magnet 123. Therefore, the component count of the sample positioning jig 55 can be reduced as compared with the configurations of the above-described fifth through seventh embodiments. Also, miniaturization of the sample positioning jig 55 can be accomplished.

Ninth Embodiment

Figure 46:
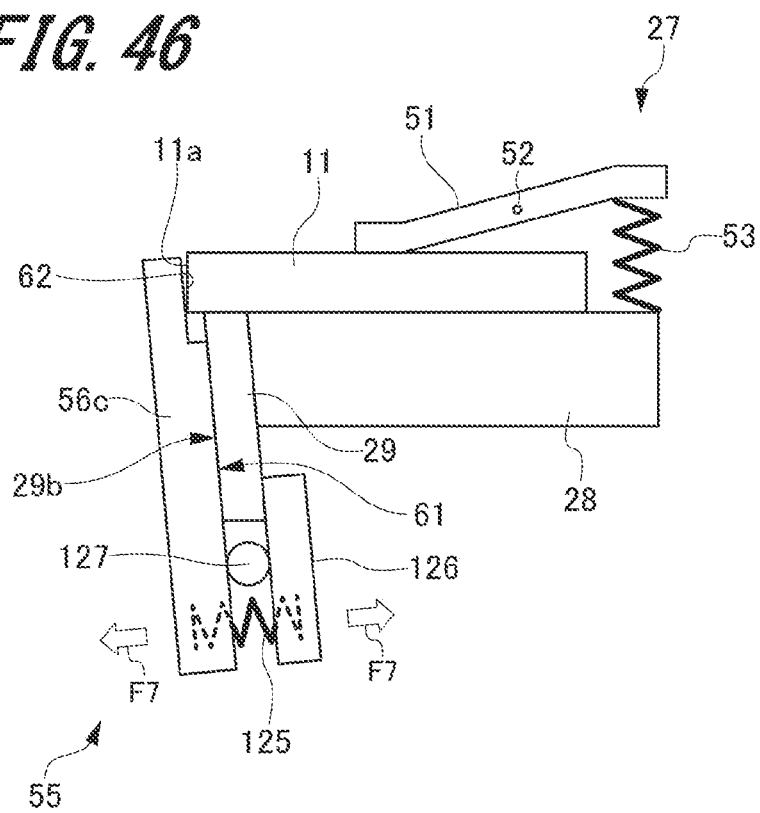
FIG. 46 is a schematic side elevation of a sample positioning jig associated with a ninth embodiment of the invention, illustrating the configuration of the jig.

FIG. 46 is a schematic side elevation showing the configuration of a sample positioning jig associated with a ninth embodiment of the present invention. As shown in FIG. 46, the sample positioning jig 55 has a clip-on protrusion amount setting member 56c which has a first contact portion 61 and a second contact portion 62. One end of a clip-on spring 125 is attached to an end of the protrusion amount setting member 56c, the other end being attached to a clip part 126. The clip part 126 is so supported as to be swingable about a pivotal point 127 that is interposed between the protrusion amount setting member 56c and the clip part 126. A force F7 of the spring 125 is applied outwardly to the protrusion amount setting member 56c and to the clip part 126.

On the other hand, the shield member 29 is held to the holder body 28, for example, by pressing both ends of the shield member 29 against the holder body 28 with a spring-loaded securing pin (not shown). Where the shield member 29 is made of a magnetic material, a magnet (not shown) may be incorporated in the holder body 28 so that the shield member 29 may be held to the holder body 28 by the magnetic attracting force of the magnet.

A procedure for placing the sample 11 in position by the use of the sample positioning jig 55 of the above-described configuration is then described. First, the operator holds the shield member 29 to the holder body 28. Then, the operator mounts the protrusion amount setting member 56c to the shield member 29. At this time, the operator brings one end of the protrusion amount setting member 56c and one end of the clip part 126 closer to each other against the biasing force of the spring 125. Under this condition, the shield member 29 is squeezed in between the protrusion amount setting member 56c and the clip part 126, and then the force of the spring 125 is relieved. The result is that the shield member 29 is squeezed between the protrusion amount setting member 56c and the clip part 126. In consequence, the first contact portion 61 of the protrusion amount setting member 56c is pushed against the front end surface 29b of the shield member 29 by the biasing force of the spring 125.

After placing the sample 11 on the holder body 28, the operator makes the front end surface 11a of the sample 11 strike against the second contact portion 62 of the protrusion amount setting member 56c. The operator then holds the sample 11 to the shield member 29 with the clip 51. Then, the operator takes the protrusion amount setting member 56c out of the shield member 29. At this time, the operator brings one end of the protrusion amount setting member 56c and one end of the clip part 126 closer to each other against the biasing force of the spring 125. Under this condition, the protrusion amount setting member 56c and the clip part 126 are separated from the shield member 29. Thus, the setting of the sample 11 is complete.

With the sample positioning jig associated with the ninth embodiment of the present invention, the amount of protrusion of the sample 11 can be set by the use of only the clip-on protrusion amount setting member 56c. Therefore, the component count of the sample positioning jig 55 can be reduced as compared with the configurations of the above-described fifth through seventh embodiments. Also, miniaturization of the sample positioning jig 55 can be accomplished.

Figure 47:
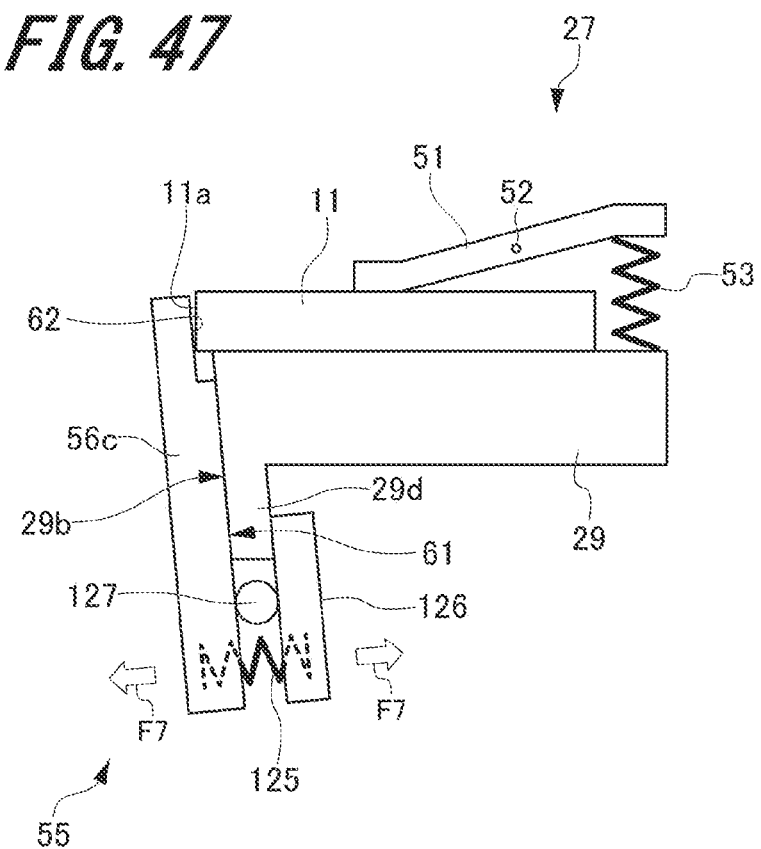
FIG. 47 is a schematic side elevation showing a first modification of the sample positioning jig of FIG. 46.

The clip-on protrusion amount setting member 56*c* may be used where a protrusion 29*d* for the clip is formed at the front end of the shield member 29 as shown in FIG. 47. In this case, the protrusion 29*d* of the shield member 29 is squeezed in between the protrusion amount setting member 56*c* and the clip part 126 by the force F7 of the spring 125. Thus, the first contact portion 61 of the protrusion amount setting member 56*c* is pushed against the front end surface 29*b* of the shield member 29 by the biasing force of the spring 125. Consequently, the amount of protrusion of the sample 11 can be set by bringing the front end surface 11*a* of the sample 11 into contact with the second contact portion 62 of the protrusion amount setting member 56*c*.

Figure 48:
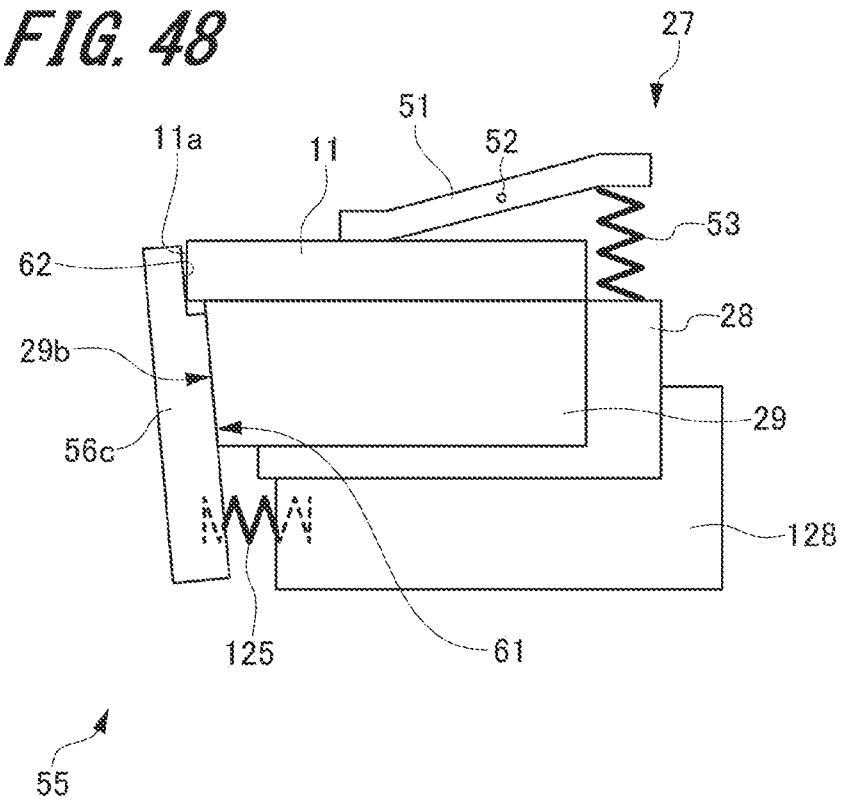
FIG. 48 is a schematic side elevation showing a second modification of the sample positioning jig of FIG. 46.

The clip-on protrusion amount setting member 56*c* may be mounted to a base member 128, which supports the holder body 28, by the use of the spring 125 as shown in FIG. 48. Where this configuration is adopted, the operator first pulls in the protrusion amount setting member 56*c* away from the base member 128 against the biasing force of the spring 125. Under this condition, the holder body 28 is placed on the base member 128. Then, the operator pushes the protrusion amount setting member 56*c* against the shield member 29 against the biasing force of the spring 125. As a result, the first contact portion 61 of the protrusion amount setting member 56*c* is pushed against the front end surface 29*b* of the shield member 29 by the biasing force of the spring 125. As a consequence, the amount of protrusion of the sample 11 can be set by bringing the front end surface 11*a* of the sample 11 into contact with the second contact portion 62 of the protrusion amount setting member 56*c*.

Tenth Embodiment

Figure 49:
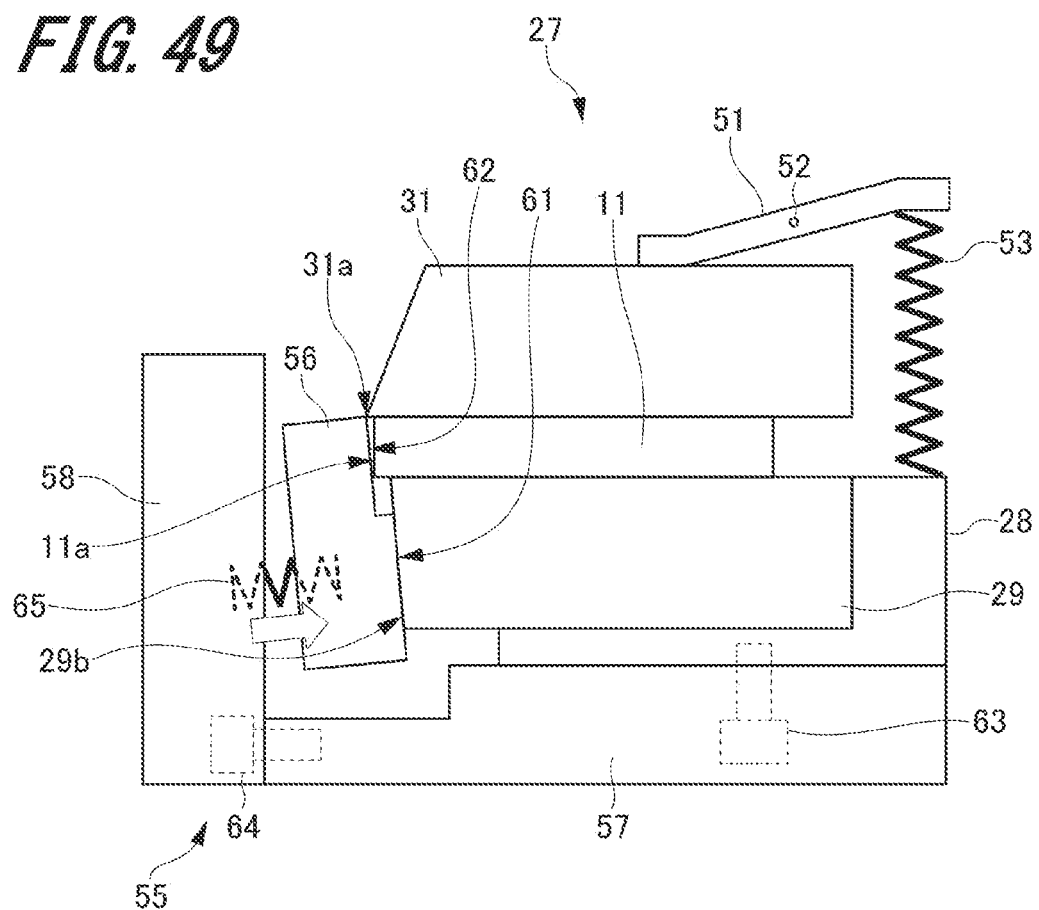
FIG. 49 is a schematic side elevation of a sample positioning jig associated with a tenth embodiment of the invention, illustrating the configuration of the jig.

FIG. 49 is a schematic side elevation showing the configuration of a sample positioning jig associated with a tenth embodiment of the present invention. This sample positioning jig, 55, is similar to the sample positioning jig 55 (see FIG. 25) associated with the above-described fifth embodiment except that the sample 11 is sandwiched and secured between the shield member 29 and the sample locking member 31 and that the second contact portion 62 of the protrusion amount setting member 56 makes contact with the front end 31*a* of the sample locking member 31 and with the front end surface 11*a* of the sample 11.

Where the sample 11 is placed in position by the use of the sample positioning jig 55 of the above-described configuration, the first contact portion 61 of the protrusion amount setting member 56 is first brought into contact with the front end surface 29*b* of the shield member 29 by the biasing force of the spring 65. Then, the sample 11 and the sample locking member 31 are placed on the shield member 29. Subsequently, the front end surface 11*a* of the sample 11 and the front end 31*a* of the sample locking member 31 are brought into contact with the second contact portion 62 of the protrusion amount setting member 56. Under this condition, the sample 11 and the sample locking member 31 are secured together with the clip 51. As a result, the shield member 29, the sample 11, and the sample locking member 31 are placed in position. Also, the amount of protrusion of the sample 11 is set. At this time, the front end 31*a* of the sample locking member 31 protrudes from the front end surface 11*a* of the sample 11.

Eleventh Embodiment

Figure 50:
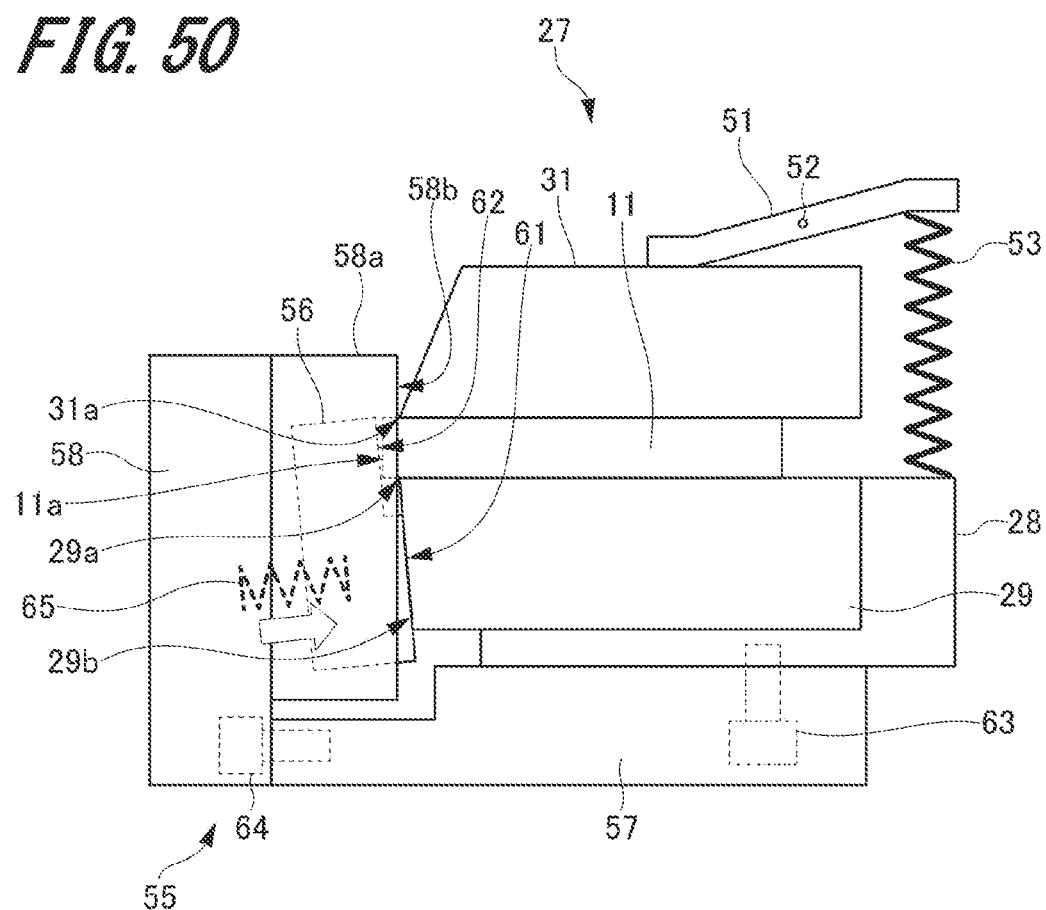
FIG. 50 is a schematic side elevation of a sample positioning jig associated with an eleventh embodiment of the invention, illustrating the configuration of the jig.
Figure 51:
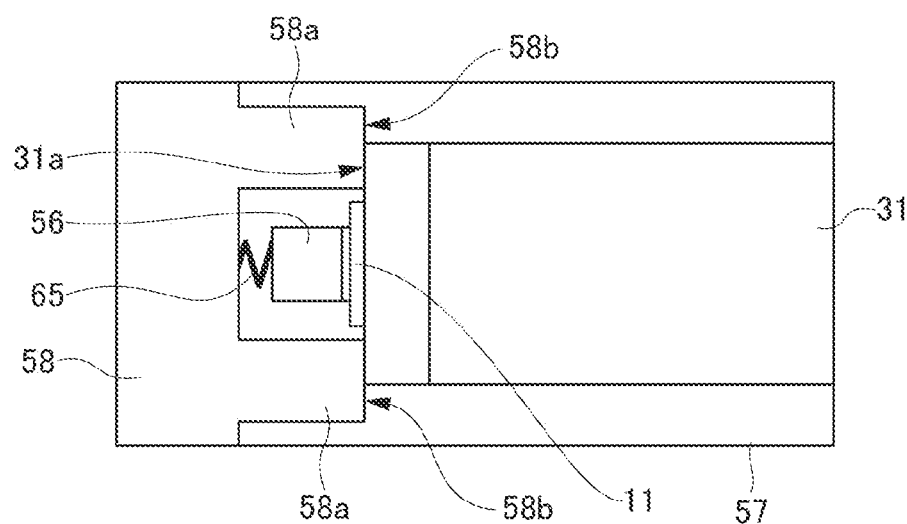
FIG. 51 is a schematic plan view of the sample positioning jig of FIG. 50, illustrating its configuration.

FIG. 50 is a schematic side elevation showing the configuration of a sample positioning jig associated with an eleventh embodiment of the present invention. FIG. 51 is a schematic plan view showing the configuration of the sample positioning jig of FIG. 50. In FIG. 51, the holder body 28, clip 51, and spring 53 are omitted.

The sample positioning jig 55 associated with the eleventh embodiment of the present invention is similar to the sample positioning jig 55 (see FIG. 49) associated with the tenth embodiment except that a pair of protrusive portions 58*a* is formed on the second tool 58. The protrusive portions 58*a* have protrusive surfaces 58*b* which define a reference plane for placing the shield member 29 and the sample locking member 31 in position.

Where the sample 11 is placed in position using the sample positioning jig 55 of the above configuration, the second tool 58 is mounted to the first tool 57 in such a way that the protrusive surfaces 58*b* of the protrusive portions 58*a* make contact with the edge portion 29*a* of the shield member 29. At this time, the first contact portion 61 of the protrusion amount setting member 56 is brought into contact with the front end surface 29*b* of the shield member 29 by the biasing force of the spring 65. Then, the sample 11 and the sample locking member 31 are placed on the shield member 29. Then, the front end surface 11*a* of the sample 11 is brought into contact with the second contact portion 62 of the protrusion amount setting member 56. Also, the front end 31*a* of the sample locking member 31 is brought into contact with the protrusive surfaces 58*b* of the protrusive portions 58*a*. Under this condition, the sample 11 and the sample locking member 31 are held together with the clip 51. Consequently, the shield member 29, the sample 11, and the sample locking member 31 are placed in position, and the amount of protrusion of the sample 11 is set. In this case, the edge portion 29*a* of the shield member 29 and the front end 31*a* of the sample locking member 31 are aligned in position by bringing the edge portion 29*a* of the shield member 29 and the front end 31*a* of the sample locking member 31 into contact with the protrusive surfaces 58*b* of the pair of protrusive portions 58*a*.

Twelfth Embodiment

Figure 52:
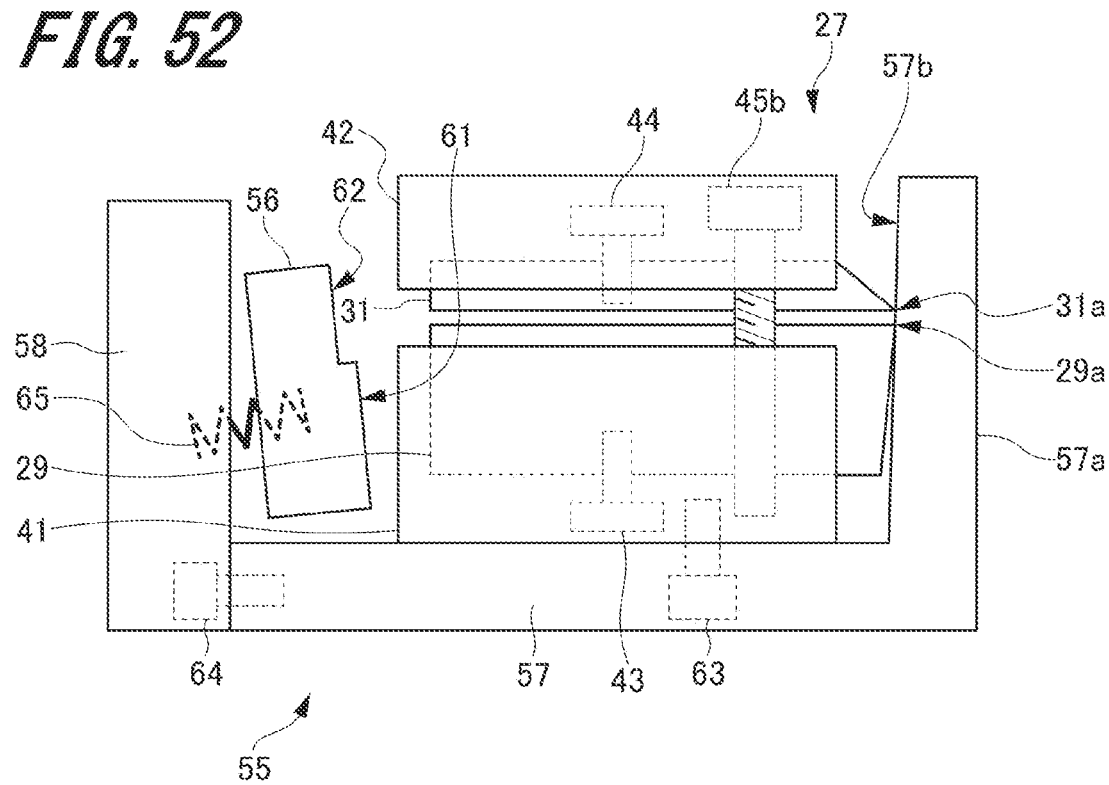
FIG. 52 is a schematic side elevation of a sample positioning jig associated with a twelfth embodiment of the present invention, illustrating the configuration of the jig.

A sample positioning jig associated with a twelfth embodiment of the present invention is applicable to the configuration of the sample holder 27 (see FIG. 9) equipped in the ion milling apparatus associated with the foregoing second embodiment. FIG. 52 is a schematic side elevation showing the configuration of the sample positioning jig associated with the twelfth embodiment of the invention.

As shown in FIG. 52, the sample positioning jig 55 has a protrusion amount setting member 56, a first tool 57, and a second tool 58 in the same manner as in the above-described fifth embodiment. The first tool 57 and the second tool 58 may be integral with each other. The first tool 57 has a stand-up portion 57*a* which is formed integrally with the first tool 57. The present invention is not limited to this structure. Alternatively, the stand-up portion 57*a* may be secured to the first tool 57 with a screw or by other means. The stand-up portion 57*a* has a vertical reference surface 57*b* based on which the shield member 29 and the sample locking member 31 are placed in position.

Where the sample 11 is placed in position using the sample positioning jig 55 of the above-described configuration, the first tool 57 is first mounted to the clamp member 41 with the screw 63 and the second tool 58 is mounted to the first tool 57 with the screw 64 as shown in FIG. 52. At this time, the shield member 29 is clamped to the clamp member 41 with the screw 43 by bringing the edge portion 29a of the shield member 29 into contact with the reference surface 57b of the stand-up portion 57a. Also, the sample locking member 31 is secured to the clamp member 42 with the screw 44 by bringing the front end 31a of the sample locking member 31 into contact with the reference surface 57b of the stand-up portion 57a. Consequently, the edge portion 29a of the shield member 29 and the front end 31a of the sample locking member 31 can be aligned in position. At this stage of operation, a gap slightly greater than the thicknesseswise dimension of the sample 11 is secured between the clamp members 41 and 42.

Figure 53:
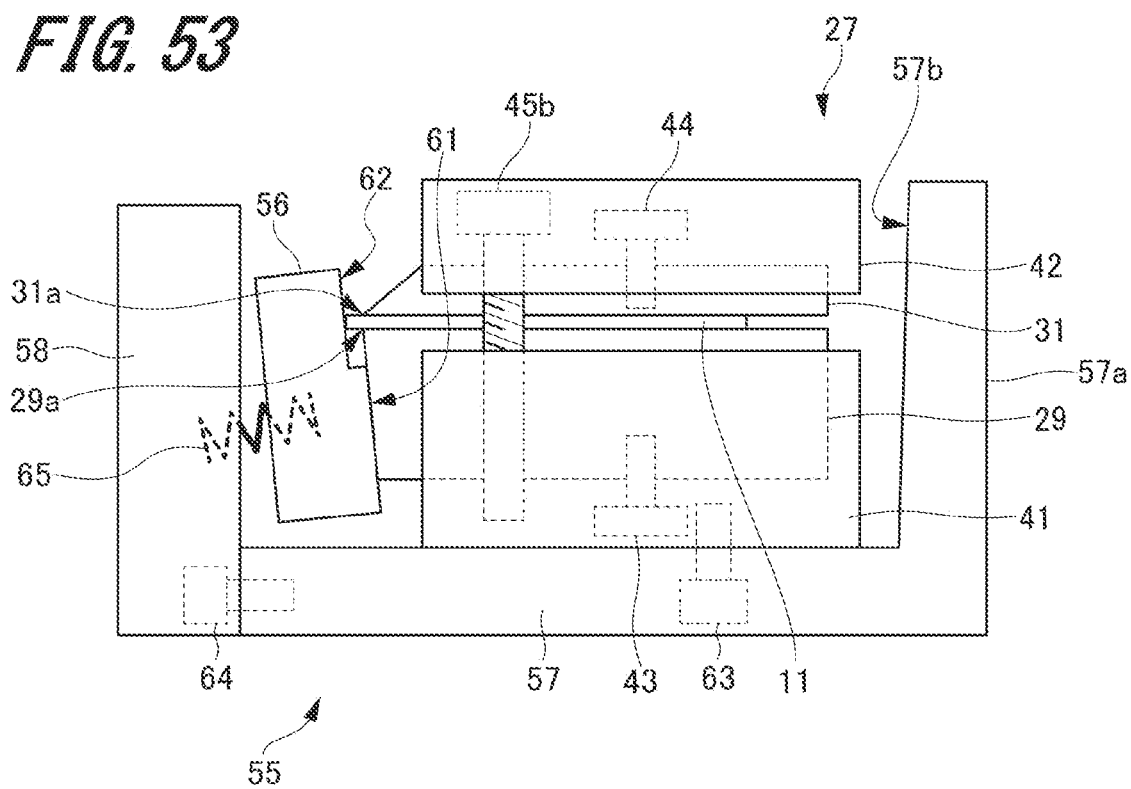
FIG. 53 is a schematic side elevation showing the manner in which a sample is placed in position with the sample positioning jig of FIG. 52.
Figure 54:
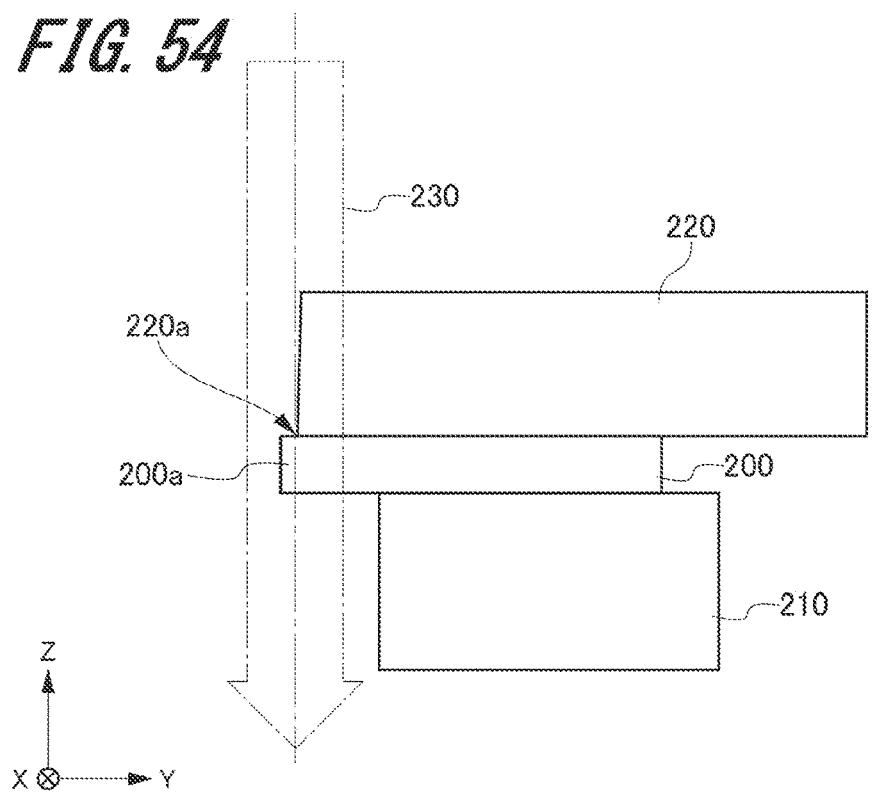
FIGS. 54-59 are schematic side elevations of the prior art ion milling apparatus, showing different manners in which a sample is supported.
Figure 55:
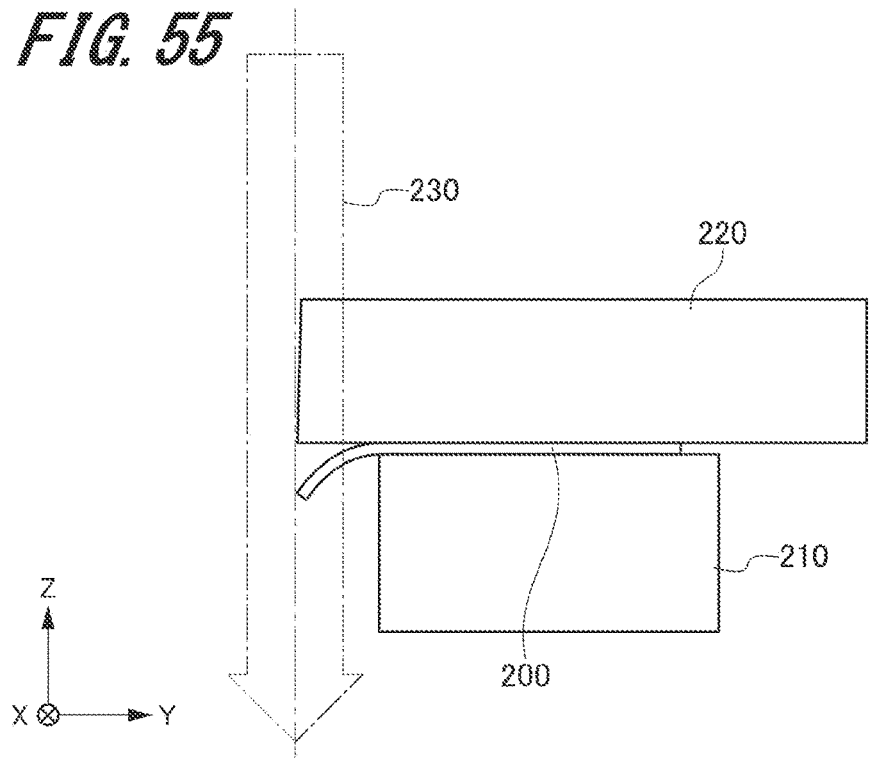
Figure 56:
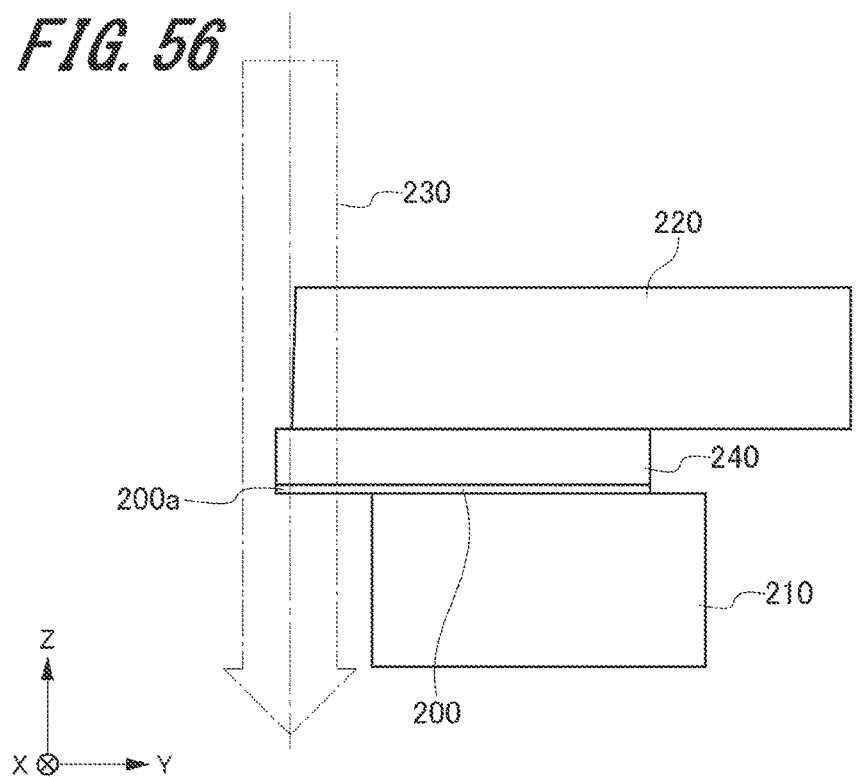
Figure 57:
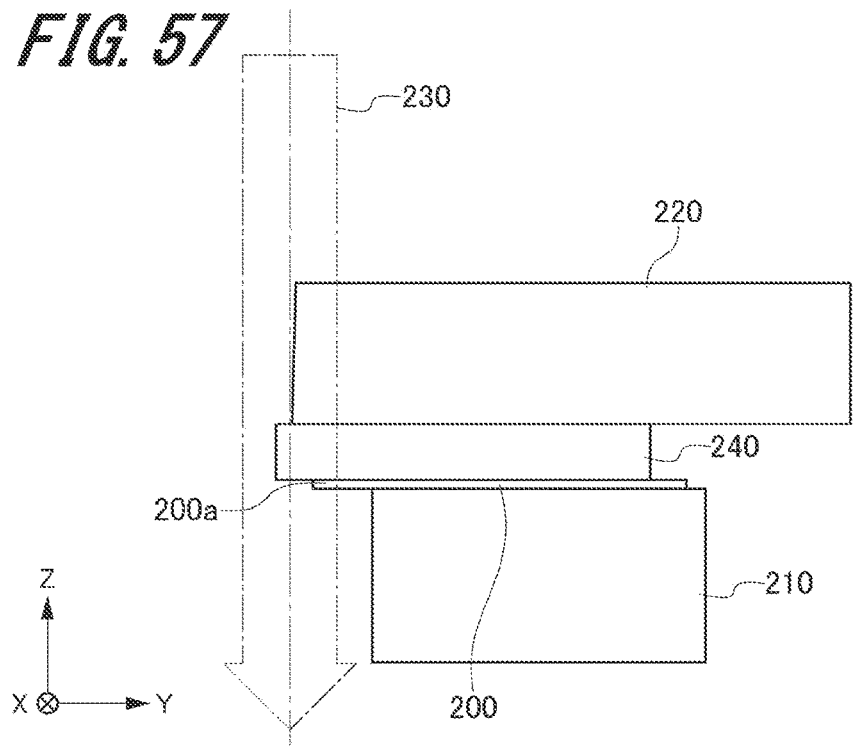
Figure 58:
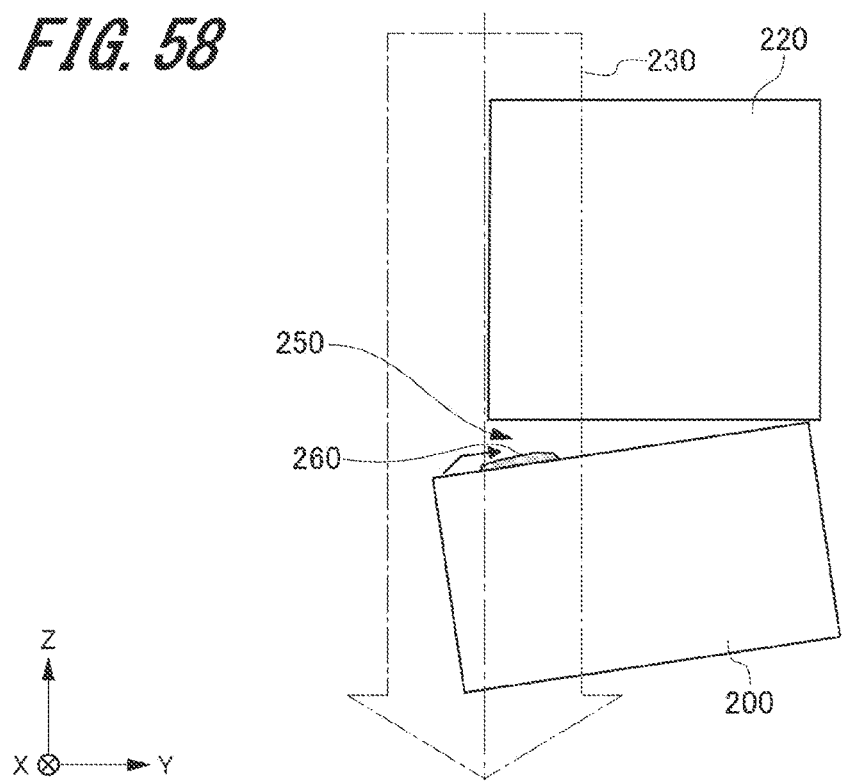
Figure 59:
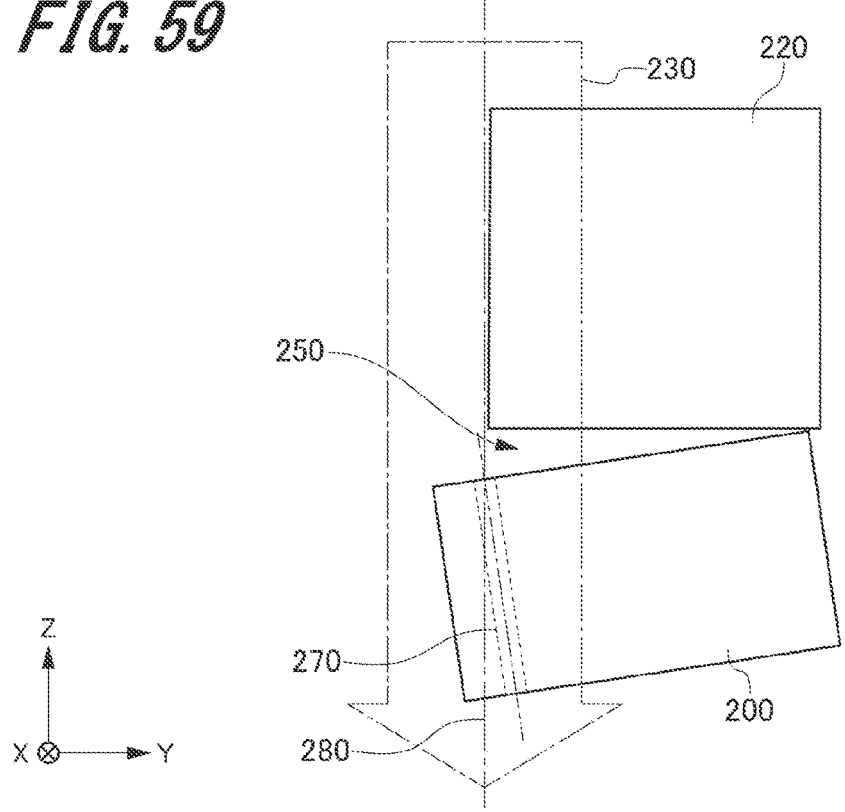

Then, the screw 63 is loosened to unlock the clamp member 41 and the first tool 57 from each other and then the sample holder 27 and the sample positioning jig 55 are reversed in sense relative to each other in the left/right direction as shown in FIG. 53. The clamp member 41 and the first tool 57 are locked together with the screw 63. At this time, the front end surface 29b of the shield member 29 is brought into contact with the first contact portion 61 of the protrusion amount setting member 56. Before the sample holder 27 is placed on the sample positioning jig 55, a sample 11 is inserted between the clamp members 41 and 42. Then, the front end surface 11a of the sample 11 is brought into contact with the second contact portion 62 of the protrusion amount setting member 56. Under this condition, the screws 45a and 45b of one pair (only 45b is shown in FIGS. 52 and 53) are tightened. Consequently, the amount of protrusion of the sample 11 can be set based on the edge portion 29a of the shield member 29.

A positioning function similar to that of the reference surface 57b of the stand-up portion 57a can be imparted to the sample positioning jigs associated with the foregoing embodiments. For example, as shown in FIG. 31 above, the shield member 29 and the sample locking member 31 can be placed in position by forming a stand-up portion 57a-1 on the first tool 57-1 and using the reference surface 57b-1 of the stand-up portion 57a-1. With the second tool 58-3 shown in FIG. 41, a surface on the opposite side of the abutting surface 107 is used as a reference surface, and the shield member 29 and the sample locking member 31 can be placed in position using the reference surface.

Preferred aspects of the sample positioning jigs associated with the present invention are set forth below.

Aspect 1

A sample positioning jig for use with an ion milling apparatus having a shield member for shielding the sample except for a portion to be milled. The shield member has an edge portion at its end. The edge portion determines a position on or in the sample at which the sample is milled. Further, the sample positioning jig has a protrusion amount setting member for setting an amount of protrusion of the sample from the edge portion of the shield member. The protrusion amount setting member has a first contact portion and a second contact portion. The first contact portion comes into contact with a front end surface of the shield member. The second contact portion is recessed relative to the first contact portion and making contact with the front end surface of the sample.

Aspect 2

A sample positioning jig as set forth in aspect 1 and further comprising a biasing member for biasing the protrusion amount setting member so as to push the first contact portion against the front end surface of the shield member.

Aspect 3

A sample positioning jig as set forth in aspect 2 and characterized in that the biasing member is a spring.

Aspect 4

A sample positioning jig as set forth in any of aspects 1 to 3, further comprising a tool assembly to which the shield member is secured and characterized in that the protrusion amount setting member is mounted to the tool assembly.

Aspect 5

A sample positioning jig as set forth in aspect 4 and characterized in that the tool assembly has a first tool to which the shield member is secured and a second tool capable of being attached to and detached from the first tool and that the protrusion amount setting member is mounted to the second tool.

Aspect 6

A sample positioning jig as set forth in aspect 4 and characterized in that the tool assembly is of a unitary construction.

Aspect 7

A sample positioning jig as set forth in aspect 4 and characterized in that the protrusion amount setting member is made of a transparent material and that the tool assembly has an observation window at a position where the milled portion of the sample can be observed through the protrusion amount setting member.

Aspect 8

A sample positioning jig as set forth in aspect 1 and characterized in that the shield member is made of a magnetic material and that the protrusion amount setting member has a magnet at a position in opposition to the front end surface of the shield member.

Aspect 9

A sample positioning jig as set forth in any of aspects 1 to 8, and further characterized in that at least the second contact portion of the protrusion amount setting member is made of an insulating material.

It is to be understood that the present invention is not restricted to the embodiments described above and that the invention can be practiced in variously modified forms. The foregoing embodiments are set forth such that the content of the present invention can be understood easily. However, the invention is not restricted to those equipped with all the configurations set forth in the foregoing embodiments. Furthermore, some of the configurations of one embodiment may be replaced with configurations of other embodiment. In addition, configurations of other embodiment may be added to the configuration of one embodiment. Further, some configurations of each embodiment may be deleted, or other configurations may be added, or some configurations may be replaced with other configurations.

What is claimed is:

1. An ion milling apparatus for milling a sample by ion beam irradiation, the ion milling apparatus having a sample holder for supporting the sample;
   wherein the sample holder has both a shield member for shielding the sample except for a portion to be milled and a sample locking member cooperating with the shield member such that the sample is sandwiched and held therebetween, the shield member having an edge portion that determines a milling position on or in the sample;
   wherein the sample locking member is disposed downstream of the edge portion in the direction of the ion beam irradiation and has at least one support portion cooperating with the edge portion to support the milled portion therebetween; and
   wherein the at least one support portion has a first surface making contact with the sample and a second surface making a given angle to the first surface, the given angle being equal to or less than 90°.

2. An ion milling apparatus as set forth in claim 1, wherein said given angle is an acute angle.

3. An ion milling apparatus as set forth in claim 1, wherein said sample and said sample locking member are simultaneously milled by the ion beam irradiation.

4. An ion milling apparatus as set forth in claim 1, further comprising a protrusion amount setting member configured to be attached to and detached from said sample holder, and wherein said shield member, said sample locking member, and said sample can be placed in position by the use of the protrusion amount setting member, whereby the amount of protrusion of the sample is settable.

5. An ion milling apparatus as set forth in claim 1, further comprising:
   a first clamp member to which said shield member is secured;
   a second clamp member to which said sample locking member is secured; and
   a tightening member for tightening together the shield member and the sample locking member via the first clamp member and the second clamp member.

6. An ion milling apparatus as set forth in claim 1, wherein said at least one support portion of said sample locking member is plural in number, and wherein each of the support portions has said first surface and said second surface.

7. An ion milling apparatus as set forth in claim 1, wherein said sample holder is mounted to be tiltable such that a front end of said sample locking member becomes higher than a rear end of the sample locking member.

8. A sample holder for use in an ion milling apparatus for milling a sample by ion beam irradiation, said sample holder comprising:
   a shield member for shielding the sample except for a portion to be milled, the shield member having an edge portion for determining a milling position on or in the sample; and
   a sample locking member that cooperates with the shield member such that the sample is sandwiched and held therebetween;
   wherein the sample locking member has a support portion which is disposed downstream of the edge portion in the direction of the ion beam irradiation and which cooperates with the edge portion to support the milled portion therebetween; and
   wherein the support portion has a first surface making contact with the sample and a second surface making a given angle to the first surface, the given angle being equal to or less than 90°.

* * * * *